(12) United States Patent
Bailey et al.

(10) Patent No.: US 12,387,019 B2
(45) Date of Patent: Aug. 12, 2025

(54) SYSTEM AND METHOD FOR SIMULATING RESERVOIR MODELS

(71) Applicant: Schlumberger Technology Corporation, Sugar Land, TX (US)

(72) Inventors: William J. Bailey, Somerville, MA (US); Peter G. Tilke, Watertown, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 143 days.

(21) Appl. No.: 16/772,794

(22) PCT Filed: Dec. 13, 2018

(86) PCT No.: PCT/US2018/065328
§ 371 (c)(1),
(2) Date: Jun. 14, 2020

(87) PCT Pub. No.: WO2019/118658
PCT Pub. Date: Jun. 20, 2019

(65) Prior Publication Data
US 2021/0165938 A1 Jun. 3, 2021

Related U.S. Application Data

(60) Provisional application No. 62/627,505, filed on Feb. 7, 2018, provisional application No. 62/598,853, filed on Dec. 14, 2017.

(51) Int. Cl.
*G06F 30/27* (2020.01)
*E21B 43/00* (2006.01)
*E21B 43/20* (2006.01)
*E21B 49/00* (2006.01)
(Continued)

(52) U.S. Cl.
CPC .............. *G06F 30/27* (2020.01); *E21B 43/00* (2013.01); *E21B 43/20* (2013.01); *E21B 49/00* (2013.01);
(Continued)

(58) Field of Classification Search
CPC .......... G06F 30/27; E21B 43/00; E21B 43/20; E21B 49/00; E21B 2200/22;
(Continued)

(56) References Cited

U.S. PATENT DOCUMENTS 7,289,942 B2 10/2007 Yang
7,565,243 B2 7/2009 Kim et al.
(Continued)

FOREIGN PATENT DOCUMENTS

CN 101802649 A 8/2010
CN 104380144 A 2/2015
(Continued)

OTHER PUBLICATIONS

Gherabati, S. Amin, A. Takbiri-Borujeni, and R. G. Hughes. "Heterogeneity quantification in waterfloods using a multiphase network approach." Journal of Natural Gas Science and Engineering 40 (2017): 299-311. (Year: 2017).*
(Continued)

*Primary Examiner* — John E Johansen
(74) *Attorney, Agent, or Firm* — Jeffrey D. Frantz

(57) ABSTRACT

A method, computer program product, and computing system are provided for defining one or more injector completions and one or more producer completions in one or more reservoir models. One or more edges between the one or more injector completions and the one or more producer completions in the one or more reservoir models may be defined. The one or more edges between the one or more injector completions and the one or more producer comple-
(Continued)

tions may define a graph network representative of the one or more reservoir models. The one or more reservoir models may be simulated along the one or more edges between the one or more injector completions and the one or more producer completions.

20 Claims, 54 Drawing Sheets

(51) Int. Cl.
| | |
|---|---|
| G01V 20/00 | (2024.01) |
| G06N 3/044 | (2023.01) |
| G06N 3/045 | (2023.01) |
| G06N 3/047 | (2023.01) |
| G06N 3/08 | (2023.01) |
| G06N 3/084 | (2023.01) |
| G06N 3/088 | (2023.01) |

(52) U.S. Cl.
CPC ............ *G01V 20/00* (2024.01); *G06N 3/044* (2023.01); *G06N 3/045* (2023.01); *G06N 3/047* (2023.01); *G06N 3/08* (2013.01); *G06N 3/084* (2013.01); *G06N 3/088* (2013.01); *E21B 2200/22* (2020.05); *G01V 2210/663* (2013.01)

(58) Field of Classification Search
CPC ................ G01V 99/005; G01V 20/00; G01V 2210/663; G06N 3/0445; G06N 3/0454; G06N 3/0472; G06N 3/08; G06N 3/084; G06N 3/088; G06N 3/045; G06N 3/047; G06N 3/044
USPC ......................................................... 703/10
See application file for complete search history.

(56) References Cited

U.S. PATENT DOCUMENTS

| | | | |
|---|---|---|---|
| 8,311,779 B2 | 11/2012 | Pedersen et al. | |
| 8,311,788 B2 | 11/2012 | Hurley et al. | |
| 8,725,477 B2 | 5/2014 | Zhang et al. | |
| 8,751,208 B2 | 6/2014 | Brouwer et al. | |
| 8,908,925 B2 | 12/2014 | Hurley et al. | |
| 9,134,457 B2 | 9/2015 | Hurley et al. | |
| 9,581,723 B2 | 2/2017 | Hurley et al. | |
| 9,703,006 B2* | 7/2017 | Stern .................... | G01V 11/00 |
| 2007/0027666 A1 | 2/2007 | Frankel | |
| 2008/0195319 A1 | 8/2008 | Wilkinson | |
| 2010/0057418 A1* | 3/2010 | Li .......................... | G06F 30/28 |
| | | | 703/10 |
| 2010/0299125 A1 | 11/2010 | Ding et al. | |
| 2012/0221306 A1 | 8/2012 | Hurley | |
| 2012/0253770 A1 | 10/2012 | Stern et al. | |
| 2013/0338983 A1* | 12/2013 | Sarma .................... | G01V 20/00 |
| | | | 703/10 |
| 2014/0149041 A1 | 5/2014 | Sung et al. | |
| 2017/0032064 A1 | 2/2017 | Walsh et al. | |
| 2019/0249534 A1* | 8/2019 | Hoeink .................. | G06F 17/18 |
| 2021/0333433 A1* | 10/2021 | Yarus .................... | G06Q 50/02 |

FOREIGN PATENT DOCUMENTS

| | | |
|---|---|---|
| CN | 106460504 A | 2/2017 |
| WO | 2008098134 A2 | 8/2008 |
| WO | 2014070572 A2 | 5/2014 |
| WO | 2019118656 A1 | 6/2019 |

OTHER PUBLICATIONS

Thiele, M. R., et al. "Simulating flow in heterogeneous systems using streamtubes and streamlines." SPE Reservoir Engineering 11.01 (1996). pp. 5-12. (Year: 1996).*

Kingma, D. P. et al., "Adam: A Method for Stochastic Optimization", presented at the 3rd International Conference for Learning Representations, San Diego, California, U.S.A., 2015, 15 pages.

Kiryushkina, T. et al., "Implementation of Customized Algorithms Extends Downhole Flowmeter Application in Two-Phase Oil/Gas Flow: A Subsea North Sea Case Study", SPE 143743, Society of Petroleum Engineers, presented at the Brasil Offshore, Macae, Brazil, 2011, 10 pages.

Li, H. et al., "Context-Aware Semantic Inpainting", Journal of Latex Class Files, 2015, 14(8), 13 pages.

Mamonov, A. et al., "Optimal Grid Coarsening: A Fast Proxy for Large Reservoir Optimization," SPE 111378, presented at the SPE/EAGE Reservoir Characterization and Simulation Conference, Abu Dhabi, U.A.E., 2007, 9 pages.

Mizra, M. et al., "Conditional Generative Adversarial Nets", 2014, 7 pages.

Mosser, L. et al., "Reconstruction of three-dimensional porous media using generative adversarial neural networks", Physical Review E, 2017, 96(4):043309, 17 pages.

Mosser, L. et al., "Stochastic Reconstruction of an Oolitic Limestone by Generative Adversarial Networks", Transport in Porous Media, 2018, 125, pp. 81-103.

Natvig, J. R. et al., "An Efficient Discontinuous Galerkin Method for Advective Transport in Porous Media", Advances in Water Resources, 2007, 30(12), pp. 2424-2438.

Perarnau, G. et al., "Invertible Conditional GANs for Image Editing", 2016, 9 pages.

Prechelt, L., "Automatic Early Stopping using Cross Validation: Quantifying the Criteria", Neural Networks, 1998, 11(4), pp. 761-767.

Radford, A. et al., "Unsupervised Representation Learning with Deep Convolutional Generative Adversarial Networks", 2016, 16 pages.

Rezapour, A., "Data Based Modeling and Analysis in Reservoir Waterflooding", In: Dissertation presented to the faculty of the USC graduate school, University of Southern California, Jan. 2016, 119 pages.

Schuster, M. et al., "Bidirectional Recurrent Neural Networks", IEEE Transactions on Signal Processing, 1997, 45(11), pp. 2673-2681.

Skorstad, A. et al., "Well Conditioning in a Fluvial Reservoir Model", Mathematical Geology, 1999, 31(7), pp. 857-872.

Srivastava, N. et al., "Dropout: A Simple Way to Prevent Neural Networks from Overfitting", Journal of Machine Learning Research, 2014, 15, pp. 1929-1958.

Strebelle, S., "Conditional Simulation of Complex Geological Structures Using Multiple Point Statistics", Mathematical Geology, 2002, 34(1), pp. 1-21.

Talathi, S. S. et al., "Improving Performance of Recurrent Neural Network with Relu Nonlinearity", 2016, 12 pages.

Vasper, A et al., "Efficient Optimization Strategies for Developing Intelligent Well Business Cases", SPE-181062-MS, presented at the SPE Intelligent Energy International Conference and Exhibition, Aberdeen, Scotland, UK, 2016, 15 pages.

Welge, H. J., "A Simplified Method for Computing Oil Recovery by Gas or Water Drive", Petroleum Transactions, AIME, 1952, 195(13), pp. 91-98.

Yeh, R. A. et al., "Semantic Image Inpainting with Perceptual and Contextual Losses", 2017, 19 pages.

Zhang, T. et al., "Filter-Based Classification of Training Image Patterns for Spatial Simulation", Mathematical Geology, 2006, 38(1), pp. 63-80.

Search Report and Written Opinion of International Patent Application No. PCT/US2018/065324 mailed on Apr. 1, 2020.

Search Report and Written Opinion of International Patent Application No. PCT/US2018/065328 mailed on Apr. 1, 2020.

International Preliminary Report on Patentability of International Patent Application No. PCT/US2018/065328 mailed on Jun. 25, 2020.

International Preliminary Report on Patentability of International Patent Application No. PCT/US2018/065324 mailed on Jun. 25, 2020.

(56) References Cited

OTHER PUBLICATIONS

Extended Search Report issued in European Patent Application No. 18888653.5 dated Jul. 23, 2021, 7 pages.
"Distributed Asynchronous Hyperparameter Optimization in Python," retrieved at http://hyperopt.github.io/hyperopt; 3 pages; retreived Jun. 3, 2020.
"Tensors and Dynamic Neural Networks in Python with Strong GPU Acceleration," https://github.com/pytorch/pytorch; 9 pages, accessed Sep. 25, 2020.
"Understanding LSTM Networks," (2015). Retrieved at URL http://colah.github.io/posts/2015-08-Understanding-LSTMs, on Jun. 1, 2020, 12 pages.
Abadi, M. et al., "Tensorflow: Large-Scale Machine Learning on Heterogeneous Distributed Systems," Preliminary White Paper, 2015, 19 pages.
Antipov, G. et al., "Face aging with conditional generative adversarial networks", presented at the IEEE International Conference on Image Processing, 2017, 5 pages.
Arjovsky, M. et al., "Wasserstein GAN," Dec. 6, 2017, 32 pages.
Bailey, W. J. et al., "Framework for Field Optimization to Maximize Asset Value", SPE 87026-PA, SPE Reservoir Evaluation Engineering, 2005, 8(01), pp. 7-21.
Brooks, R.H. et al., "Hydraulic Properties of Porous Media", Hydrology Papers 3, Colorado University, 1964, 37 pages.
Buckley, S.E. et al., "Mechanism of Fluid Displacement in Sands", American Institute of Mining and Metallurgical Engineers, 1337, Transactions of the AIME, 1941, 146(01), pp. 107-116.
Carpenter, C., "Efficient Optimization Strategies for Developing Intelligent-Well Business Cases", SPE0517-0068-JPT, Journal of Petroleum Technology, 2017, 69(05), pp. 68-70.
Chan, S. et al., "Parametrization and generation of geological models with generative adversarial networks", 2017, 26 pages.
Chen, X. et al., "InfoGAN: Interpretable Representation Learning by Information Maximizing Generative Adversarial Nets", in Advances in Neural Information Processing Systems 29 (NIPS 2016) edited by D.D.Lee, M. Sugiyama, U.V. Luxberg, I. Guyon and R. Garnett. 2016, 9 pages.
Chung, J. et al., "Empirical Evaluation of Gated Recurrent Neural Networks on Sequence Modeling", 2014, 9 pages.
Hubbert, M.K., "Darcys Law and the Field Equations of the Flow of Underground Fluids", Petroleum Transactions, AIME, 1957, (01), pp. 222-239.
Corey, A. T., "The Interrelation Between Gas and Oil Relative Permeabilites", Producers Monthly, 19, No. 1, pp. 38-41, 1954.
Cressie, N., "The origins of kriging", Mathematical Geology, 1990, 22(3), pp. 239-252.
Deutsch, C. V. et al., "Hierarchical object-based stochastic modeling of fluvial reservoirs", Mathematical Geology, 1996, 28(7), pp. 857-880.

Dumoulin, V. et al., "Adversarially Learned Inference", Feb. 21, 2017, 18 pages.
Gers, F. A. et al., "Learning to Forget: Continual Prediction with LSTM", Neural Computing, 2000, 12, pp. 2451-247.
Goodfellow, I. J. et al., "Generative Adversarial Networks", In: Advances in neural information processing systems, 2014, 9 pages.
Gulrajani, I. et al., "Improved Training of Wasserstein GANs", Dec. 25, 2017, 20 pages.
Gurses, S. et al., "Optimized Modeling Workflows for Designing Passive Flow Control Devices in Horizontal Wells", SPE-166052-MS, presented at the SPE Reservoir Characterization and Simulation Conference and Exhibition, Abu Dhabi, UAE, 2013, 10 pages.
Hauge, R. et al., "Well conditioning in object models", Mathematical Geology, 2007, 39(4), pp. 383-398.
Hinton, G.E. et al.. "A Fast Learning Algorithm for Deep Belief Nets", Neural Computation, 2006, 18, pp. 1527-1554.
Holden, L. et al., "Modeling of Fluvial Reservoirs with Object Models", Mathematical Geology, 1998, 30(5), pp. 473-496.
Generate Music using Dynamic Bidirectional Recurrent Neural Network Tensorflow, Apr. 26, 2017. Accessed at URL: https://github.com/wangkunctc/Generate-Music-Bidirectional-RNN#generate-music-bidirectional-rnn.
Exam Report issued in European Patent Application No. 18888653.5 dated Dec. 8, 2022, 9 pages.
Kwak, H. et al., "Ways of Conditioning Generative Adversarial Networks", ARXIV.org, Cornell University, Ithaca, NY, 2016, 5 pages.
Cha, M. et al., "Adversarial Nets with Perceptual Losses for Text-To-Image Synthesis", 2017 IEEE International Workshop on Machine Learning for Signal Processing, Tokyo, Japan, 2017, 6 pages.
Extended Search Report issued in European Patent Application No. 18888091.8 dated Sep. 21, 2021, 8 pages.
Green, et al., "Enhanced Oil Recovery", SPE Textbook Series, vol. 6, Society of Petroleum Engineers, Richardson, TX, 1998, Chapters 1 and 4, 58 pages.
Office Action issued in U.S. Appl. No. 16/772,792 dated Nov. 10, 2022, 42 pages.
Exam Report issued in European Patent Application No. 18888091.8 dated Mar. 10, 2023, 5 pages.
Gohari, K. et al., "Novel Workflow for the Development of a Flow Control Strategy with Consideration of Reservoir Uncertainties", SPE-177427-MS, paper presented at the Abu Dhai International Petroleum Conference, 2015, 32 pages.
Office Action issued in U.S. Appl. No. 16/772,792 dated Jun. 23, 2023, 44 pages.
First Office Action issued in Chinese Patent Application No. 201880089402.X dated Mar. 27, 2024, 32 pages with English translation.

* cited by examiner

1700

2000

2200

2400

2600

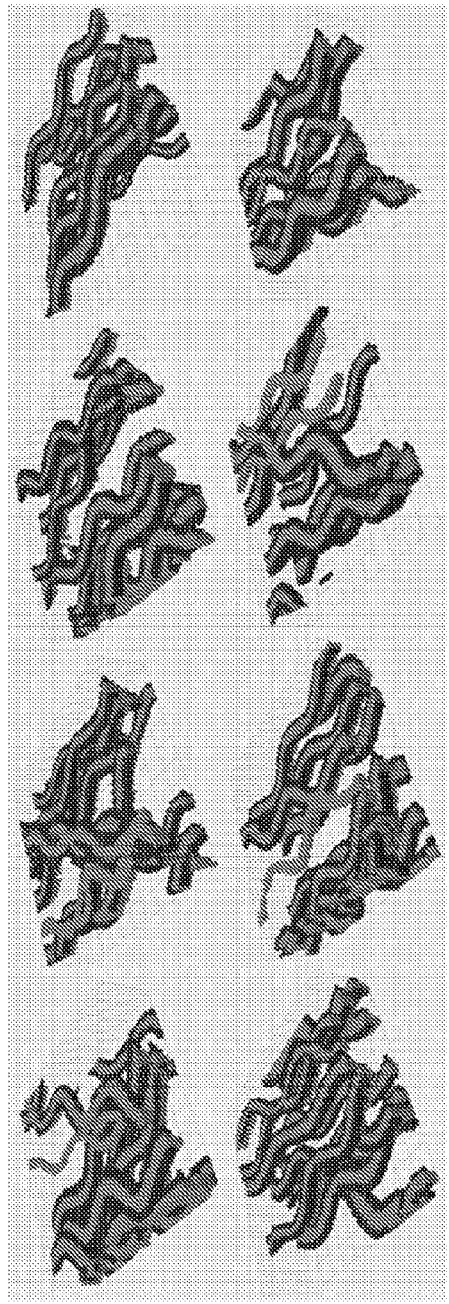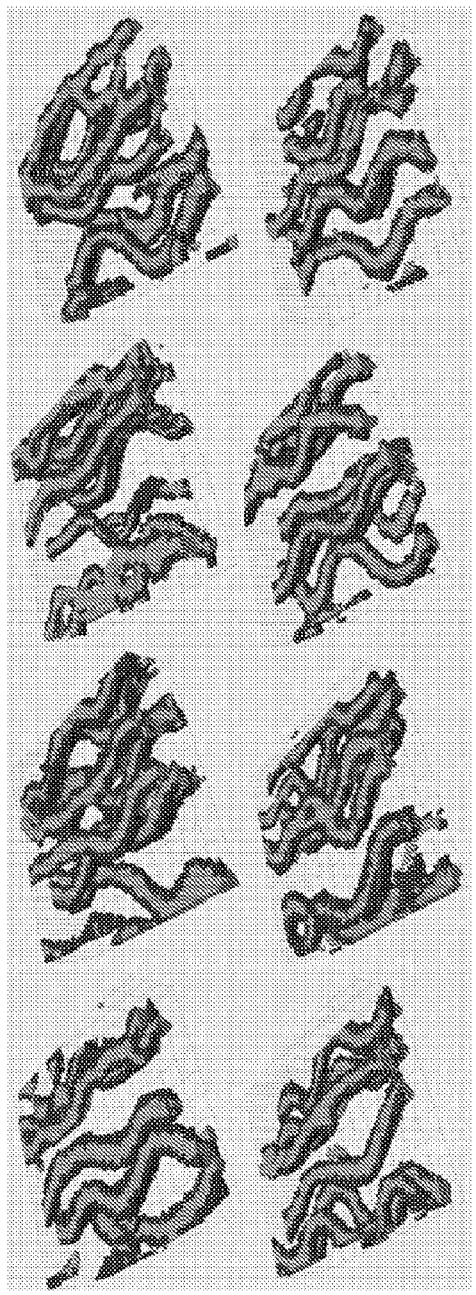
FIG. 29

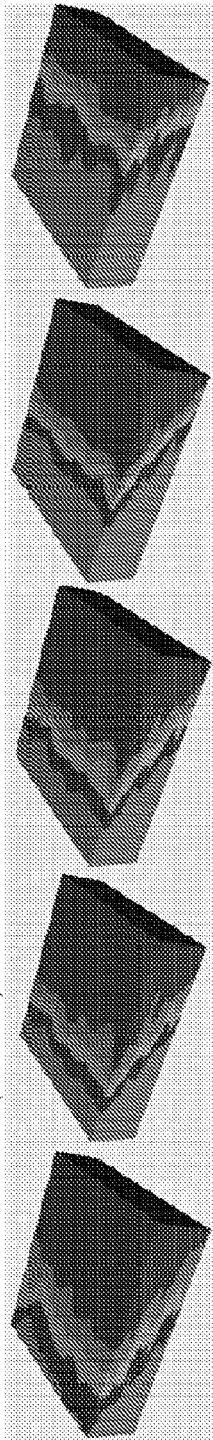
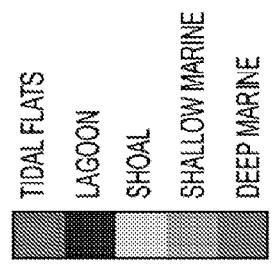
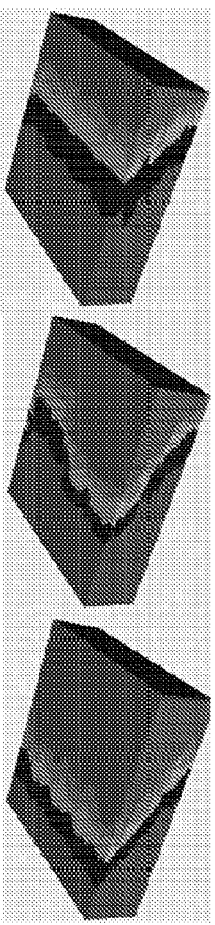
FIG. 31

3200

Settings | Layout | Section | Trends

Channel ~ Amplitude
Wavelength

| | | Drift [0-1] | Min | Med/ mean | Max/ std | |
|---|---|---|---|---|---|---|
| Orientation | Triangular | 0 | -60 | 0 | 60 | [Compass degrees] |
| Amplitude | Triangular | 0.2 | 10 | 20 | 30 | [Horizontal distance units] |
| Wavelength | Triangular | 0.2 | 50 | 75 | 100 | |

≋ If using flow lines in the 'Trend tab'. the orientation will not be used.

Settings | Layout | Section | Trends

Intersection view: Width / Thickness

| | | Drift [0-1] | Min | Med/ mean | Max/ std | |
|---|---|---|---|---|---|---|
| Width | Normal | 0.2 | 3 | 7 | 3 | [Horizontal distance units] |
| Thickness | Determinal | 0 | 10 | 1 | 20 | ☐ Width fraction |

Facies bodies | Background | Settings | Other Output

Seed number
☑ Seed 321011

Alternative simulation options
  ● Normal run
  Testing options:
  ○ Only generate objects that intersect wells
  ○ Only generate unconditional objects
  ○ Generate one unconditional objects Honoring priority
  Assign highest flexibility to honoring:
    ○ Hard data  ○ Facial proportion  ● Geometry
    ☐ Object dependent Proportion compensation for object replacement
Maximum number of passes:
0: no compensation single pass

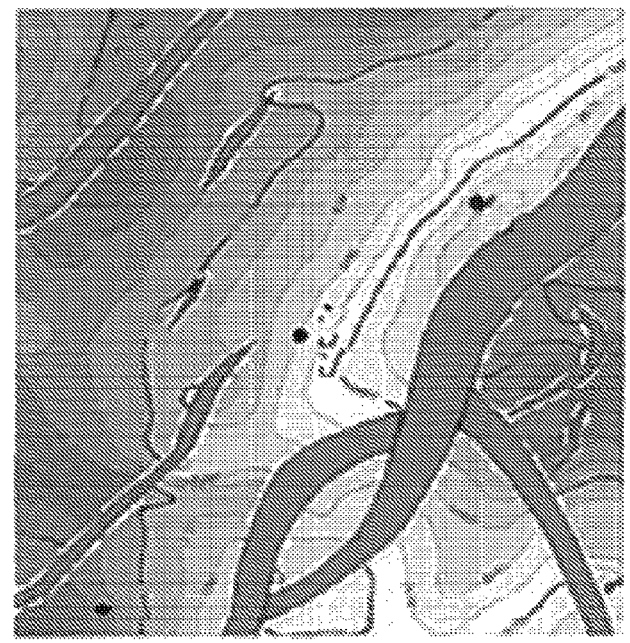
FIG. 41B
FIG. 41A

History period provides information about:
- Flowrates (water, oil, gas)
- Pressures (not shown)
- PI (productivity indices)

This information is added to the existing conditional vector Y and G is retrained and a new realization (or ensemble of realizations) is output

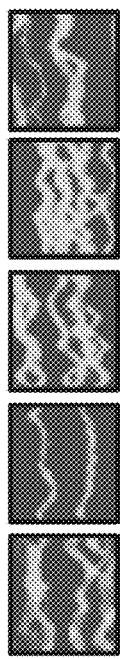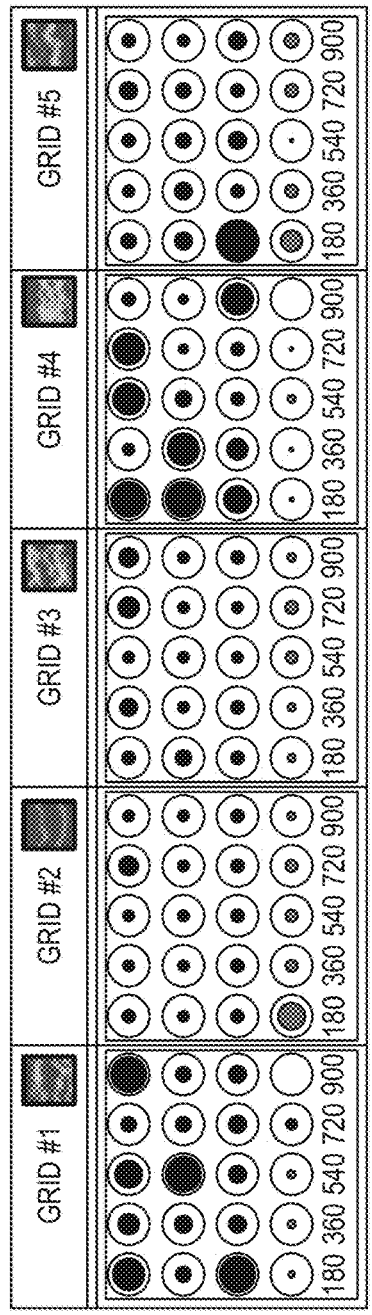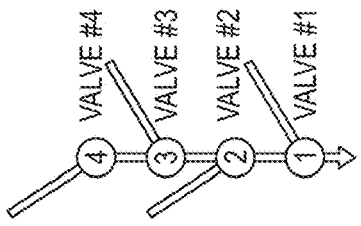
FIG. 46

4800

- defining one or more injector completions and one or more producer completions in one or more reservoir models — 4802
- defining one or more edges between the one or more injector completions and the one or more producer completions in the one or more reservoir models — 4804
- simulating the one or more reservoir models along the one or more edges between the one or more injector completions and the one or more producer completions — 4806
- defining one or more injector-producer pairs based upon, at least in part, spatial proximity between the one or more injector completions and the one or more producer completions — 4818
- defining one or more directed edges between the one or more injector completions and the one or more producer completions in the one or more reservoir models based upon, at least in part, the one or more injector-producer pairs — 4820

- receiving one or more injector rates associated with the one or more injector completions — 4808
- determining one or more of oil production rates and water production rates for the one or more producer completions based upon, at least in part, simulating the one or more injector rates associated with the one or more injector completions — 4810
- receiving one or more of oil production rates and water production rates associated with the one or more producer completions — 4812
- determining one or more water injection rates for the one or more injector completions based upon, at least in part, simulating one or more of the oil production rates and the water production rates associated with the one or more producer completions — 4814
- aggregating a plurality of edges between a plurality of injector completions and a plurality of producer completions to define a three-dimensional graph network representative of the reservoir model — 4816
- determining total oil production for the one or more reservoir models based upon, at least in part, determining oil production for each directed edge that terminates at the one or more producer completions in the one or more reservoir models — 4822

SYSTEM AND METHOD FOR SIMULATING RESERVOIR MODELS

CROSS-REFERENCE TO RELATED APPLICATIONS

This application is a National Stage Entry of International Application No. PCT/US2018/065328, filed Dec. 13, 2018, which claims the benefit of U.S. Provisional Applications having Ser. No. 62/598,853 filed on Dec. 14, 2017 and U.S. Provisional Applications having Ser. No. 62/627,505 filed on Feb. 7, 2018, the entire contents of each are incorporated herein by reference in their entirety.

BACKGROUND

Conventional model building and data interpretation methods may generally employ geostatistical methods (e.g., geological object model building tools) to generate reservoir property distributions in 3D. These properties include subsurface geologic structures, sedimentary facies, rock types, porosity, permeability, water saturation, etc. Commonly used geostatistical method call for spatial linear interpolation between well locations by a tool called "variogram", which is two-point statistics and measures variability of reservoir properties along different directions. The major limitation in this two-point or variogram based modeling is the difficulty in generating realistic geology models since most of subsurface geologic features are curvilinear and are way beyond linear patterns described by two-point statistics. Reproduction of realistic geology in subsurface models may be critical for reservoir prediction and management.

SUMMARY OF DISCLOSURE

A newly emerged geostatistics method named "Multipoint Statistics" (MPS) has gained more popularity because of its capability in the creation of geology realism and honoring subsurface data in the resulting models. MPS starts with a training image, which is a conceptual yet quantitate geological model, and then captures complex patterns from the training image and anchors them to reservoir measurements. However, there are challenges to generate satisfactory patterns in the models that resemble the training image. For example, a fluvial training image that contains a highly connected meandering channel may end up with objects with broken pieces in the final MPS models. This is generally caused by the difficulty in MPS simulation to fully capture the shape of complex geological objects. The loss of connectivity in the final MPS models can cause erroneous reservoir prediction and misplaced well locations in enhancing production when drilling new wells. Another limitation in MPS modeling is its inaccurate representation and artificially narrowed uncertainty evaluation through a series of MPS simulation results (realizations) because it generates MPS models by a single training image. However, the most important uncertainty arises from the different geological scenarios or training images. Even though it is recommended to use multiple training images in MPS modeling, it is still not a common practice due to expensive CPU cost in MPS modeling.

MPS modeling is a pixel-based approach and has advantages in data conditioning, but may lose shape reproduction. In contrast, another type of modeling approach, called object-based modeling (OBM), has the advantage of generating more realistic geobodies by directly building the geological objects (e.g., fluvial systems) with specified distribution of geometric parameters of channels such as width, length, amplitude, sinuosity, and thickness. It does not require pixilation of the studied reservoirs. However, the conditioning to well observation, particularly for dense well locations, as well as other types of data measurements and constraints such as seismic data, becomes very difficult since object-modeling process may not converge and becomes extremely slow due to the use of MCMC (Markov Chain Monto Carlo).

In some implementations and as will be discussed in greater detail below, object-based modeling can be embedded into neural networks as a tool to generate various geological templates (e.g., training data or training images) to drive the modeling process to build geologically realistic models and honor various subsurface constraints by generating many realizations than contain patterns that ensemble the templates in very efficient manner.

For example, seismic surveys and/or well logs may yield important insights about the geology, geomechanics, and petrophysics of the subsurface. An accurate coupled geologic interpretation of both seismic and well log measurements may improve the accuracy of predictions of the geology at new locations where wells have not yet been drilled. Such a workflow increases the value of measurements and reduces the number of wells needed to adequately delineate the subsurface. Currently, this task is the responsibility of expert geoscientists using sophisticated software tools that have limitations such as those alluded to above.

In some embodiments, a method (e.g., a computer-implemented method) is executed on a computing device and may include but is not limited to defining one or more injector completions and one or more producer completions in one or more reservoir models. One or more edges between the one or more injector completions and the one or more producer completions in the one or more reservoir models may be defined. The one or more edges between the one or more injector completions and the one or more producer completions may define a graph network representative of the one or more reservoir models. The one or more reservoir models may be simulated along the one or more edges between the one or more injector completions and the one or more producer completions.

One or more of the following example features may be included. One or more injector-producer pairs may be defined based upon, at least in part, spatial proximity between the one or more injector completions and the one or more producer completions. One or more directed edges may be defined between the one or more injector completions and the one or more producer completions in the one or more reservoir models based upon, at least in part, the one or more injector-producer pairs. Total oil production for the one or more reservoir models may be determined based upon, at least in part, determining oil production for each directed edge that terminates at the one or more producer completions in the one or more reservoir models. Simulating the one or more reservoir models along the one or more edges between the one or more injector completions and the one or more producer completions may include receiving one or more injector rates associated with the one or more injector completions and determining one or more of oil production rates and water production rates for the one or more producer completions based upon, at least in part, simulating the one or more injector rates associated with the one or more injector completions. Simulating the one or more reservoir models along the one or more edges between the one or more injector completions and the one or more producer completions may include receiving one or more of oil production rates and water production rates associated with the one or more producer completions and determining one or more water injection rates for the one or more injector completions based upon, at least in part, simulating one or more of the oil production rates and the water production rates associated with the one or more producer completions. A plurality of edges between a plurality of injector completions and a plurality of producer completions may be aggregated to define a three-dimensional graph network representative of the reservoir model.

In another example implementation, a computing system may include one or more processors and one or more memories, wherein the computing system is configured to perform operations that may include but are not limited to defining one or more injector completions and one or more producer completions in one or more reservoir models. One or more edges between the one or more injector completions and the one or more producer completions in the one or more reservoir models may be defined. The one or more edges between the one or more injector completions and the one or more producer completions may define a graph network representative of the one or more reservoir models. The one or more reservoir models may be simulated along the one or more edges between the one or more injector completions and the one or more producer completions.

One or more of the following example features may be included. One or more injector-producer pairs may be defined based upon, at least in part, spatial proximity between the one or more injector completions and the one or more producer completions. One or more directed edges may be defined between the one or more injector completions and the one or more producer completions in the one or more reservoir models based upon, at least in part, the one or more injector-producer pairs. Total oil production for the one or more reservoir models may be determined based upon, at least in part, determining oil production for each directed edge that terminates at the one or more producer completions in the one or more reservoir models. Simulating the one or more reservoir models along the one or more edges between the one or more injector completions and the one or more producer completions may include receiving one or more injector rates associated with the one or more injector completions and determining one or more of oil production rates and water production rates for the one or more producer completions based upon, at least in part, simulating the one or more injector rates associated with the one or more injector completions. Simulating the one or more reservoir models along the one or more edges between the one or more injector completions and the one or more producer completions may include receiving one or more of oil production rates and water production rates associated with the one or more producer completions and determining one or more water injection rates for the one or more injector completions based upon, at least in part, simulating one or more of the oil production rates and the water production rates associated with the one or more producer completions. A plurality of edges between a plurality of injector completions and a plurality of producer completions may be aggregated to define a three-dimensional graph network representative of the reservoir model.

In yet another example implementation, a computer program product may include a non-transitory computer readable storage medium having a plurality of instructions stored thereon, which, when executed by a processor, cause the processor to perform operations including, but not limited to, defining one or more injector completions and one or more producer completions in one or more reservoir models.

One or more edges between the one or more injector completions and the one or more producer completions in the one or more reservoir models may be defined. The one or more edges between the one or more injector completions and the one or more producer completions may define a graph network representative of the one or more reservoir models. The one or more reservoir models may be simulated along the one or more edges between the one or more injector completions and the one or more producer completions.

One or more of the following example features may be included. One or more injector-producer pairs may be defined based upon, at least in part, spatial proximity between the one or more injector completions and the one or more producer completions. One or more directed edges may be defined between the one or more injector completions and the one or more producer completions in the one or more reservoir models based upon, at least in part, the one or more injector-producer pairs. Total oil production for the one or more reservoir models may be determined based upon, at least in part, determining oil production for each directed edge that terminates at the one or more producer completions in the one or more reservoir models. Simulating the one or more reservoir models along the one or more edges between the one or more injector completions and the one or more producer completions may include receiving one or more injector rates associated with the one or more injector completions and determining one or more of oil production rates and water production rates for the one or more producer completions based upon, at least in part, simulating the one or more injector rates associated with the one or more injector completions. Simulating the one or more reservoir models along the one or more edges between the one or more injector completions and the one or more producer completions may include receiving one or more of oil production rates and water production rates associated with the one or more producer completions and determining one or more water injection rates for the one or more injector completions based upon, at least in part, simulating one or more of the oil production rates and the water production rates associated with the one or more producer completions. A plurality of edges between a plurality of injector completions and a plurality of producer completions may be aggregated to define a three-dimensional graph network representative of the reservoir model.

This summary is provided to introduce a selection of concepts that are further described below in the detailed description. This summary is not intended to identify essential features of the claimed subject matter, nor is it intended to be used as an aid in limiting the scope of the claimed subject matter.

BRIEF DESCRIPTION OF THE DRAWINGS

Embodiments of the present disclosure are described with reference to the following figures.

FIG. 29 depicts fluvial training image examples (top) in 3D and unconditional samples generated by GANs (bottom);

FIG. 31 depicts carbonate training image examples (top) in 3D and unconditional samples generated by GANs (bottom);

FIG. 41A illustrates a sub-surface reservoir unit approximation rendered by CGAN analysis. The model can incorporate faults (shown as dark gray bodies) and the contours represents any static reservoir property required by the user. The three black dots represent existing wells (firm information) which are honored by the CGAN representation.

FIG. 41B illustrates sub-surface reservoir unit approximation rendered by CGAN analysis with SRMS invoked and rendered over the area/volume of interest in accordance with embodiments of various techniques described herein. The degree of tessellation is user-defined but can be defaulted. Each tessellation represents a volume or a property or any property of interest pertaining to a forward simulation of the sub-surface reservoir unit;

FIG. 46 illustrates an ensemble of equi-probable HM realizations that can be used to optimize valve settings in accordance with embodiments of various techniques described herein;

FIG. 48 is a flow chart of the neural network driven reservoir modeling process of FIG. 1 in accordance with implementations of various techniques described herein;

Like reference symbols in the various drawings may indicate like elements.

DETAILED DESCRIPTION

Figure 1:
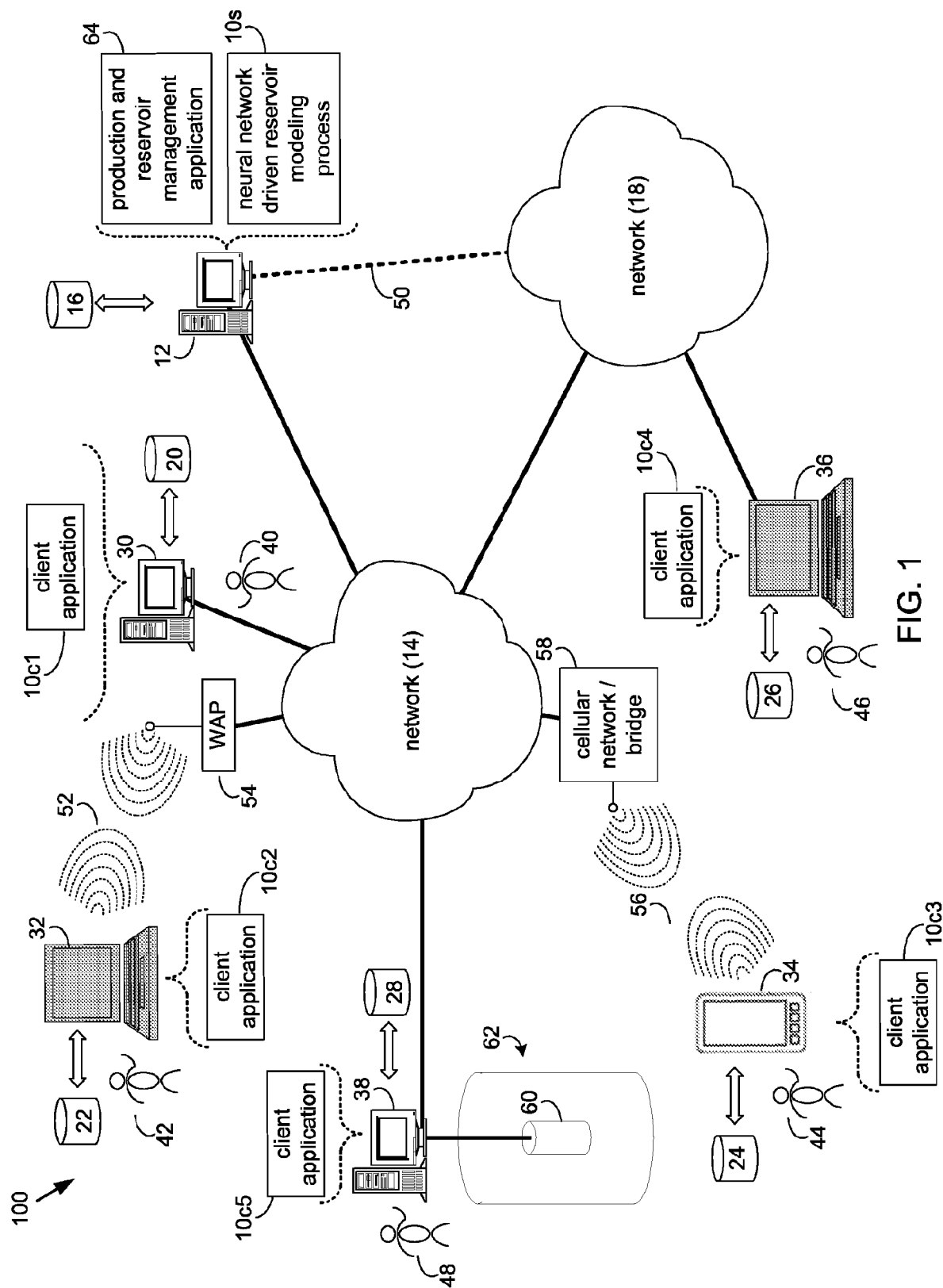
FIG. 1 is a diagrammatic view of a distributed computing network including a computing device that executes a neural network driven reservoir modeling process according to an implementation of the present disclosure.
Figure 2:
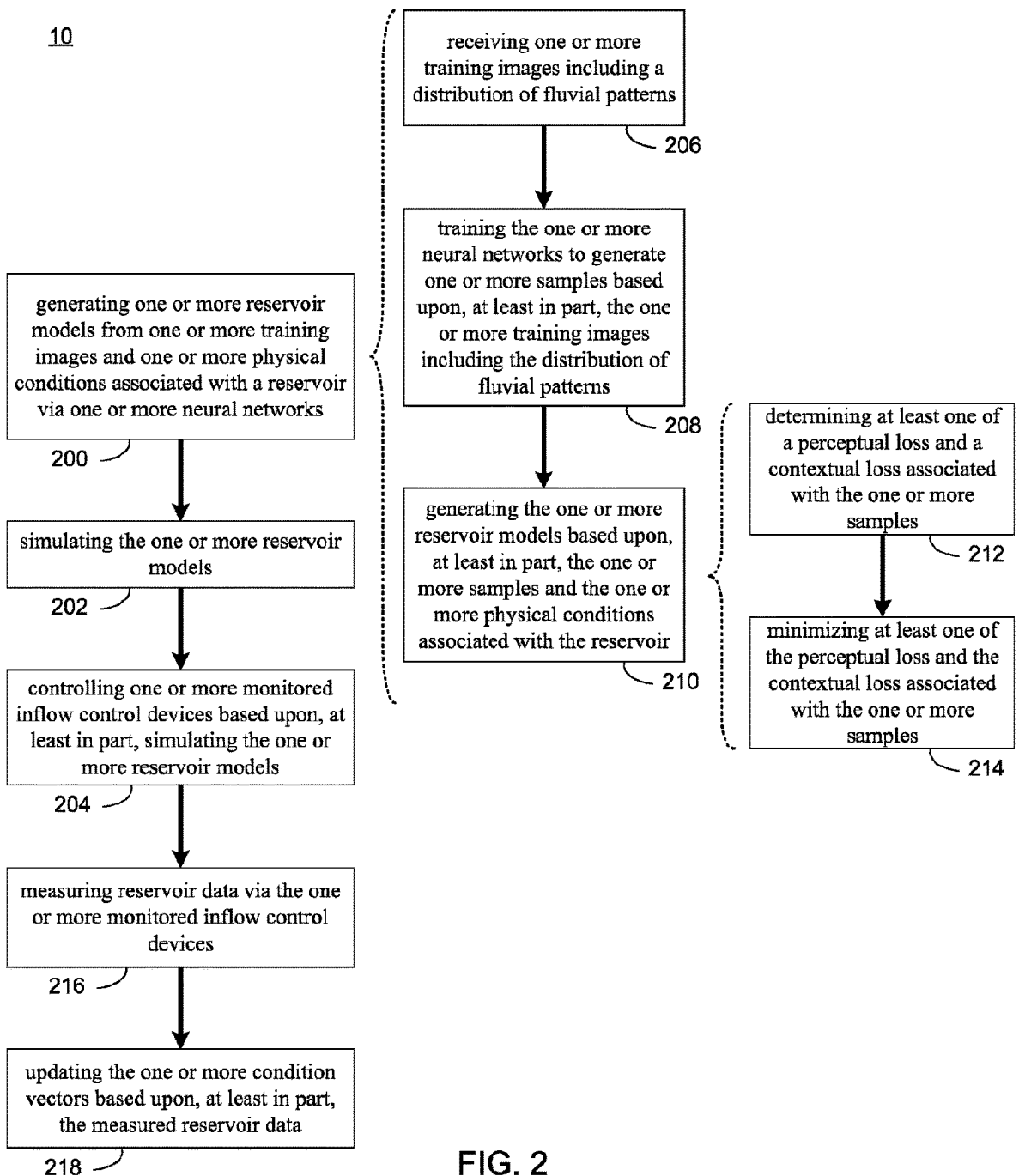
FIG. 2 is a flow chart of the neural network driven reservoir modeling process of FIG. 1 in accordance with implementations of various techniques described herein.

The discussion below is directed to certain implementations and/or embodiments. It is to be understood that the discussion below is only for the purpose of enabling a person with ordinary skill in the art to make and use any subject matter defined now or later by the patent "claims" found in any issued patent herein.

It is specifically intended that the claimed combinations of features not be limited to the implementations and illustrations contained herein, but include modified forms of those implementations including portions of the implementations and combinations of elements of different implementations as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the claimed invention unless explicitly indicated as being "critical" or "essential."

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered a same object or step.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, there is shown neural network driven reservoir modeling process 10. For the following discussion, it is intended to be understood that neural network driven reservoir modeling process 10 may be implemented in a variety of ways. For example, neural network driven reservoir modeling process 10 may be implemented as a server-side process, a client-side process, or a server-side/client-side process.

For example, neural network driven reservoir modeling process 10 may be implemented as a purely server-side process via neural network driven reservoir modeling process 10s. Alternatively, neural network driven reservoir modeling process 10 may be implemented as a purely client-side process via one or more of client-side application 10c1, client-side application 10c2, client-side application 10c3, and client-side application 10c4. Alternatively still, neural network driven reservoir modeling process 10 may be implemented as a server-side/client-side process via server-side neural network driven reservoir modeling process 10s in combination with one or more of client-side application 10c1, client-side application 10c2, client-side application 10c3, client-side application 10c4, and client-side application 10c5. In such an example, at least a portion of the functionality of neural network driven reservoir modeling process 10 may be performed by neural network driven reservoir modeling process 10s and at least a portion of the functionality of neural network driven reservoir modeling process 10 may be performed by one or more of client-side application 10c1, 10c2, 10c3, 10c4, and 10c5.

Accordingly, neural network driven reservoir modeling process 10 as used in this disclosure may include any combination of neural network driven reservoir modeling process 10s, client-side application 10c1, client-side application 10c2, client-side application 10c3, client-side application 10c4, and client-side application 10c5.

Neural network driven reservoir modeling process 10s may be a server application and may reside on and may be executed by computing device 12, which may be connected to network 14 (e.g., the Internet or a local area network). Examples of computing device 12 may include, but are not limited to: a personal computer, a server computer, a series of server computers, a mini computer, a mainframe computer, or a dedicated network device.

The instruction sets and subroutines of neural network driven reservoir modeling process 10s, which may be stored on storage device 16 coupled to computing device 12, may be executed by one or more processors (not shown) and one or more memory architectures (not shown) included within computing device 12. Examples of storage device 16 may include but are not limited to: a hard disk drive; a tape drive; an optical drive; a RAID device; an NAS device, a Storage Area Network, a random access memory (RAM); a read-only memory (ROM); and all forms of flash memory storage devices.

Network 14 may be connected to one or more secondary networks (e.g., network 18), examples of which may include but are not limited to: a local area network; a wide area network; or an intranet, for example.

The instruction sets and subroutines of client-side application 10c1, 10c2, 10c3, 10c4, 10c5 which may be stored on storage devices 20, 22, 24, 26, 28 (respectively) coupled to client electronic devices 30, 32, 34, 36, 38 (respectively), may be executed by one or more processors (not shown) and one or more memory architectures (not shown) incorporated into client electronic devices 30, 32, 34, 36, 38 (respectively). Examples of storage devices 20, 22, 24, 26, 28 may include but are not limited to: hard disk drives; tape drives; optical drives; RAID devices; random access memories (RAM); read-only memories (ROM), and all forms of flash memory storage devices.

Examples of client electronic devices 30, 32, 34, 36, 38 may include, but are not limited to, personal computer 30, 36, laptop computer 32, mobile computing device 34, notebook computer 36, a netbook computer (not shown), a server computer (not shown), a gaming console (not shown), a data-enabled television console (not shown), and a dedicated network device (not shown). Client electronic devices 30, 32, 34, 36, 38 may each execute an operating system.

Users 40, 42, 44, 46, 48 may access neural network driven reservoir modeling process 10 directly through network 14 or through secondary network 18. Further, neural network driven reservoir modeling process 10 may be accessed through secondary network 18 via link line 50.

The various client electronic devices (e.g., client electronic devices 28, 30, 32, 34) may be directly or indirectly coupled to network 14 (or network 18). For example, personal computer 28 is shown directly coupled to network 14. Further, laptop computer 30 is shown wirelessly coupled to network 14 via wireless communication channels 52 established between laptop computer 30 and wireless access point (WAP) 54. Similarly, mobile computing device 32 is shown wirelessly coupled to network 14 via wireless communication channel 39 established between mobile computing device 32 and cellular network/bridge 58, which is shown directly coupled to network 14. WAP 48 may be, for example, an IEEE 802.11a, 802.11b, 802.11g, 802.11n, Wi-Fi, and/or Bluetooth device that is capable of establishing wireless communication channel 52 between laptop computer 30 and WAP 54. Additionally, personal computer 34 is shown directly coupled to network 18 via a hardwired network connection.

In some implementations, a client electronic device (e.g., client electronic device 38) may be electronically coupled to at least one monitored inflow control devices 60 (e.g. Schlumberger's Manara® production and reservoir management system). Manara is a registered trademark of Schlumberger Technology Corporation. The Manara production and reservoir management system may include a multiple segment production assembly for subsurface wells, namely, flow control valves, packers, monitoring and telemetry equipment for segmenting a downhole well and enabling control and monitoring of each individual segment while producing the well. As will be discussed in greater detail below, monitored inflow control device 60 may be configured to be deployed into, or adjacent, a well (e.g., well 62) or other structure. In some implementations, monitored inflow control devices 60 may generally include a tool run on an electric logging cable that pushes a probe into the formation, which then allows production into a small closed chamber. Monitored inflow control devices 60 may obtain formation pressures at chosen locations in an interval, and, with an accurate quartz gauge, permeability estimates may be obtained. In some implementations, monitored inflow control devices 60 may acquire formation-fluid samples. In some implementations, monitored inflow control devices 60 may include a dielectric scanner configured to measure water volume and rock textural information and/or a resistivity sensor configured to measuring electrical resistivity of rock or sediment.

In some embodiments, neural network driven reservoir modeling process 10 may communicate with, interact with, and/or include a component or module of a production and reservoir management application (e.g., production and reservoir management application 64). In some embodiments, the production and reservoir management application may process, store, or otherwise interact with logging data recorded or provided by monitored inflow control device 60.

In an embodiment, the instruction sets and subroutines of production and reservoir management application 64 may be stored, e.g., on storage device 16 associated with server computer 12, which executes production and reservoir management application 64, and/or another suitable storage device. Further, users (e.g., one or more of users 40, 42, 44, 46, 48) may access production and reservoir management application 64 in order to access well logs and other data received from monitored inflow control device 60 or other mechanisms. The users may access production and reservoir management application 64 via one or more suitable applications, such as client side applications 10c1-10c5 (e.g., which may include a web browser, a client electronic meeting application, or another application) and/or via a different application (not shown). Additionally, while some users are depicted as being connected with server computer 12 (and therefore with electronic production and reservoir management application 64) via network 14, which may include the Internet, in other embodiments, one or more users may be directed connected to server computer 12 and/or connected with server computer 12 via, e.g., a local area network and/or similar connection.

As generally discussed above, a portion and/or all of the functionality of neural network driven reservoir modeling process 10 may be provided by one or more of client side applications 10c1-10c5. For example, in some embodiments neural network driven reservoir modeling process 10 (and/or client-side functionality of neural network driven reservoir modeling process 10) may be included within and/or interactive with client-side applications 10c1-10c5, which may include client side electronic production and reservoir management applications, web browsers, or another application. Various additional/alternative configurations may be equally utilized.

Referring also to FIGS. 2-52 and as will be discussed in greater detail below, neural network driven reservoir modeling process 10 may generate 200 one or more reservoir models from one or more training images and one or more physical conditions associated with a reservoir via one or more neural networks. The one or more reservoir models may be simulated 202 and one or more monitored inflow control devices may be controlled 204 based upon, at least in part, simulating the one or more reservoir models.

In this manner and as will be discussed in greater detail below, neural network driven reservoir modeling process 10 may generate reservoir models that are indistinguishable from training images generated from object model building tools, but are conditioned to observations from physical conditions associated with a reservoir (e.g., example wells and seismic data). In some implementations, neural networks used by neural network driven reservoir modeling process 10 to generate the reservoir models (e.g., GANs, CGANs, RNN, CNN, etc.) may also have a stochastic input so that once trained, they can rapidly generate multiple realizations of the geology that are indistinguishable from the training images while at the same time honoring the observations. In some implementations, neural network driven reservoir modeling process 10 may generally include a generative model that captures sufficient geologic knowledge to generate well logs that are consistent with real observed wells. Physical and geological constraints may be enforced in this model. For example, the volume and nature of sediment deposition may be a function of the distance of the well from the shoreline. It will be appreciated that other physical and geological constraints are possible.

In some implementations, neural network driven reservoir modeling process 10 may generate 200 reservoir models from one or more training images. Training images may generally include images or samples of data used to train a neural network. In some implementations, neural network driven reservoir modeling process 10 may generate training images from object based modeling (OBM) tools. Object modeling tools may generally include tools capable of generating training images based upon, at least in part, synthetic geological data. For example and referring also to FIG. 3, neural network driven reservoir modeling process 10 may generate e.g., two training images (where the red color may represent a sand-filled channel and purple may represent a shale floodplain). In some implementations, training images generated from OBM tools or examples may focus on map views of geology. In some implementations, the one or more training images, or training data that creates the training images from OBM tools, may be derived from a geoscientist's knowledge and understanding of the local geology. For example, a geoscientist may provide information (e.g., via a user interface of an OBM tool) such as wavelength and amplitude of the river channels that may be used to generate the one or more training images. In some implementations, OBM tools may generate training images with a wide range of geological attributes.

Figure 4:
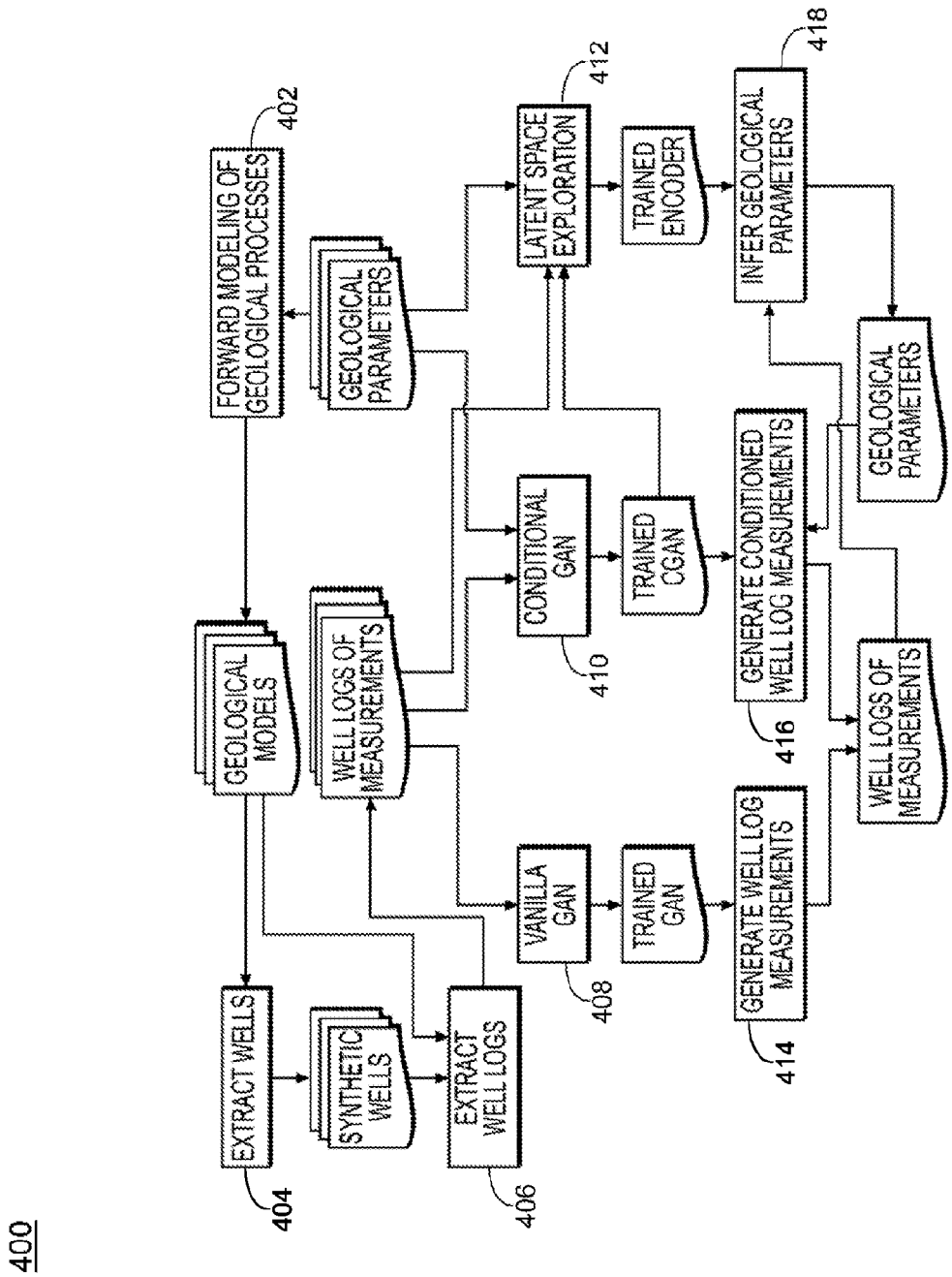
FIG. 4 illustrates a workflow overview of neural network driven reservoir modeling process in accordance with embodiments of various techniques described herein.

In some implementations, neural network driven reservoir modeling process 10 may generate the one or more training images from geological process modeling (GPM) simulators. As shown in the workflow of FIG. 4, neural network driven reservoir modeling process 10 may make inferences based on geological rules and knowledge that may have been learned by a deep learning framework. GPM is a relatively new tool and is not currently part of interpretation and modeling workflows. In some implementations, training images obtained from GPM may be used to generate synthetic geology. In some implementations, GPM examples may focus on a cross-section view of geology. For the GPM, a user may supply more fundamental information (e.g., via a user interface of a GPM) such as initial geography, sea level over geological time, sediment erosion rates, etc. The GPM may then generate the geology over a specified time (e.g., 20 million years). This results in a 3D geological model that obeys geological principles. As will be discussed in greater detail below, these generated models may be used to "teach geology" to a neural network (e.g., GAN) as an alternative to and/or supplemental to supplying the neural network with OBM-based training images.

Deep learning currently requires large amounts of labeled data to be trained. To achieve this, neural network driven reservoir modeling process 10 may generate synthetic data using a GPM (action 402 in FIG. 4). For example, instead of relying on only actual field data, which is can be prohibitively expensive to obtain, neural network driven reservoir modeling process 10 may generate synthetic (e.g., via a GPM) to allow a reservoir to modeled accurately with fewer actual physical conditions. In some implementations, different geological parameters may be input to the GPM simulator such as initial conditions, sea level variation over time, etc. Once the different models have been generated, synthetic wells and/or seismic sections intersecting the geological model may be created (action 404 in FIG. 4). In addition to geometry, the geological simulator may also generate properties describing the rock properties such as clay, silt, and/or sand fractions. For one or more of the previously generated synthetic wells, well logs of the rock properties may be extracted (action 406 in FIG. 4). The resulting large dataset may define one or more training images. For example, and referring also to FIG. 9, the GPM may generate various geological environments that may be used to train a neural network to understand a wide range of geological environments and facies (i.e., bodies of rock with specified characteristics, which can be any observable attribute of rocks such as their overall appearance, composition, or condition of formation, and the changes that may occur in those attributes over a geographic area). The resulting trained generator will then be able to create geological models that are conditioned to the local geology as observed by well, seismic and other data e.g., outcrops.

In some implementations, the one or more training images may become the input for training, validating, and testing deep learning neural networks (actions 408, 410, 412 in FIG. 4). In the example of FIG. 4, one or more of a "Vanilla" Generative Adversarial Network (GAN), a Conditional GAN (CGAN), and/or a latent space representation may be trained. A Generative Adversarial Network (GAN) may generally include a class of neural networks used in unsupervised machine learning. Example applications may include, but are not limited to, image generation from descriptions, high resolution images from low resolution ones, drug prediction to treat a certain disease, retrieving images containing a given pattern, etc.

In some implementations, a Generative Adversarial Network (GAN) may avoid Markov chains because of the high computational cost of MCMC (e.g., Markov chain Monte Carlo), may have fewer restrictions with respect to latent variable distributions, and/or may avoid mean field assumptions. The use of a GAN may overcome several limitations of applying multipoint to interpretation. For example, the high computational cost associated with MPS is a major limitation in conditioning geological models to data. An additional limitation of MPS methods is that the geological objects are too "noisy" due to the inherent random processes. Further, MPS has a limited capacity to reproduce the complexity of many geological environments. As will be discussed in greater detail below, a GAN may be used to improve the "realism" of synthetic training images which may be another key benefit over conventional methods.

As will be discussed in greater detail below, a first use case as shown in FIG. 4 may involve neural network driven reservoir modeling process 10 building and/or generating a GAN that can generate wells in a generic manner such that the wells have no physical conditions imposed such as distance from the shore face (action 414 in FIG. 4).

As will be discussed in greater detail below, a second use case as shown in FIG. 4 may involve extending the workflow to apply conditions on the wells when they are generated (action 416 in FIG. 4). As will be discussed in greater detail below, applying the physical conditions may include applying static and dynamic physical conditions. For example, if production history is not available for the wells, then static modeling only is applicable. That is, the conditioning of the generated model to the well may match the static observations such as lithology or facies. If production data history is available for the well(s), then the reservoir model may be conditioned to these data as well. That is, a reservoir simulation with, for example reservoir simulators as will be discussed below, can be applied to the model and conditioning on both the static (lithology and facies) and dynamic (production history) properties can be made.

In one example, neural network driven reservoir modeling process 10 may specify the distance from the shore face such that the generated well logs are consistent with the geology at this location. In some implementations, the distance may be input via a user-interface. In this manner, the concept of Conditional Generative Adversarial Networks (CGAN) may be used within the scope of the present disclosure to specify some constraints on the generator. In one example, the distance from shore in the form of a distance range, such as ("generate a well that would look like one drilled between 10 and 12 km from the coast"), may be used to condition reservoir models.

Figure 3:
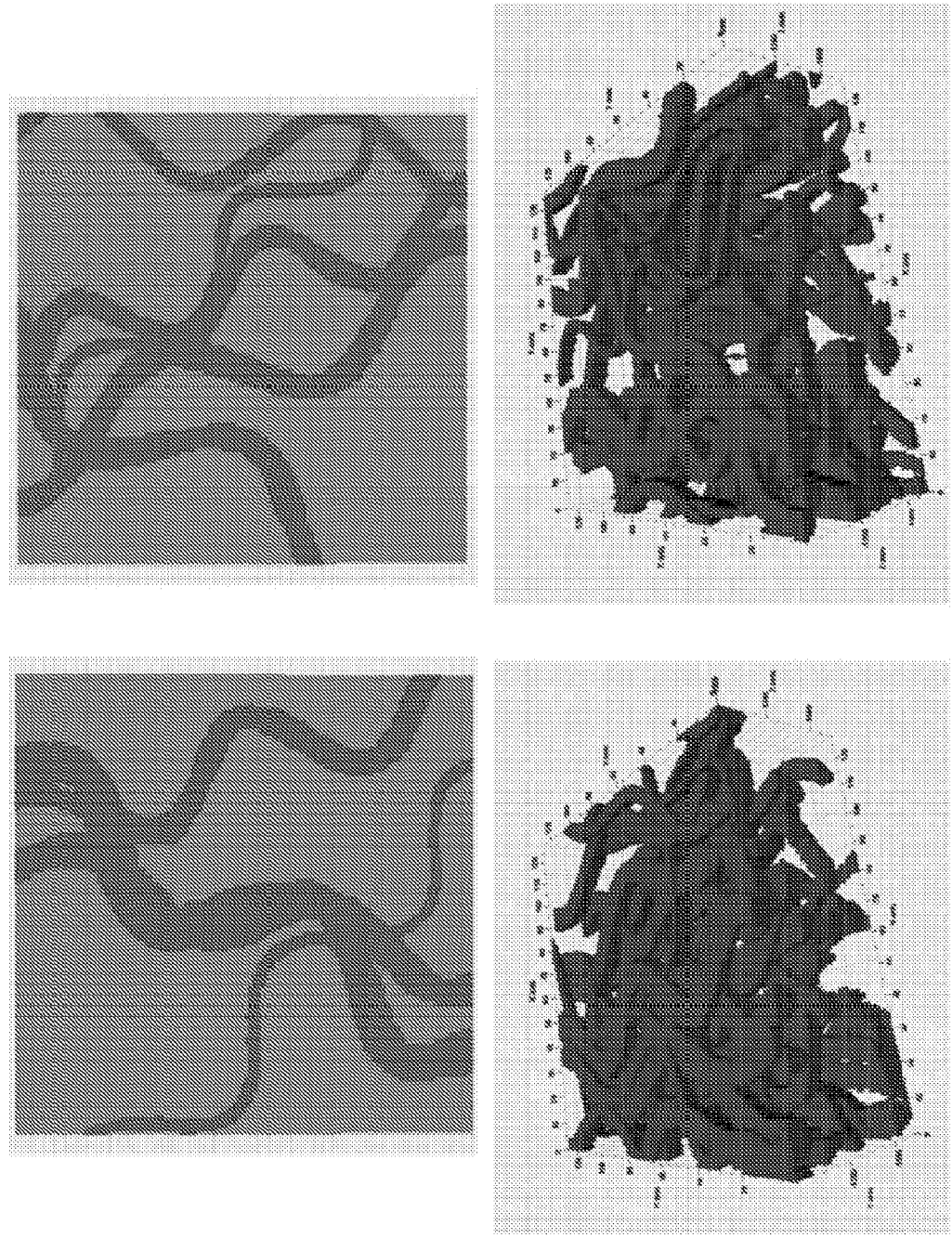
FIG. 3 shows two of many training images (red is a sand-filled channel, purple is shale floodplain). Many of these training images are generated with object modeling (OBM) tools. In some implementations, the one or more training images may include two dimensional (2D) data and three dimensional data (3D). The generator of the GAN is trained to generate images (models) of the reservoir that are indistinguishable from the OBM generated models. The CGAN generator is further conditioned on observations of the reservoir such that all generated models also honor the observations in accordance with embodiments of various techniques described herein.

As will be discussed in greater detail below, a third use case as shown in FIG. 3 may involve developing an inversion model that can map a real well to a latent space representation (action 418 in FIG. 4). A latent space generally represents high-level features, to which algebraic operations may be applied to these features. For example, the latent spaces of two different wells may be interpolated to generate a well that is a mixture of the two initial wells. This may be illustrated with an example where the latent space representations of the wells is continuous and yield smooth transformations when interpolated. Another example application may modify a condition on the latent space to change a well to one located e.g., 10 km further offshore than the original.

Figure 5:
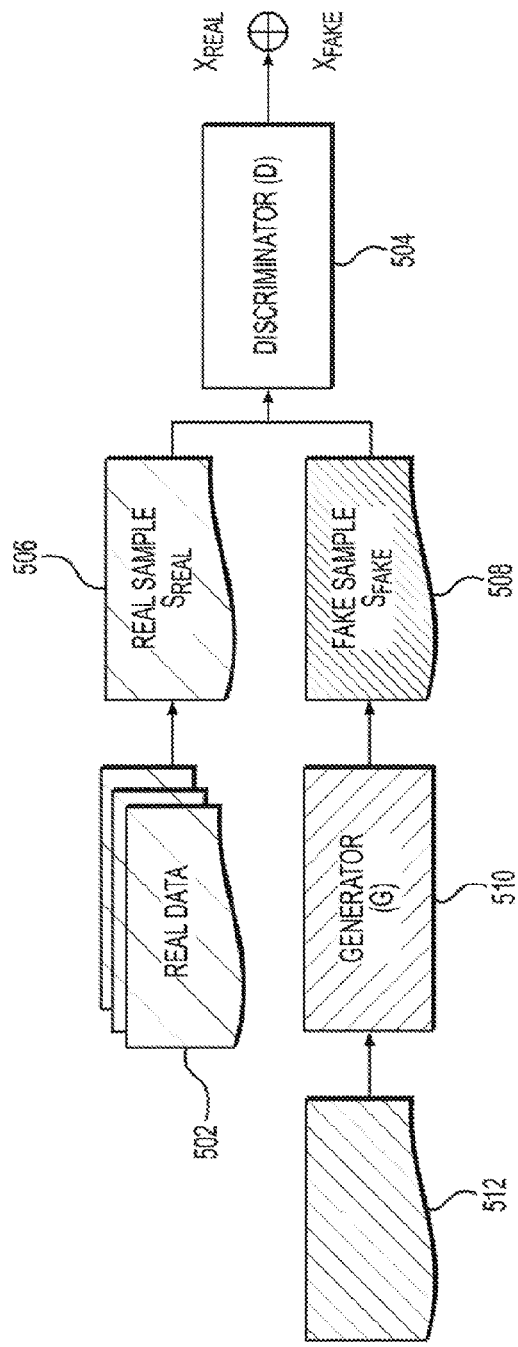
FIG. 5 illustrates a Generative Adversarial Network (GAN) in accordance with embodiments of various techniques described herein.

In some implementations and referring also to the example of FIG. 5, neural network driven reservoir modeling process 10 may train a GAN (e.g., GAN 500) or vanilla GAN. Assume there exists real data x (e.g., real data 502) coming from a distribution X ($x \in X$), also assume there is some noise z coming from a distribution Z ($z \in Z$). It may be desirable to find a function $f$ such that: $f: Z \to Y$ with Y as close as possible to X Indeed, it may be of greater interest to generate samples that look like ones from X rather than approximating the PDF of X For example, consider the problem of generating images of a particular item (e.g., a cat). In this example, it may be less desirable to know the probability of a given item (e.g., a cat image), but rather it may be more desirable to generate images according to the distribution.

In some implementations, two neural networks compete with each other: a discriminator D (e.g., discriminator 504) is trained to determine whether an input is coming from the real source of data (e.g., real sample 506) or being a generated one (fake) (e.g., fake sample 508). A generator G (e.g., generator 510) is trained to generate real looking data from training data (e.g., training data 512) and tries to fool the discriminator D (e.g., discriminator 504) (G plays the role of the function $f$, introduced above). By training G (e.g., generator 510) and D (e.g., discriminator 504) alternately, it may be expected that each of them will improve: G (e.g., generator 510) gets better at creating fakes while D (e.g., discriminator 504) gets better at distinguishing between real and fake data. Eventually, at the end of training, an equilibrium may be reached in which G may produce fake data that D (e.g., discriminator 504) is incapable of distinguishing from real data. This "training game" played by the two neural networks can be summarized by the min-max relationship of Equation 1:

$$\max_\theta \min_\phi \ V(\theta, \phi) = E[\log D(x, \phi)] + E[\log(1\ D(G(z, \theta), \phi))] \quad (1)$$

where x=real data, z=noise sample, G=the generator, D=the discriminator, θ=weights of the generator, ϕ=weights of the discriminator, and E=Expectation.

In some implementations, it may be observed that maximization over ϕ implies that the discriminator should give a probability close to one for a real sample and a probability close to zero for the fake sample. This would lead to log(1)+log(1−0)=0 which is the maximum of the log function on the probability interval of [0, 1]. In some implementations, it may be observed that minimization over θ implies that the generator should make the discriminator output a probability close to one for the fake data. This results in log(ε)→∞ and minimizes the equation.

Figure 6:
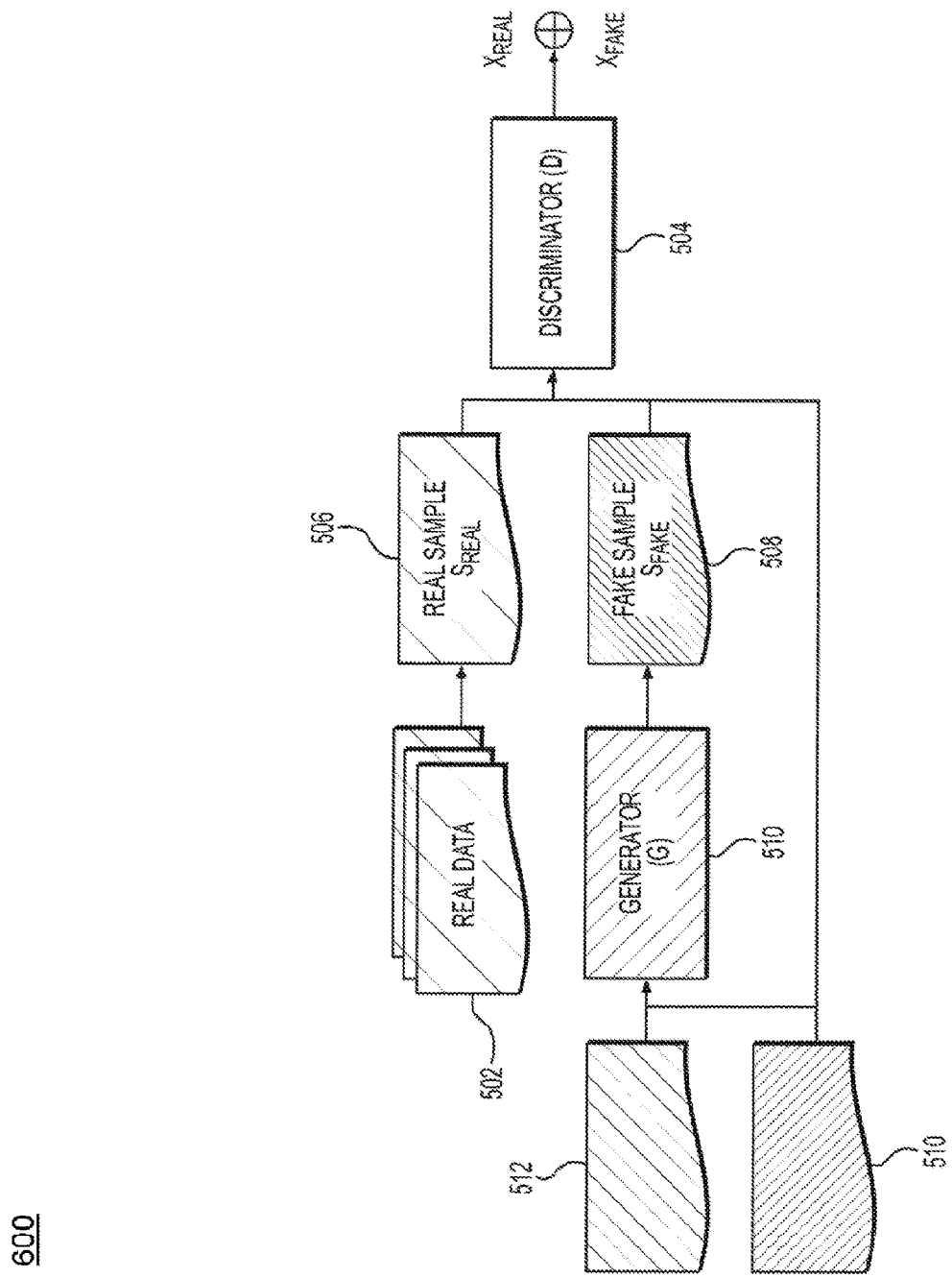
FIG. 6 illustrates a Conditional Generative Adversarial Network (CGANs) in accordance with embodiments of various techniques described herein.

In some implementations and referring also to the example of FIGS. 5 and 6, neural network driven reservoir modeling process 10 may train a conditional GAN (CGAN 600). In some implementations, when generating reservoir models, it may be desirable to have some degree of control. For example, a conditional GAN (e.g., CGAN 600) may allow parametric control over synthetically generated data so that the result satisfies the supplied parametric values. In some implementations, these parameters might be physical conditions (e.g., sea level and distance from shoreline). However, it will be appreciated that other parameters or physical conditions associated with a reservoir are possible. With the vanilla GAN introduced above, it may not be possible to impose these conditions because the sample z that is input to the GAN may be a random noise vector. That is, it may not be known how the high-level features of a particular image are encoded in Z.

One approach with CGAN is to decompose the input of the generator into two parts, a noise source z∈Z (e.g., training data 512) and a condition vector y (e.g., condition vector 604) which represent the condition(s) of interest to be enforced for the generation. The condition vector y (e.g., condition vector 602) will be discussed in greater detail below. In some implementations, the vectors z (e.g., training data 512) and y (e.g., condition vector 602) may be concatenated and passed to the generator G as shown in FIGS. 5-6. For the discriminator D, the real or fake vector is also concatenated with the condition vector y. Thus, G now generates data that not only attempts to fool the discriminator but also satisfies the condition vector y (e.g., condition vector 602).

The cost function of Equation 1 may be modified to incorporate the condition as shown below in Equation (2).

$$\max_\theta \min_\phi \ V(\theta, \phi) = E[\log D(x \mid y, \phi)] + E[\log(1\ D(G(z \mid y, \theta), \phi))] \quad (2)$$

where x=real data, y=condition vector, z=noise sample, G=the generator, D=the discriminator, θ=weights of the generator, ϕ=weights of the discriminator, and E=expectation.

In some implementations, neural network driven reservoir modeling process 10 may generate 200 the one or more reservoir models using a neural network based on the example neural network of FIG. 6. As discussed above, the one or more training images may be the "real data' inputs to the GAN of FIG. 6. The generator then learns geology, and is able to create geological models that not only look like the geology it was trained on (OBM or GPM generated training images or models), but also satisfy the constraints of the condition vector Y. As discussed above, a GAN or a CGAN may include two neural networks, a generator (e.g., G as shown in FIG. 6) and a discriminator (e.g., D as shown in FIG. 6). After training, D is generally discarded because G is fully trained to generate synthetic geology. However, in addition to training the weights of the neurons in G, one has to design the architecture/structure of G.

In some implementations, the generator of FIG. 6 may be implemented via a specific type of neural network, such as a Recurrent Neural Network (RNN) and a Convolutional Neural Network (CNN). For example, a RNN architecture may be part of the Generator design because geology is temporal in nature (over geological time). A RNN may capture the knowledge that the past is the key to the present, i.e. the geology in a previous time step affects the current and future timesteps. In considering a 3D geology model, the deeper rocks are older so can be thought of as a time series from deeper to shallower.

Figure 7:
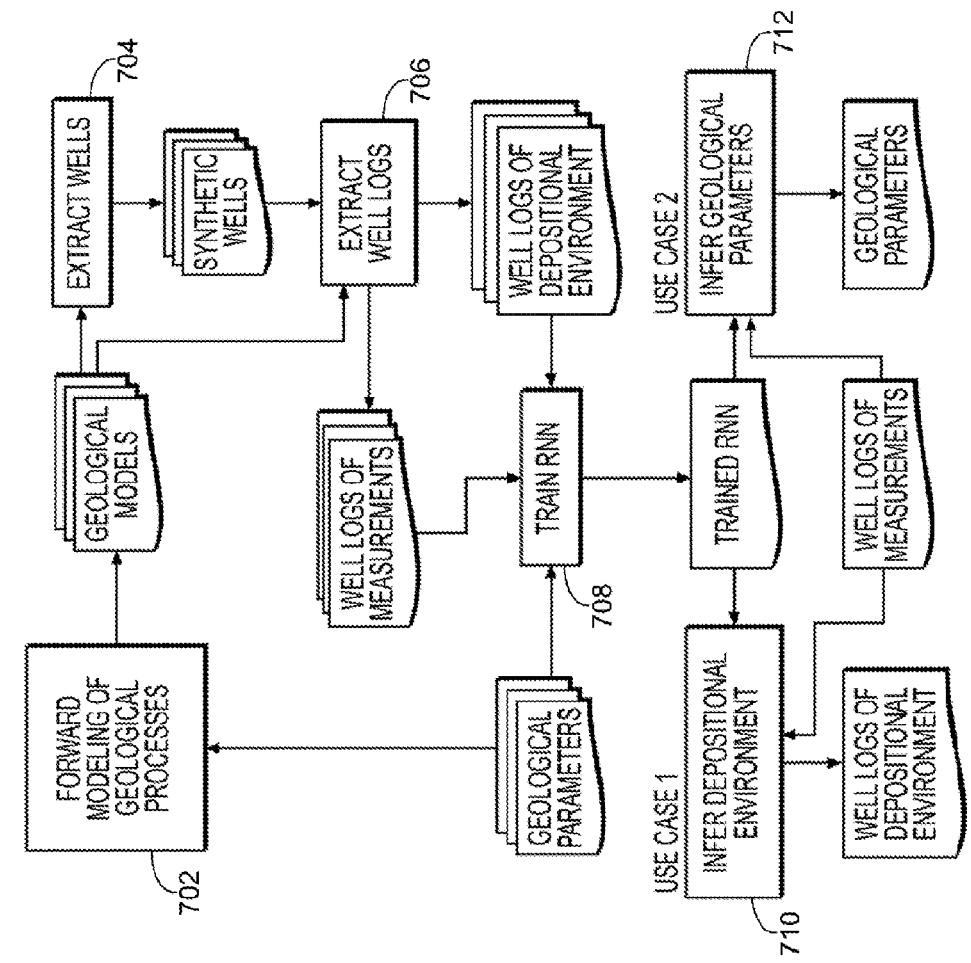
FIG. 7 illustrates a workflow overview of neural network driven reservoir modeling process in accordance with embodiments of various techniques described herein.

The overall workflow involving a RNN is shown in FIG. 7. The workflow of FIG. 7 may make inferences based on geological rules and knowledge that have been learned by a deep learning framework. Deep learning currently requires large amounts of labeled data to be trained. To achieve this, synthetic data may be generated using a geological process modeling simulator (action 702 in FIG. 7). Different geological parameters are input to the simulator such as initial conditions and sea level variation over time. Once the different models have been generated, synthetic wells (or seismic sections) intersecting the geological model may be created (action 704 in FIG. 7). In addition to geometry, the geological simulator also generates properties describing the rock properties such as clay, silt and sand fractions. The simulator may also generate properties of the depositional environment such as sea level change rate and relative sea level. For all of the previously generated synthetic wells, well logs of the rock properties and the depositional environment are extracted (action 706 in FIG. 7). The resulting large dataset may include one or more training images. In some implementations, the one or more training images may become the input for training, validating, and testing deep learning neural networks (action 708 in FIG. 7). In the example of FIG. 7, a Recurrent Neural Network (RNN) may be trained.

As will be discussed in greater detail below, a first use case (e.g., Use Case 1 710) as shown in FIG. 7 may involve inferring Relative Sea Level Change Rate as a function of geological time. The input measurements are well logs of the relative fraction of clay, silt and sand. Knowledge of Relative Sea Level Change Rate at a given depth in the well yields important insights into sequence stratigraphy.

As will be discussed in greater detail below, a second use case (e.g., Use Case 2 712) as shown in FIG. 7 may involve building a fast model that could perform "simulations inversion" by recovering the meta parameters of a simulator that would reproduce a given well at a given position. Such a model would be quite useful, since forward geological simulations are computationally very expensive. Further, if it of interest to interpret real data instead of synthetic data, then forward modeling of the geology is not an option. Having a model that could interpret the geology in a well and interpreting the most probable geological model parameters would allow for a better understanding of the geology at a specific location.

In a standard (fully connected or convolutional) network, it may be assumed that the model inputs are independent and, as such, have no time dependencies. Indeed when an image classifier is built for instance, the resulting category assigned to an image does not depend on the preceding (or future) image presented to the model. However when attempting to model time series, these assumptions do not hold anymore. Therefore, it may be desirable to take into account the time dependencies between the input of the models. To account for these time dependencies, a RNN may be utilized as a generator D and/or a discriminator D neural network.

RNN are similar to fully connected neural networks in the fact that they share the same weight for all input. However, RNNs have an internal hidden state which is updated at each time step according to the preceding state and the current input. Additionally, the output at a given time step may be computed with the current hidden state. Using a formal description, a RNN may be represented as a loop on itself which could theoretically be infinite. However in practical cases, it may be unrolled for a finite number of steps and may have weights trained using the back-propagation algorithm.

In some implementations, the generator of FIG. 6 may be implemented via a CNN (convolutional neural networks) because it captures and models the spatial relationships of geological objects. Accordingly, various neural networks may be used in various cases. For example, in cases involving the interpretation of a sea level change rate and/or cases involving the interpretation of model parameters, a RNN may be used. In some cases involving predicting geology in new wells and/or cases involving reproducing physical constraints, a GAN may be used. However, it will be appreciated that various neural networks may be used for various applications.

As discussed above, the generator of the GAN may be trained to generate models or realizations of the reservoir that are indistinguishable from the OBM generated models. In some implementations, the CGAN generator may be further conditioned based upon, at least in part, physical conditions or observations of the reservoir such that all generated models may also honor the observations.

In some implementations, neural network driven reservoir modeling process 10 may generate 200 the one or more reservoir models based upon, at least in part, one or more physical conditions or observations in the form of "hard" data and/or "soft" data. In some implementations, neural network driven reservoir modeling process 10 may condition the one or more reservoir models based upon, at least in part, "hard" data and "soft" data. In some implementations, the hard and soft data may be included in the condition vector y as shown in FIG. 6. Hard data may generally include the most trusted data to be honored exactly in the reservoir models. Examples of hard data may generally include well data and/or core data. Soft data may not be as precise as hard data and may be used to constrain the one or more reservoir models as a trend or probability. Examples of soft data may generally include seismic-derived data and/or geological interpretations. The condition vector y can be large and complex. It is best thought of as all the conditions (or constraints) on the reservoir model the Generator G will create.

Figure 8:
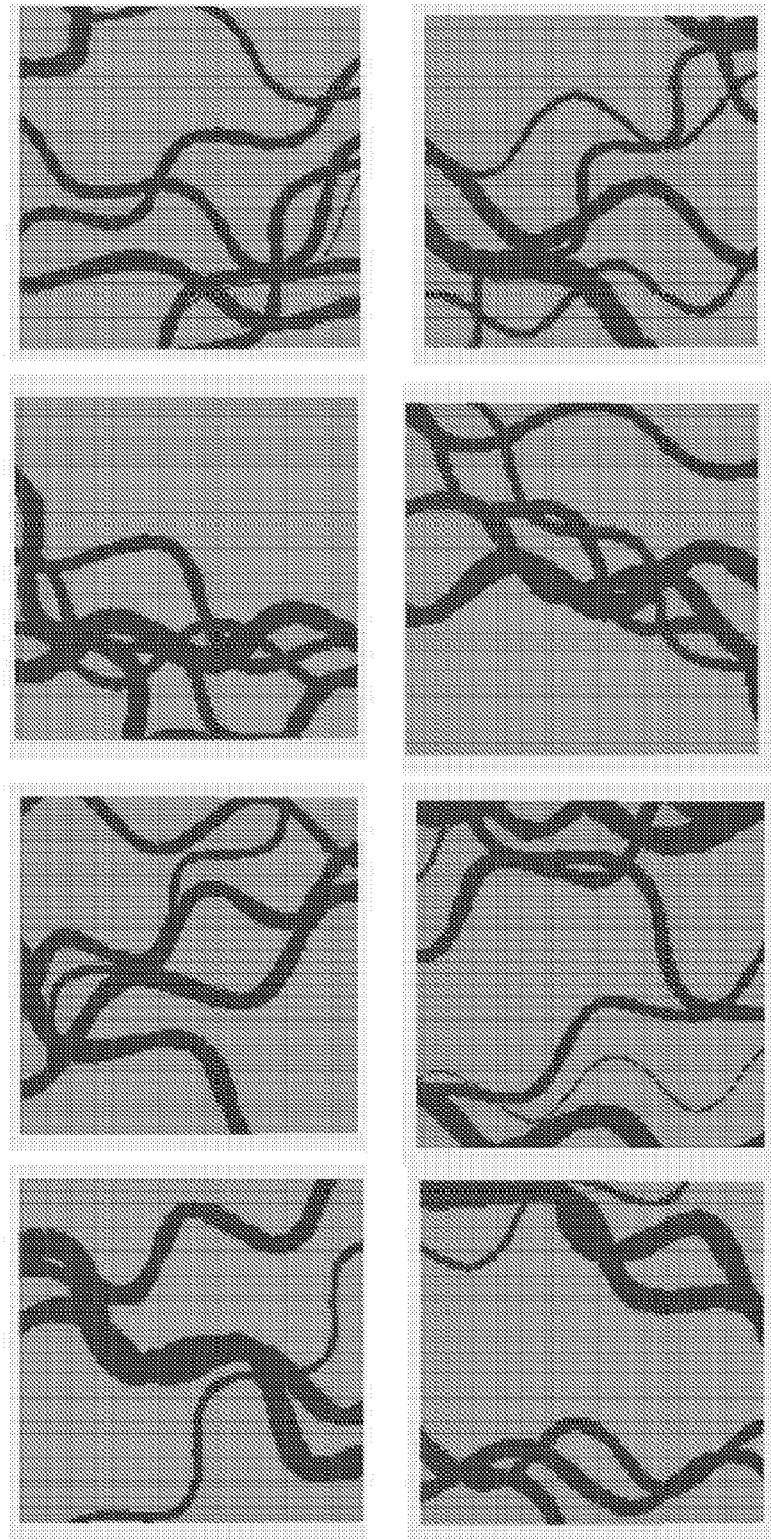
FIG. 8 illustrates eight fluvial models by object-based modeling in Petrel (all 2D models, 128×128 pixels) in accordance with embodiments of various techniques described herein.
Figure 9:
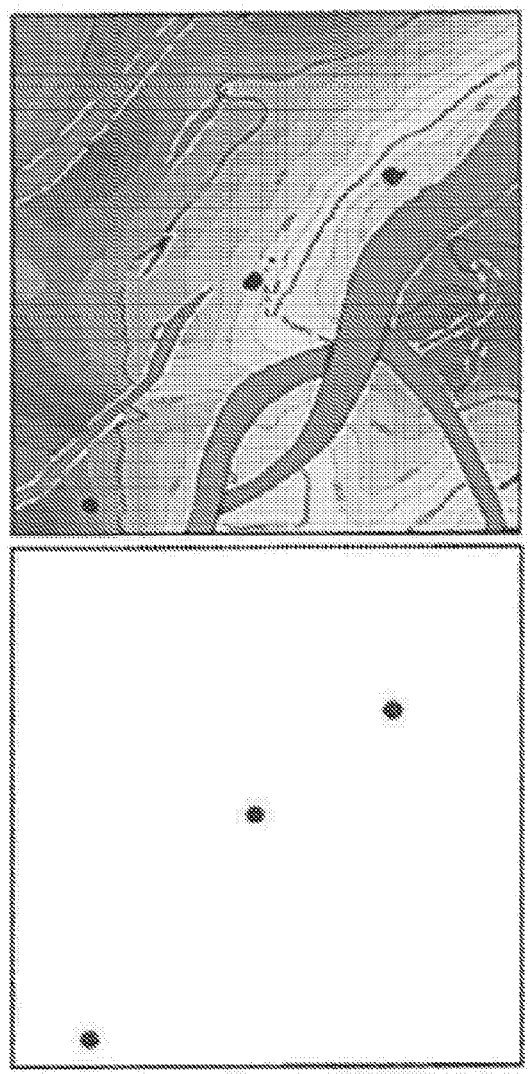
FIG. 9A illustrates an area with three data points (shown in red). These red data points may be wells or cores.
FIG. 9B illustrates a CGAN-generated geological representation (in this case showing porosity). This map honors the three red data points but fills-in the hitherto unknown inter-well area (white space) of FIG. 9A with a model generated from conditional GAN models using analogues, prior maps, outcrops or any other source of information to generate the map of FIG. 9B in accordance with embodiments of various techniques described herein.

For example, one component of y may be the locations of well measurements. Those measurements could be the rock type (sand, shale, limestone etc.), or a petrophysical property such as porosity or permeability. Seismic based conditions could also be supplied based on attribute interpretation. Additional conditions such as exogenous geological knowledge could also be included in y such as knowledge when of the depositional environment: e.g., is it continental shelf, or deep water. Also to be potentially included in Y is the production history of a well. This opens up the possibility of applying this to history matching. In history matching, the modeled geology must have the right geometries and properties to have hydrocarbons flow in the manner seen in the well's production history. The resulting geology created by G will then honor the supplied conditions. For example, exemplary reservoir models (e.g., reservoir realizations) that may be generated 200 by neural network driven reservoir modeling process 10 from the training images of FIG. 4 are shown in FIG. 8.

For example, a trained CGAN may be conditioned against known physical conditions or data related to the subsurface asset (existing wells, analogues, outcrops etc.). The trained reservoir model may then be used to populate static properties and their distribution for a single layer, various layers, facies or entire subsurface play in order to furnish reasonable approximations of the (unknown) subsurface geology. Any number of CGAN-generated reservoir models may be generated. The CGAN reservoir model conditioned on known data from existing wells may comprise all, some, or none of the following:

Aerial extent of units, layer, facies
Faults
Porosity
Permeability
Net-to-Gross (NTG)
Saturations
Pressure
Thickness (possibly varying with area)
Connectivity to adjacent compartments
Connectivity to aquifer and/or gas cap Referring also to the example of FIGS. 9A-9B, FIG. 9A may be empty except three known data points. These may be existing wells or cores or other physical conditions. FIG. 9B may be the CGAN map for any property (here porosity). Many hundreds (even thousands) of such property maps may be generated by neural network driven reservoir modeling process 10 this way all honoring the available data. In some implementations, FIG. 9B may show a map that honors the three data points of FIG. 9A but fills-in the hitherto unknown inter-well area (white space) with a model generated from conditional GAN models using analogues, prior maps, outcrops or any other source of information.

Figure 10:
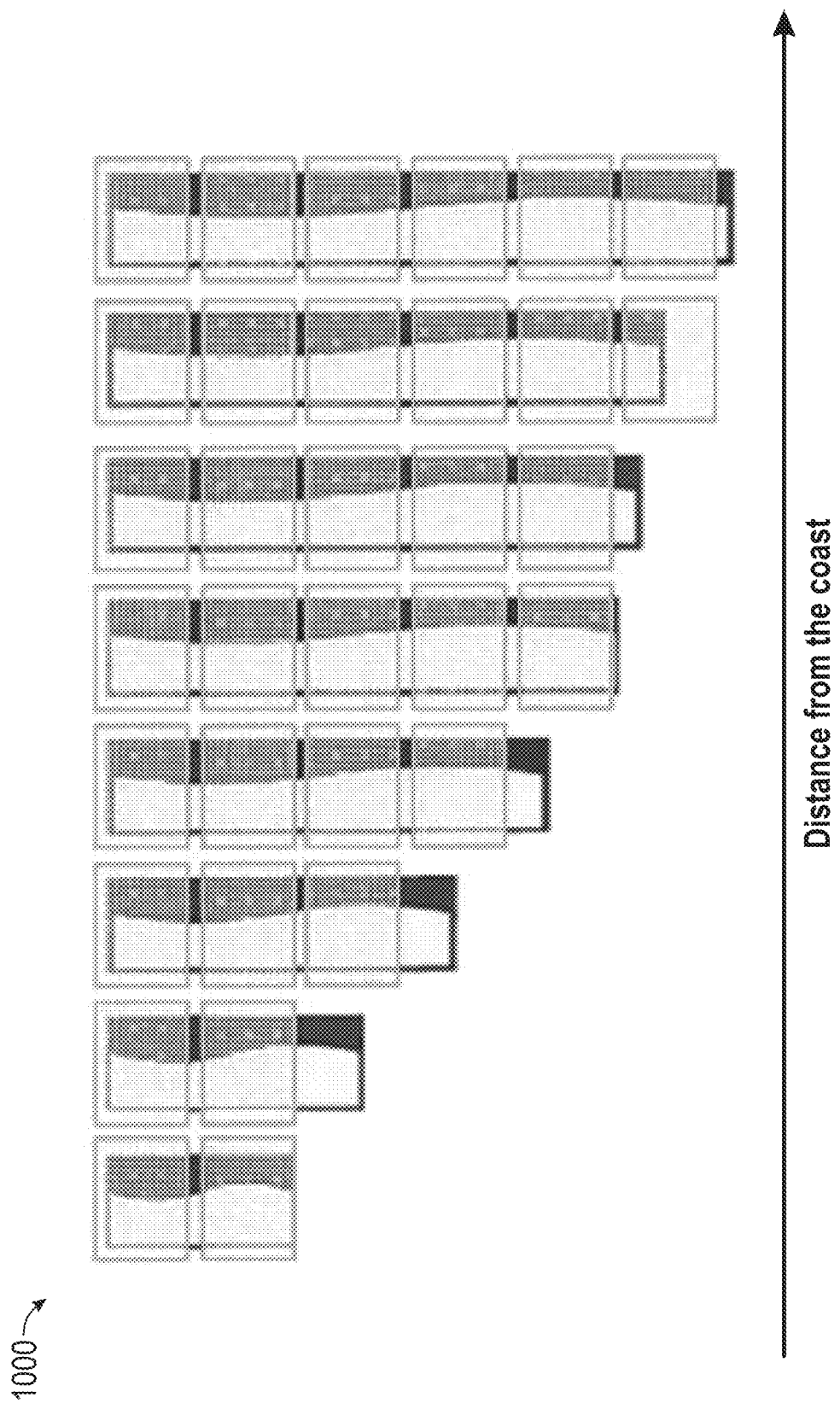
FIG. 10 illustrates a global grid split of well logs in accordance with embodiments of various techniques described herein.
Figure 28:
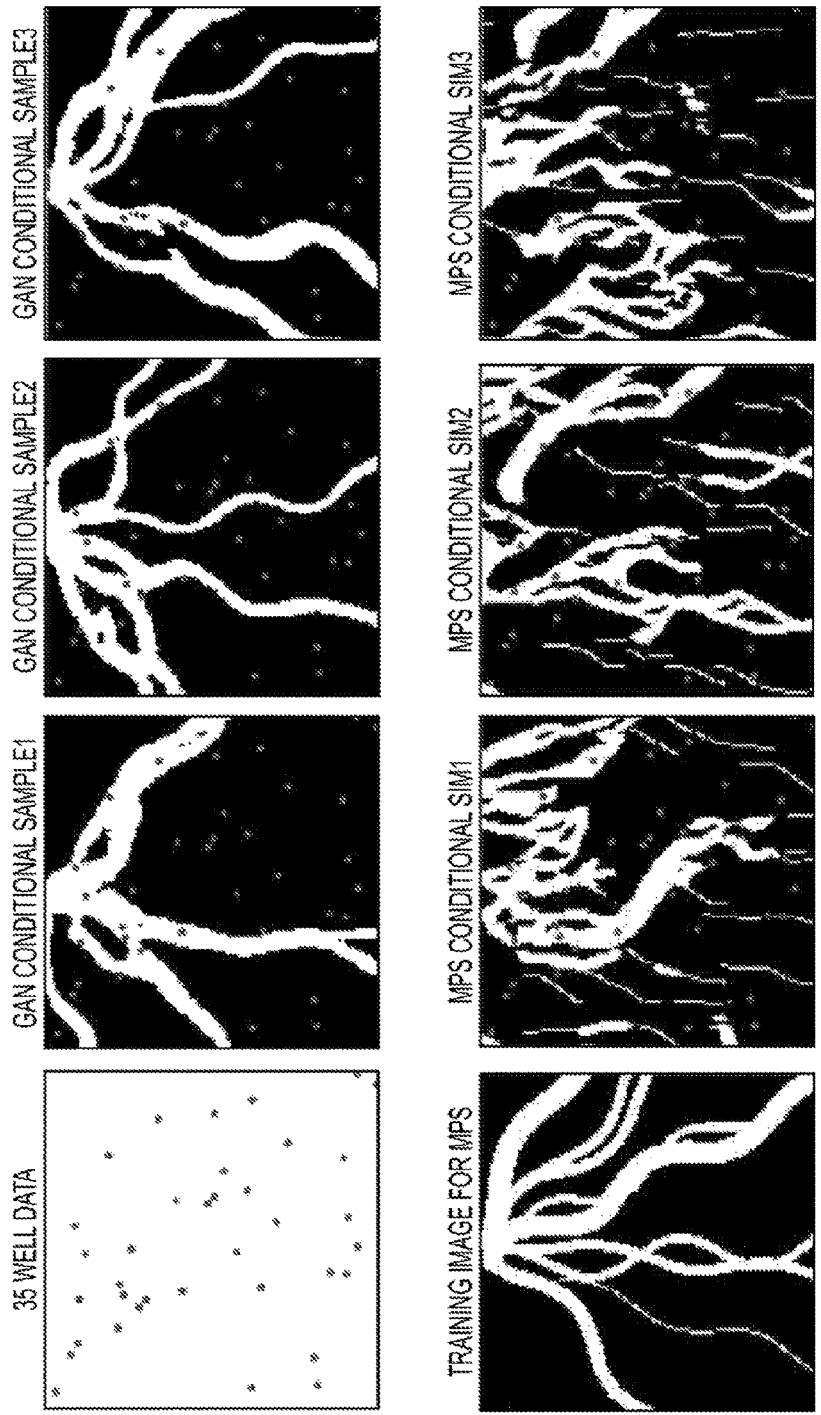
FIG. 28 illustrates three conditional deltaic GAN examples honoring 35 well data (top) and three conditional MPS simulations constrained by the same 20 well data and using a single training image (bottom)

In an example, a vanilla GAN was used to generate realistic appearing wells without conditions. Rather than generate wells of any measured depth/length, sub-sections of uniform length were generated as illustrated in FIG. 10. In the examples of FIGS. 10-16, GPM created synthetic geology (e.g., one or more training images). The well logs illustrated in FIG. 16 labeled Fake Samples 1, 2, and 3 were generated by a trained Generator (e.g., Generator G of FIG. 6) and are akin to the training images generated by the Generator that was trained on OBM supplied training images. The condition in this scenario is a simple position describing the relative position of the well with respect to geology. In some implementations, the well location may be described with respect to "Proximal" versus "Distal" depositional environment. In the training and test dataset of FIG. 13, the proximal environment may be closer to shore and has coarser sediment and thicker beds. The distal environment on the other hand has finer grained sediment and thinner beds. In some implementations, these four states (classes) may range from most proximal (Class 1) to most distal (Class 4) as illustrated in FIG. 28.

For both the vanilla GAN and conditional GAN (CGAN) investigations, fully connected neural networks were implemented to model G and D. For the Vanilla GAN example, through hyper parameter optimization, the following architecture for generating wells was observed:

Latent space:
  dimension=128
  distribution=normal
Generator:
  layers=3
  neurons=512
Discriminator:
  layers=3
  neurons=239

In some implementations, GANs can be very unstable during training. In an example, the Wasserstein GAN (WGAN) approach was used for the cost function. Instead of outputting a probability, the WGAN generates a critic score. As the WGAN training progresses, this critic score decreases. Rather than being a probability, the value of the score may be interpreted as the generator performed "x times better than before". Further, this score provides a good indication of the quality of the generation, and usually the lower it is, the better the generated samples.

In this experiment, at the end of training (200 iterations consisting of 100 batches of 64 sequences each) generated data was obtained which appeared to be visually similar to real samples.

Figure 11:
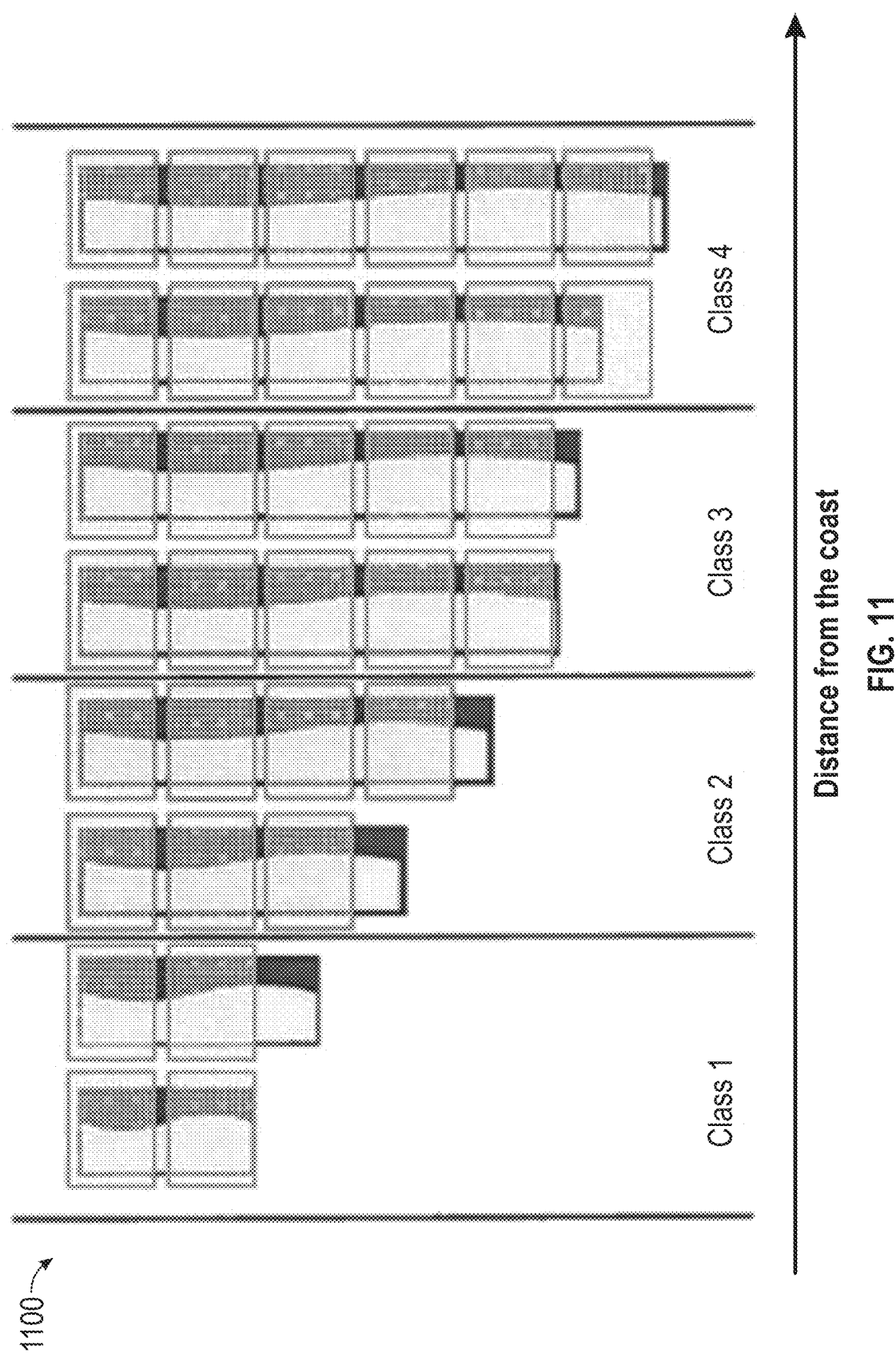
FIG. 11 illustrates a conditional grid split of well logs in accordance with embodiments of various techniques described herein.

In another example, well logs conditioned on their relative distance from the shoreline were generated as illustrated in FIG. 11. The same basic network structure and configuration was used as in the vanilla GAN example above. However, to support conditioning, a condition vector may be concatenated to the noise. In this example, five different classes corresponding to five different ranges of distance from the shoreline were used.

Figure 12:
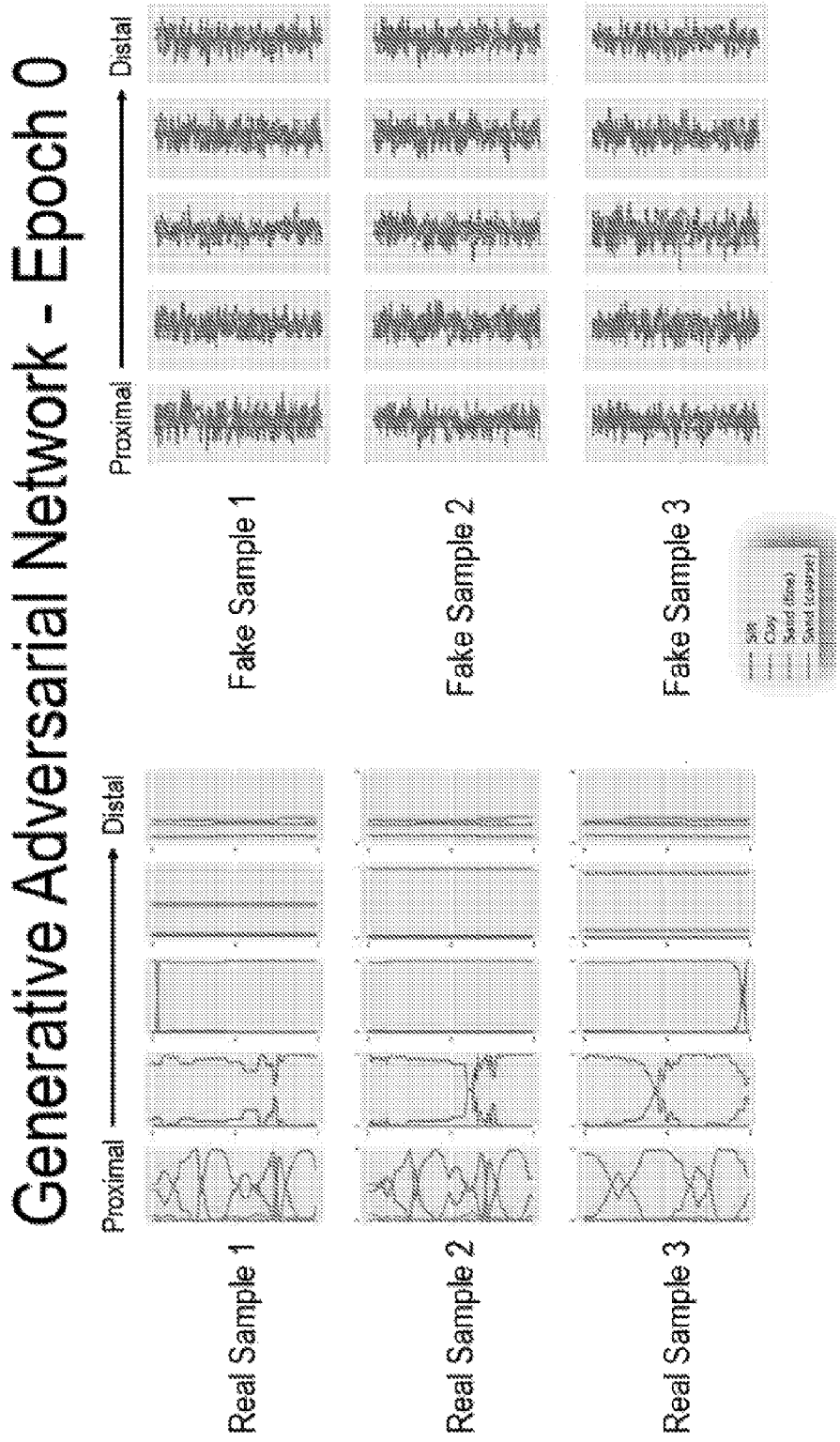
FIGS. 12-16 illustrate various generator sample classes for various epochs in accordance with embodiments of various techniques described herein.
Figure 13:
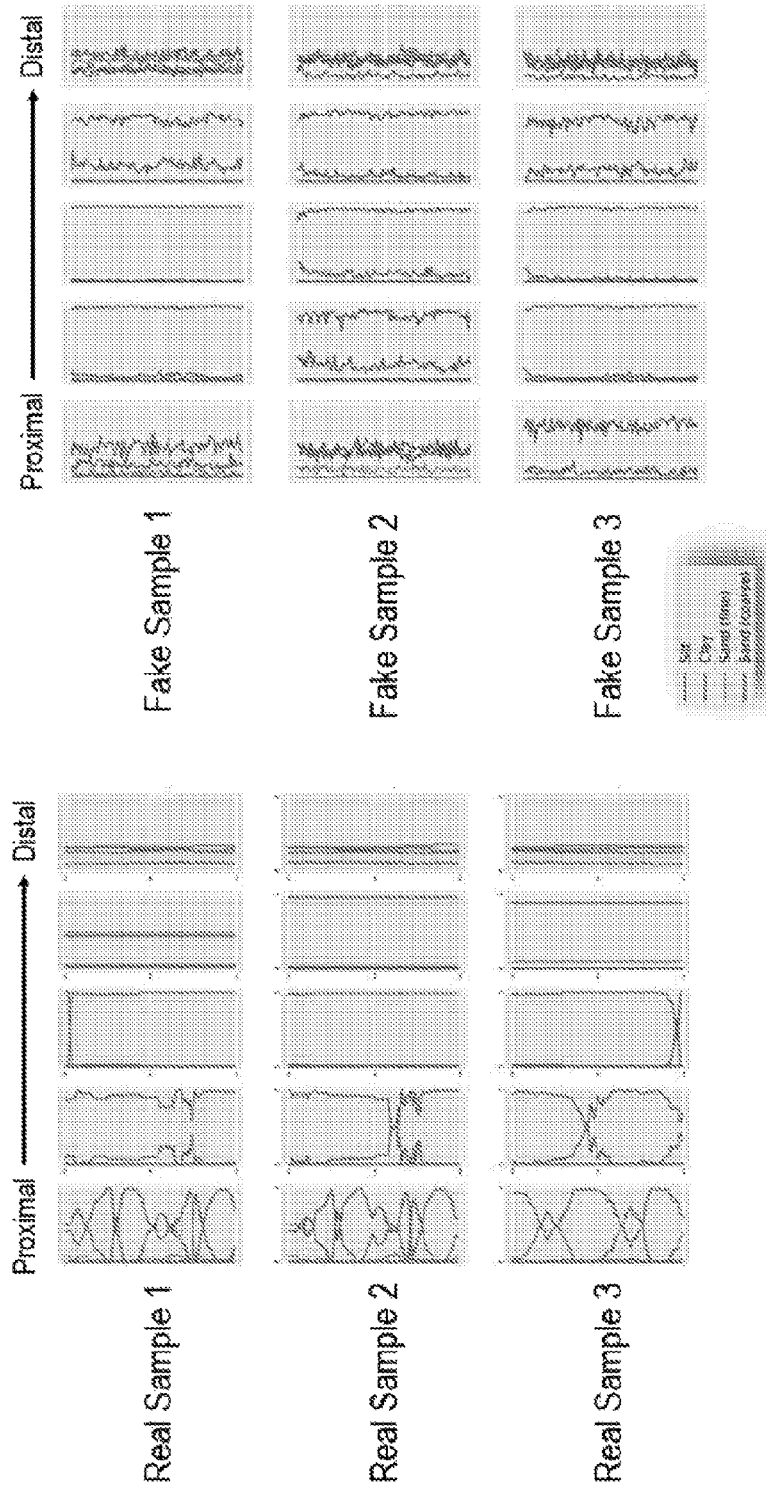
Figure 14:
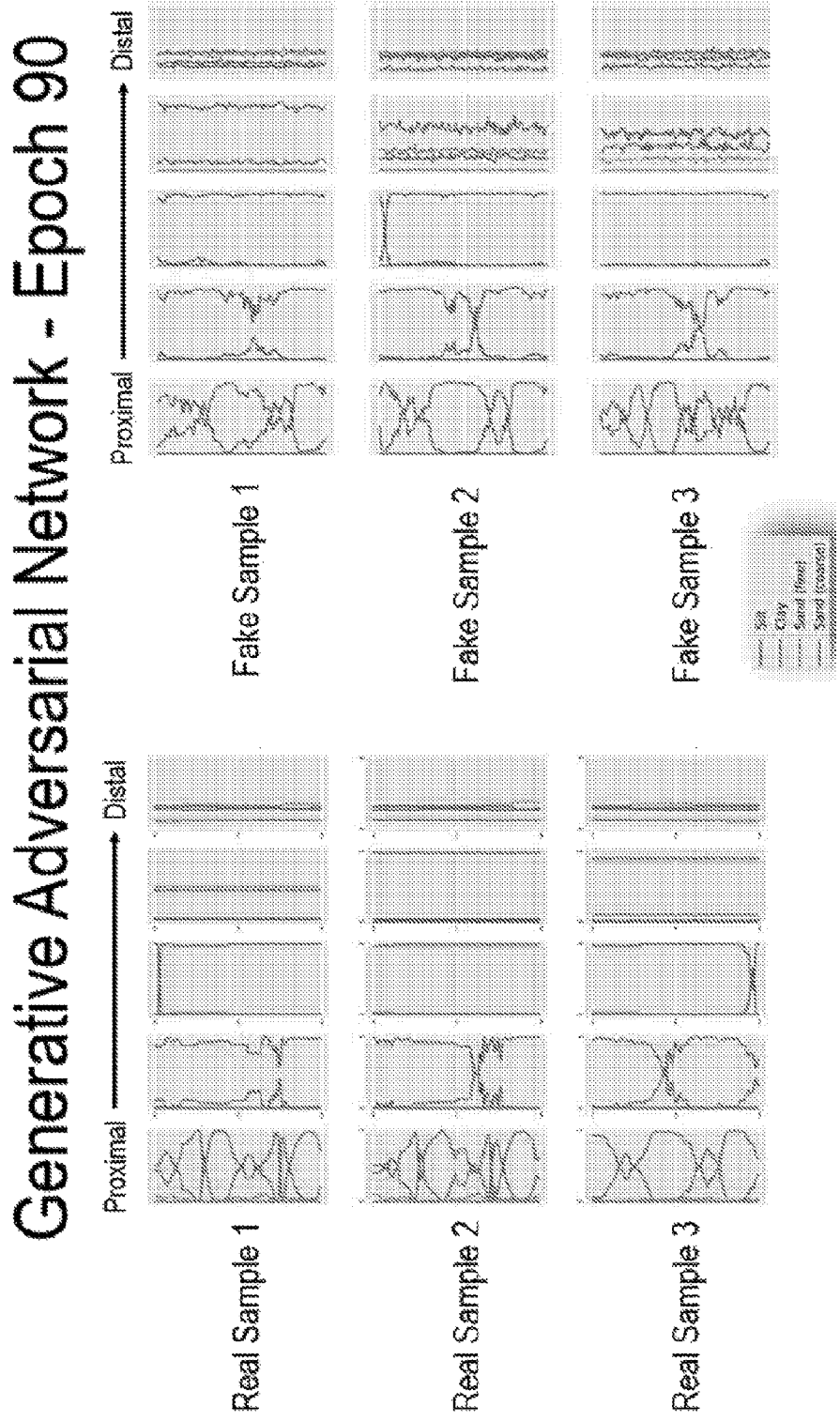
Figure 15:
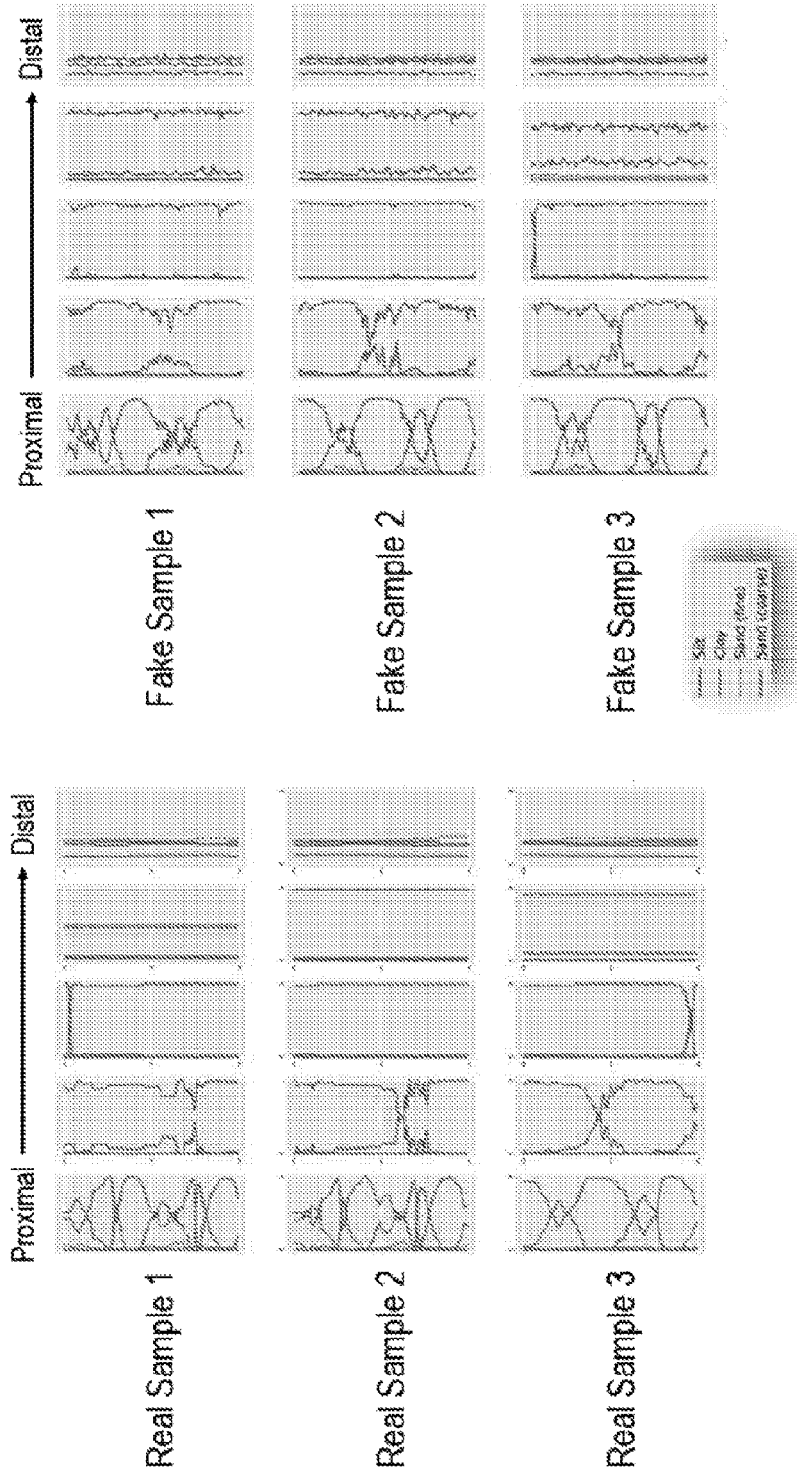
Figure 16:
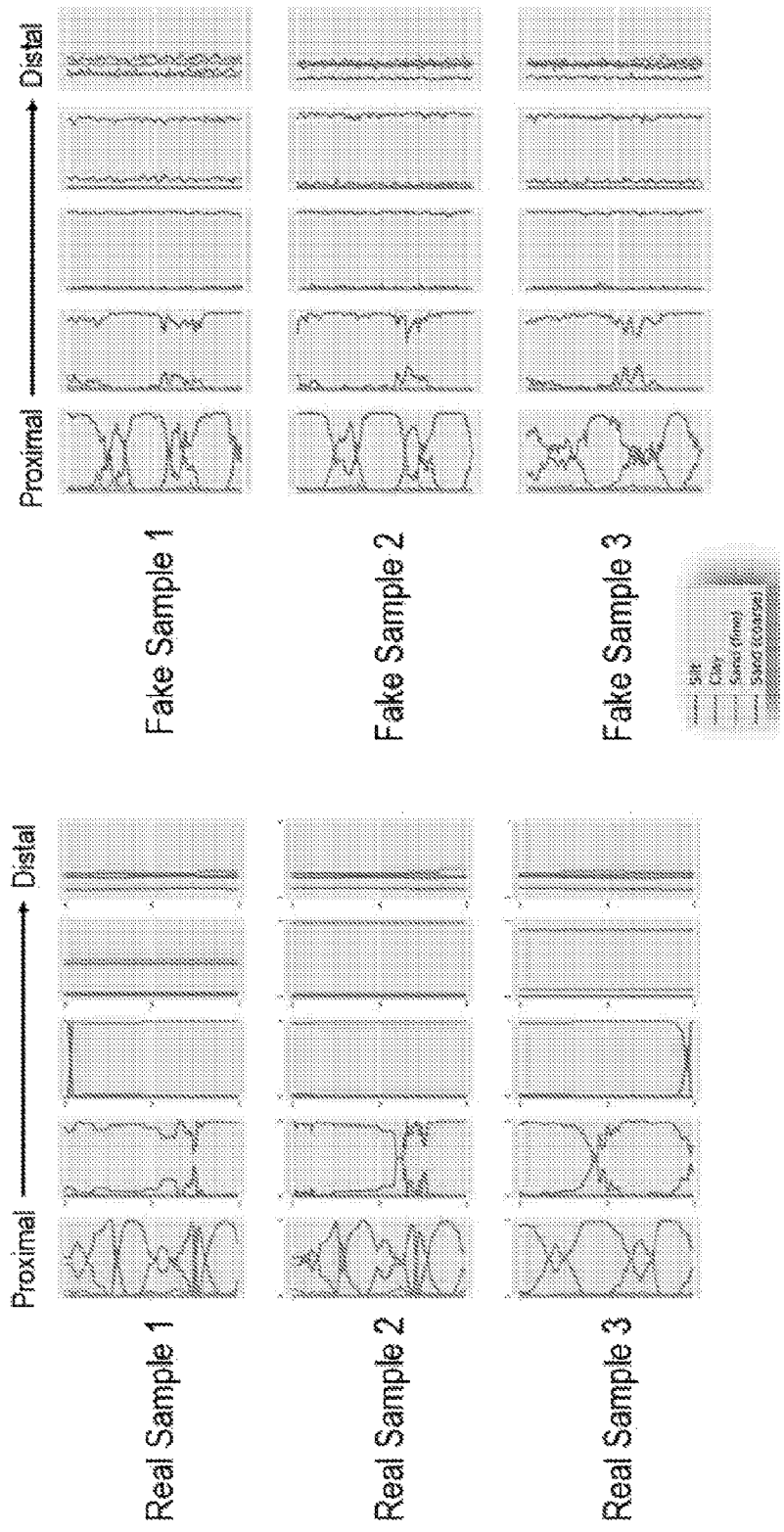

In FIGS. 12-16, some examples of the generation of wells per classes by neural network driven reservoir modeling process 10 may be observed. These examples may be drawn from different training epochs. In some implementations, an epoch may generally be a measure of the number of times all of the training vectors are used once to update the weights of a neural network. FIG. 12 may represent training after 0 epochs; FIG. 13 may represent training after 10 epochs; FIG. 14 may represent training after 90 epochs; FIG. 15 may represent training after 150 epochs; and FIG. 16 may represent training after 170 epochs. It may be observed that at the beginning of training, the generator may output noise but quickly learns to approximate the real data with more epochs.

Figure 17B:
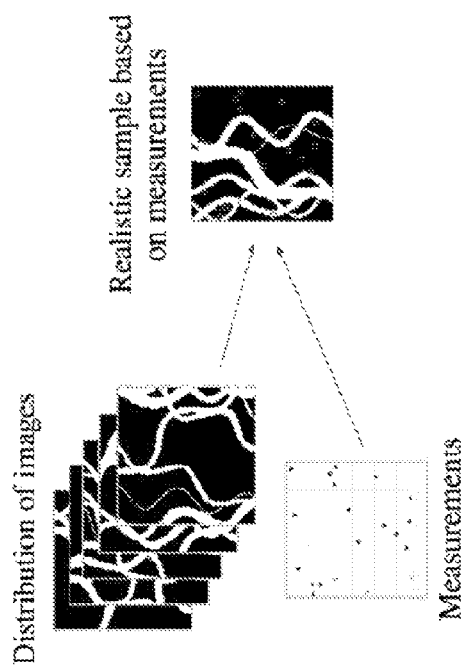
FIG. 17B is an illustration of the geological models constrained by measurements in accordance with embodiments of various techniques described herein.
Figure 17A:
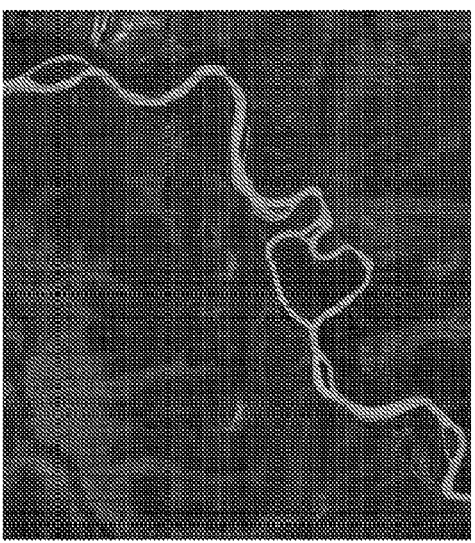
FIG. 17A is an example of non-linear meandering fluvial pattern, e.g., Kuskokwim River, Alaska in accordance with embodiments of various techniques described herein.

In some implementations, given a number of true physical measurements and a distribution of geological patterns (e.g. a large set of training images), realizations of the geology (e.g., reservoir models) may be generated 200 which honor the physical measurements while producing realistic geological patterns. More specifically, suppose that a specific area is known to have, for example, fluvial geological patterns as shown in FIG. 17A. In this example, the fluvial geological patterns may be non-Gaussian and highly non-linear. Suppose also that, at various spatial locations (x, y), the type of the rock r has been measured, i.e. a set of tuples of the form (x, y, r). Given these measurements, the rock type r at all locations may be determined such that: 1) the resulting realizations are realistic (i.e. match the distribution of geological patterns); and 2) the resulting realizations honor the physical conditions or measurements. While fluvial geological patterns have been described, it will be appreciated that embodiments of the present disclosure are applicable to all depositional environments e.g., alluvial, lacustrine, delta plain, shallow marine, deep marine, etc.

The examples discussed below pertain to the case of fluvial patterns with binary measurements (i.e. there are only two types of rock present), although it is easy to extend this to the general case. For example, neural network driven reservoir modeling process 10 may receive 206 one or more training images including a distribution of patterns associated with a depositional environment (e.g., a distribution of fluvial patterns, alluvial patterns, lacustrine patterns, delta plain patterns, shallow marine patterns, deep marine patterns etc.). Specifically, neural network driven reservoir modeling process 10 may have a distribution of binary images $p_{fluvial}(z)$ where $z \in \{0,1\}^{n \times n}$ and a set of m binary measurements (x, y, r) where $r \in \{0,1\}$. In some implementations, samples $z \sim p_{fluvial}(z)$ may be generated such that $z(x_i, y_i) = r_i$ for i=1, . . . , m. This approach is illustrated in FIG. 17B.

The above problem is closely related to semantic inpainting. Semantic inpainting may generally include the task of filling in missing regions of an image using the surrounding pixels and a prior on what the images should look like. As discussed above, GANs are generative models composed of a generator G and discriminator D each parametrized by a neural network where G is trained to map a latent vector z into an image x, while D is trained to map an image x to the probability of it being real (as opposed to generated). In some implementations, neural network driven reservoir modeling process 10 may train 208 the one or more neural networks to generate one or more samples based upon, at least in part, the one or more training images including the distribution of patterns associated with the depositional environment. For example, the networks may be trained adversarially by optimizing the loss as shown below in Equation 3.

$$\max_G \min_D \mathbb{E}_{x \sim p_{data}(x)}[\log D(x)] + \mathbb{E}_{z \sim p(z)}[\log(1 - D(G(z)))] \quad (3)$$

After training on data drawn from a distribution 73 data, G will be able to generate samples similar to those from 73 data, by sampling z~p(z) and mapping x=G(z). In some implementations, neural network driven reservoir modeling process 10 may generate 210 the one or more reservoir models based upon, at least in part, the one or more samples and the one or more physical conditions associated with the reservoir. Using a trained G and D, neural network driven reservoir modeling process 10 may generate realistic images (e.g., realizations) $x_g$=G(z) conditioned on a set of known pixel values y. This can be achieved by fixing the weights of G and D and optimizing z to generate realistic samples based on the know pixel values. In order to generate realistic samples (e.g., images and/or realizations), it may be desirable to have the samples $x_g$ close to $p_{data}$, i.e. samples such that the discriminator D assigns high probability to $x_g$. This is formalized through the prior loss as discussed below. In some implementations, it may be desirable for the samples to honor the pixel values y, i.e. the generated $x_g$ matches y at the known pixel locations. This is formalized through the context loss as discussed below. In this manner, neural network driven reservoir modeling process 10 may generate the one or more reservoir models includes determining at least one of a prior loss and a context loss associated with the one or more samples.

Prior loss: The prior loss $_p$ penalizes unrealistic images. Since D was trained to assign high probability to realistic samples, the prior loss is chosen as shown below in Equation 4:

$$_p(z)=\log(1D(G(z))) \quad (4)$$

Context loss: The context loss penalizes mismatch between generated samples and known pixels y. Denoting by M the masking matrix (which has value 1 at the known points and 0 otherwise), the context loss is defined as shown below in Equation 5:

$$_c(z|y,M)=\|M\odot(G(z)y)\|_2 \quad (5)$$

Total loss: The total loss is defined as the weighted sum of the prior loss and context loss as shown below in Equation 6:

$$(z)=_c(z|y,M)+\lambda_p(z) \quad (6)$$

where λ controls the tradeoff between generating realistic images and matching the known pixel values. It may be observed that the loss (z) is modified from Yeh et al. (2016) in that the $L_2$ norm is used instead of the $L_1$ norm for the context loss and the masking matrix M is unweighted.

Figure 18:
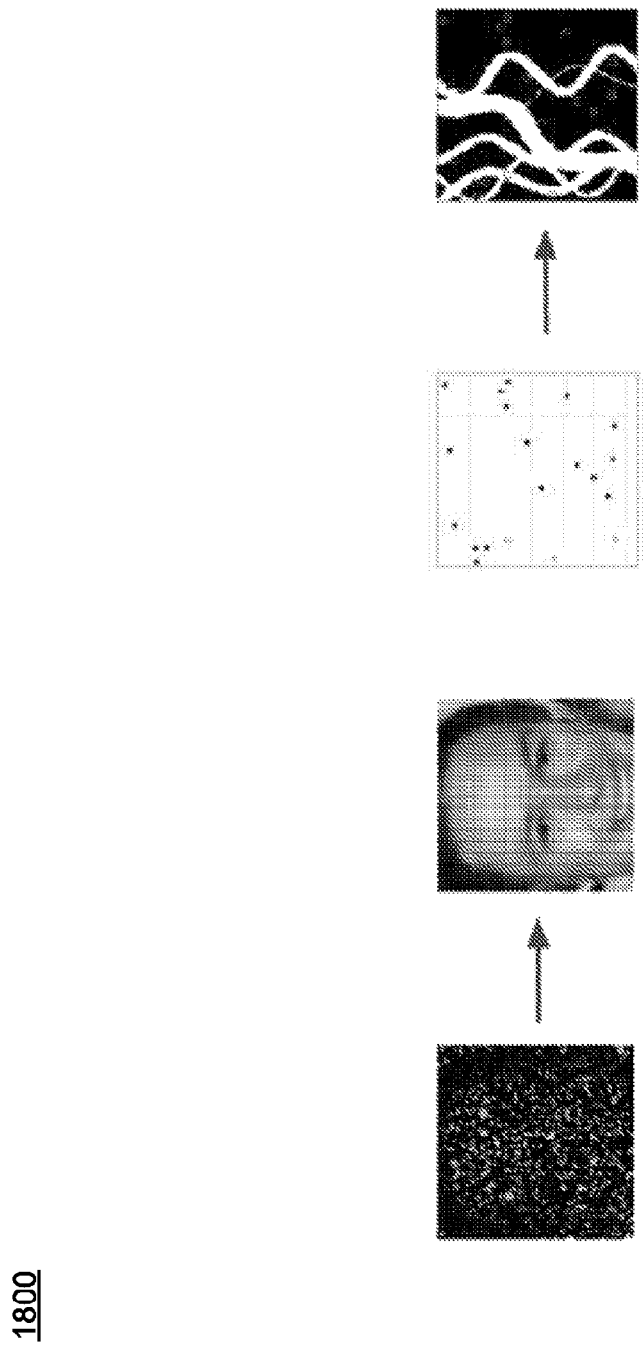
FIG. 18 is a comparison between inferring missing pixel values and generating geology based on physical measurements in accordance with embodiments of various techniques described herein. A portion of this image is borrowed from Yeh et al. (2016)

Referring also to FIG. 18 and in some implementation, neural network driven reservoir modeling process 10 may establish a connection between semantic inpainting and generating realizations of geology conditioned on physical measurements. For example, 13 data may be the distribution of fluvial patterns $p_{fluvial}$ and the set of known pixel values y may be the set of known physical measurements at various locations. By randomly initializing z and minimizing (z), neural network driven reservoir modeling process 10 may obtain various realizations of the geology that are realistic while honoring the physical measurements (the relationship between using different initializations of z and generating different realizations of the geology is discussed in greater detail below). The final algorithm for generating a realization conditioned on physical measurements can then be described as follows. Given distribution of fluvial patterns $p_{fluvial}$(X), measurements y, neural network driven reservoir modeling process 10 may:

1. Train G and D on $p_{fluvial}$(x)
2. Initialize z randomly
3. Compute z by minimizing (z)
4. Return sample x=G(z)

Figure 19:
FIGS. 19-20 illustrate examples of training data (generated with OBM) rock in accordance with embodiments of various techniques described herein. White pixels correspond to fluvial channels while black pixels correspond to background rock.

In some implementations, neural network driven reservoir modeling process 10 may train G and D with a large dataset of geological patterns. In order to create such a dataset, neural network driven reservoir modeling process 10 may take advantage of another family of geomodelling approaches called object-based models (OBM). Even though OBMs are good at producing realistic geobodies, conditioning on dense data locations is very difficult and extremely slow and often fails to converge in MCMC (e.g., Markov chain Monte Carlo). Neural network driven reservoir modeling process 10 may use OBM to generate a training set of 5000 images of fluvial patterns. Each image may have dimensions 128 by 128 and may be binary, with "1" corresponding to channels and "0" corresponding to background (i.e. two different types of rock). However, it will be appreciated that images with other dimensions and/or non-binary values may be used. Examples of the training data are shown in FIG. 19.

Figure 20:
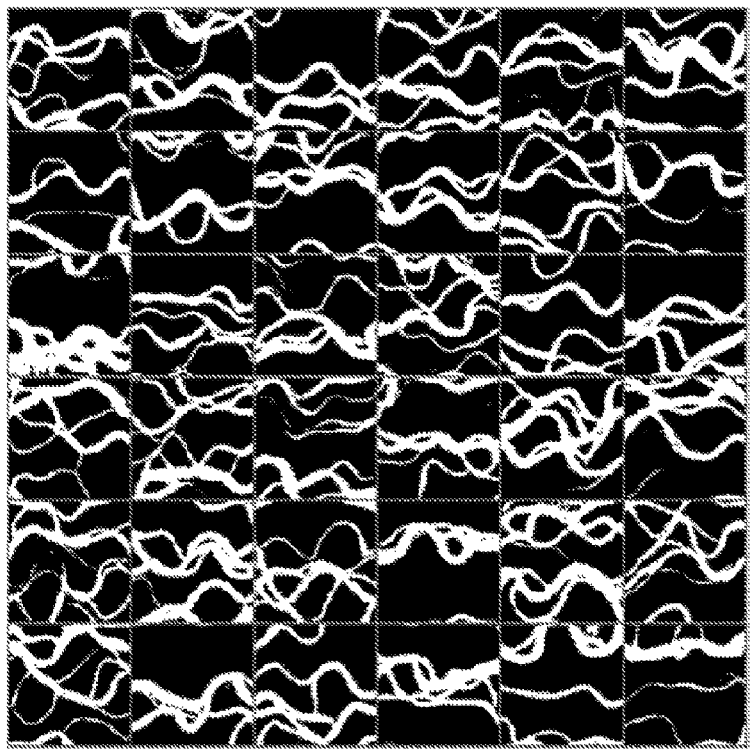
Figure 21:
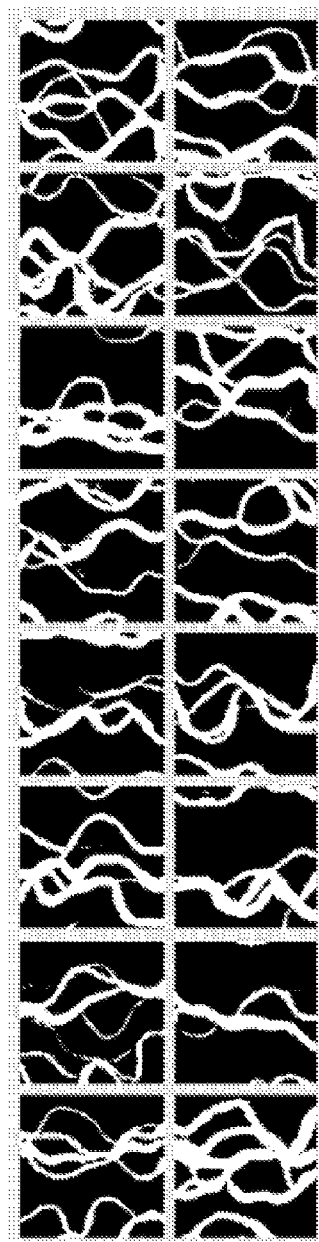
FIG. 21 depicts generated unconditional samples in accordance with embodiments of various techniques described herein. The samples are sharp and exhibit many of the desired properties such as channel connectivity and variety.

Referring also to FIG. 20, a training set of images may be generated with OBM using three channel parameters: orientation, amplitude and wavelength. Each of these may follow a triangular distribution. The orientation may be varied from e.g., −60° to 60°; the amplitude from e.g., 10 to 30; and the wavelength from e.g., 50 to 100. The channel proportion for each image was controlled to be e.g., 25% (i.e. on average 25% of the pixels are white).

In some implementations, neural network driven reservoir modeling process 10 may use a DC-GAN architecture (Radford et al. (2015)) for the discriminator and generator and train an unconditional model (i.e. a model that freely generates fluvial patterns without being restricted by physical measurements) on the dataset of e.g., 5,000 images. The non-linearities in the discriminator may be LeakyReLU(0.2) except for the output layer which may be a sigmoid. The non-linearities in the generator are ReLU except for the output layer which may be a hyperbolic tangent (e.g., tanh). In some implementations, the models may be trained for e.g., 500 epochs with Adam with a learning rate of e.g., 1e-4, $β_1$=0 and $β_2$=0.9.

Figure 22B:
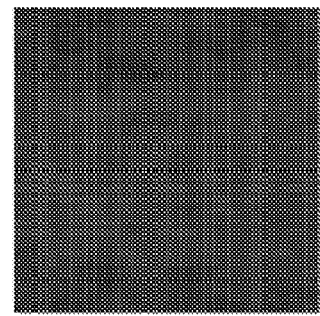
FIG. 22B depicts a mean image of 1000 unconditional samples. The pixel distribution is fairly uniform suggesting the model has learnt an even distribution of channels.
Figure 22A:
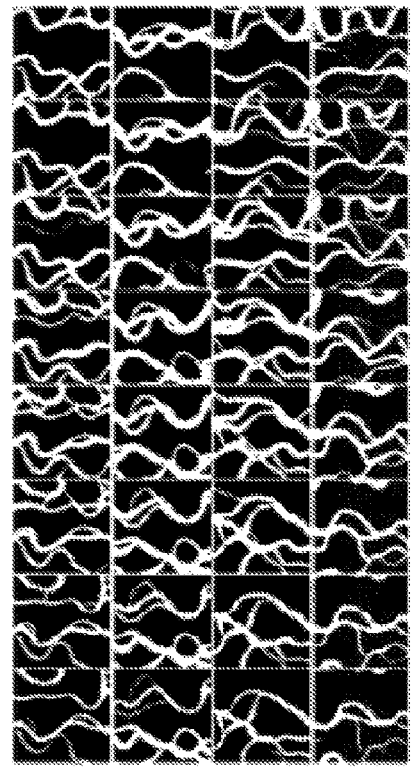
FIG. 22A depicts examples of latent traversals. Each row of images was obtained by interpolating between two random vectors $z_1$ and $z_2$ drawn from $\mathcal{N}(0, 2)$ and mapping them through G.

In order to verify that the model has learnt to generate realistic and varied samples, neural network driven reservoir modeling process 10 may perform several checks. Firstly, neural network driven reservoir modeling process 10 may visually inspect samples from the model (see FIG. 21). The samples are almost indistinguishable from the true data and embody a lot of the properties of the data, e.g. the channels remain connected, the patterns are meandering and there is a large diversity suggesting the model has learnt a wide distribution of the data. Secondly, since the training images were generated by OBM, some of the statistics the model should satisfy. For example, the ratio of white pixels to black pixels may be a generative factor (and was chosen to be 0.25). By sampling e.g., 1,000 images from G, and calculating the ratio of white to black pixels, neural network driven reservoir modeling process 10 may obtain the same ratio within 1%. In addition, to ensure the channels are well distributed, neural network driven reservoir modeling process 10 may average e.g., 1,000 generated images and check that the pixel values are approximately e.g., 0.25 everywhere. Finally, neural network driven reservoir modeling process 10 may also perform traversals in latent space to ensure the model has learnt a good approximation of the data manifold. It may be expected that the changes over the latent space be smooth and not disconnect any channels. This is shown in FIG. 22.

Using the conditional GAN, neural network driven reservoir modeling process 10 may create samples conditioned on measurements by minimizing the loss (z) specified in Equation 4. To do this, neural network driven reservoir modeling process 10 may take a fluvial image and randomly select m measurement locations and mask the rest of the input. Neural network driven reservoir modeling process 10 may then randomly initialize several $z^{(i)}$ and minimize (z) for each of them using Stochastic Gradient Descent (SGD). In some implementations, to optimize z, neural network driven reservoir modeling process 10 may use SGD with a learning rate of 1e-2 and momentum of 0.9. However, it will be appreciated that other configurations for optimizing z are within the scope of the present disclosure.

Figure 23:
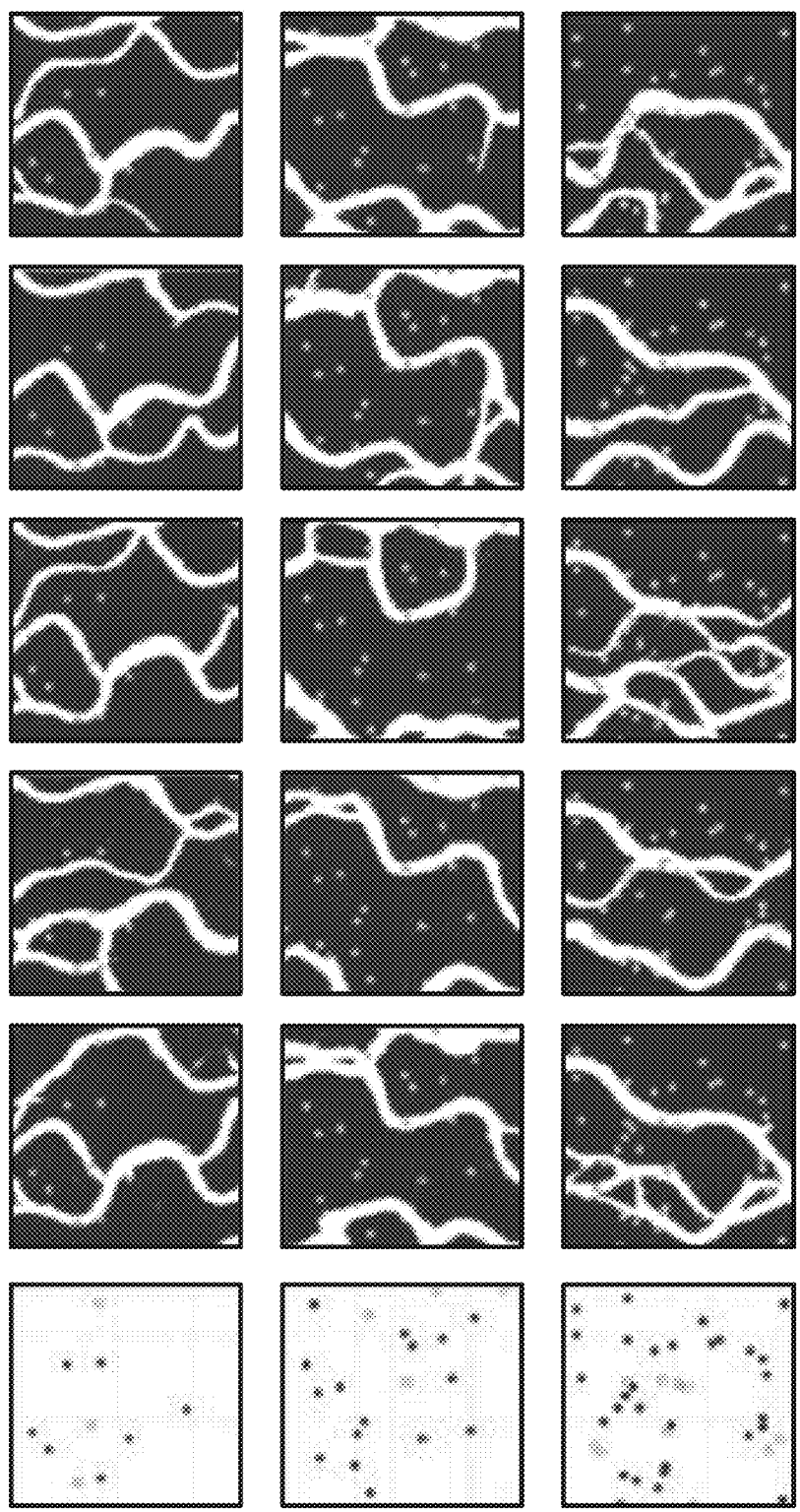
FIG. 23 depicts examples of conditional samples in accordance with embodiments of various techniques described herein. Each row corresponds to a different number of measurements. The first column shows the true physical measurements while the subsequent columns show different realizations based on the measurements. The realizations are realistic and almost always honor the data. Note that the measurements are shown in blue and orange on the generated samples for clarity.

By randomly initializing several $z^{(i)}$ and minimize (z) for each of the several $z^{(i)}$, this may result in a set of $z^{(i)}$ each corresponding to a local minimum of (z). Ideally, each of the $z^{(i)}$ can be mapped to a realization $x^{(i)}=G(z)^{(i)}$) such that the $x^{(i)}$ honor the physical measurements, have realistic geological patterns and each correspond to different realizations. The idea is that different initializations will lead to different minima of (z) and in turn a variety of samples all satisfying the constraints. Examples of this are shown in FIG. 23. As can be seen, the samples produced have high quality (the channels remain connected, the images look realistic) and satisfy the constraints while being diverse.

Figure 24A:
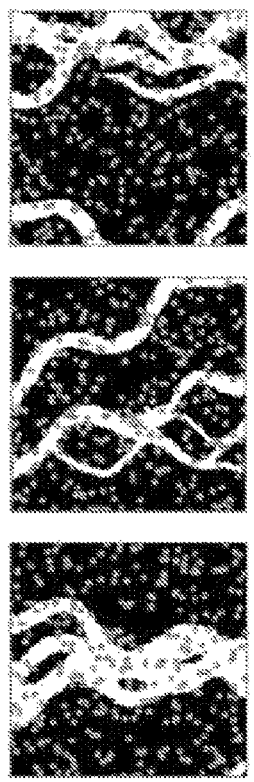
FIG. 24A depicts samples conditioned on 300 points in accordance with embodiments of various techniques described herein. Even with a large number of physical measurements the algorithm generates realistic realizations while honoring most data points.
Figure 24B:
FIG. 24B depicts failure examples for different number of measurements (m=10, 20, 40, 300). The samples either fail to honor the measurements or produce unrealistic patterns (e.g. blobs of disconnected channels)

For most geostatistical modeling algorithms, increasing the number of measurements to condition on, degrades performance and increases runtime. However, this is not the case for neural network driven reservoir modeling process 10 which is able to achieve good performances over a wide number of measurements from sparse to dense. Results are shown in FIG. 24A. However, minimizing (z) can sometimes lead to poor minima and in turn samples that are either unrealistic or do not satisfy the measurement constraints. Examples of this are provided in FIG. 24B. While the unconditional model exhibits large sample diversity, this is not always the case for the conditional samples. The conditional samples created are realistic and honor the physical measurements but may lack diversity. The variety of samples is based on the variety of local minima of (z) and random initializations may end up in the same local minimum, resulting in the same sample.

In contrast to conventional geological modeling systems, neural network driven reservoir modeling process 10 may use several training images with wide uncertainty and generate large coherent realizations of the geology as opposed to small patches. More importantly, neural network driven reservoir modeling process 10 may allow for conditioning on physical measurements.

As discussed above, neural network driven reservoir modeling process 10 may provide a powerful and flexible framework for generating realizations of geology conditioned on physical measurements. It is superior to existing geological modeling tools due to its ability to capture realistic geological patterns with a wide range of uncertainty and its flexibility to condition on physical measurements. In some implementations, neural network driven reservoir modeling process 10 may generate subsurface geological models in 3D and may include more than two rock types.

Figure 25:
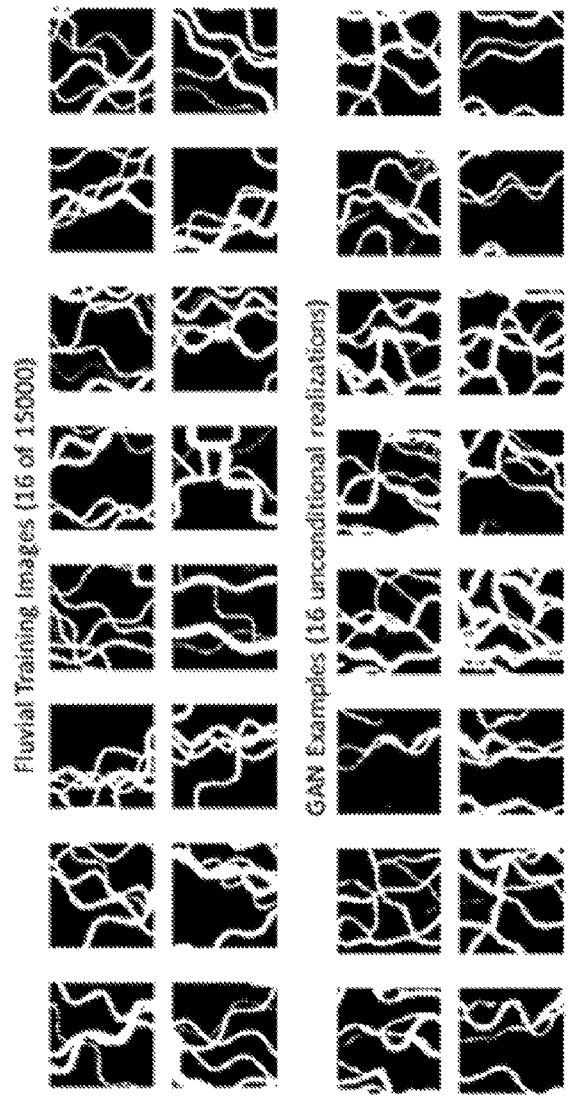
FIG. 25 illustrates fluvial training image examples (top) in 2D and unconditional samples or realizations generated by GANs (bottom)

In some implementations, GANs may be used to generate geological facies models by feeding neural networks with training images that are considered as digital representation of geological conceptual models. For example, 2D GANs may be used to generate unconditional fluvial samples or realizations. The fluvial training images may be created using OBM with varying channel widths and orientations. FIG. 25 shows 16 of 15,000 fluvial samples (top display) with binary facies (white: sand; black: background), and each has the size of e.g., 128×128. In some implementations, the sand proportion may be around 0.25 in all these training images. However, it will be appreciated that other proportions are possible. The generated sixteen unconditional fluvial models by GANs are shown below the training images. From FIG. 25, it will be observed that GANs are capable of generating very realistic fluvial samples that are indistinguishable from the training images used to train the network such as the reproduction of channel width, connectivity, and their orientation. While fluvial samples and facies models have been discussed, it will be appreciated that other samples (e.g., alluvial, lacustrine, delta plain, shallow marine, deep marine, etc.) and other attributes of a reservoir may be included in the one or more reservoir models generated by neural network driven reservoir modeling process 10. For example, other attributes of neural network driven reservoir modeling process 10 may generally include categorical attributed and continuous attributes. Continuous attributes may generally include porosity, fraction of course sand, etc.

Figure 26:
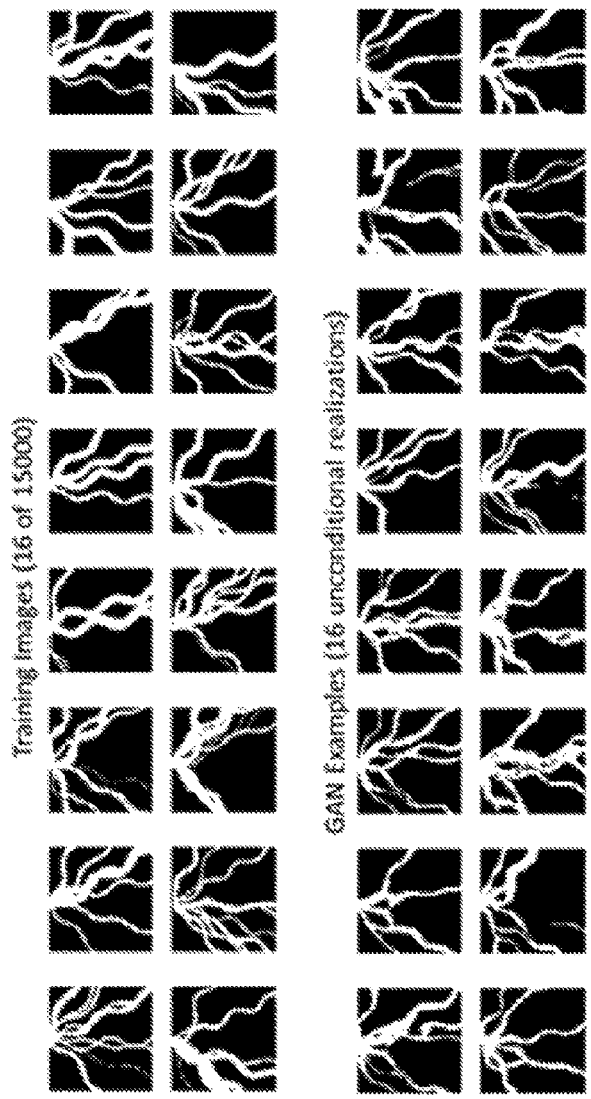
FIG. 26 illustrates deltaic training image examples (top) in 2D and unconditional samples generated by GANs (bottom)

In some implementations, neural network driven reservoir modeling process 10 may be utilized for a deltaic system that shows the distributary channels spread out from a point source at the middle of the top boundary of the studied area or reservoir. The variation of both the channel widths and orientations along the flow direction indicates strong heterogeneous and nonstationary characteristics of the deltaic depositional system, which is usually challenging to model by geostatistical simulation. However, GANs can reproduce this type of nonstationary channel patterns quite reasonably. For example, 16 of 15000 deltaic training images and sixteen unconditional samples generated by GANs are shown in FIG. 26 at the top and bottom of the figure respectively.

In some implementations and using a pre-trained G and D, neural network driven reservoir modeling process 10 can generate realistic images Xg=G(Z) conditioned on a set of known values y, which are defined either at pixel locations in 2D or voxel location in 3D. This can be achieved by fixing the weights of G and D and optimizing z to generate realistic samples based on the known values.

In some implementations, neural network drive reservoir modeling process 10 may determine 212 at least one of the perceptual loss and the contextual loss associated with one or more samples. For example, to generate realistic samples, it may be desirable for the samples Xg to be close to $P_{data}$, i.e. to generate samples such that the discriminator D assigns high probability to Xg. This idea is formalized through the perceptual loss. It may also be desirable for the samples to honor the pixel or voxel values y, i.e. the generated Xg to match y at the known pixel or voxel locations. This is formalized through the contextual loss. In some implementations, neural network driven reservoir modeling process 10 may constrain generated samples by GAN to honor well measurements (e.g., geological facies interpretation in well locations).

In some implementations determining 212 the contextual loss associated with the one or more samples is based upon, at least in part, one or more of semantic inpainting (as discussed above) and a distance transformation that measures mismatch between the one or more samples and the one or more physical conditions associated with the reservoir. For example and in some implementations, neural network driven reservoir modeling process 10 may lead to better data conditioning than the semantic inpainting approach by defining the contextual loss using a distance transformation that measures the mismatch between the generated samples by GANs and the conditioning data (e.g., facies observations in well locations). The total loss function is formulized as the sum of perceptual loss and the contextual loss:

Total loss: The total loss is defined as the weighted sum of the perceptual loss and contextual loss as shown below in Equation 7:

$$\ell_{total}(Z) = \ell_p(Z) + \lambda \ell_c(Z|I_1, I_2, \ldots, I_M) \quad (7)$$

where λ is a regulation factor that controls the tradeoff between generating realistic images and matching the known facies data.

Perceptual loss: The perceptual loss $\ell_p$ penalizes unrealistic images. Since D was trained to assign high probability to realistic samples, the perceptual loss is chosen as shown below in Equation 8:

$$\ell_p(z) = \log(1/D(G(z))) \quad (8)$$

Contextual loss: The contextual loss penalizes mismatch between generated samples and known pixels y. The contextual loss may be defined as shown below in Equation 9:

$$\ell_c(Z|I_1=i_1, I_2=i_2, \ldots, I_M=i_m) = \Sigma_{k=1}^K \Sigma_{d=1}^M \min \|i^{(k)}(G(Z)) i_d^{(k)}\|_1 \quad (9)$$

where K is the total number of the facies, and M is total number of the known facies locations on which to condition the samples generated by GANs.

In the contextual loss, $\{I_m|m=1, \ldots, M\}$ may be the collection of m-facies indicator variables with lower case $\{I_m|m=1, \ldots, M\}$ representing the respective observations; $i_d^{(k)}$ represents the observed k-facies indicator at the datum location d. The contextual loss is computed as the sum of all the mismatched facies in all well locations by searching for the shortest distance from the facies location at one individual well to its nearest corresponding facies in the sample generated by the generator G, which is represented as $i^{(k)}(G(Z))$ in the formula of the contextual loss.

In some implementations, neural network driven reservoir modeling process 10 may minimize 214 at least one of the perceptual loss and the contextual loss associated with the one or more samples. For example, all the data (e.g., physical conditions) may be honored once the contextual loss is approaching to zero. This may be achieved by applying gradient decent to the noise z-vector in the latent space through minimizing the total loss. The iteration process may be ceased if a small error threshold for the contextual loss is reached that results in one conditional sample generated by GANs.

For example, computing the contextual loss using a distance transformation based on facies indicators provides a smoother objective function and it leads to better and faster data conditioning than achieved with semantic inpainting. Additionally, a user-defined arbitrary mask and weighting factors surrounding the data measurements may be required by the sematic inpainting. This limitation is eliminated in the distance transformation. Moreover, the distance transformation using facies indicators may be more robust and universal since it is independent of the facies coding.

Figure 27:
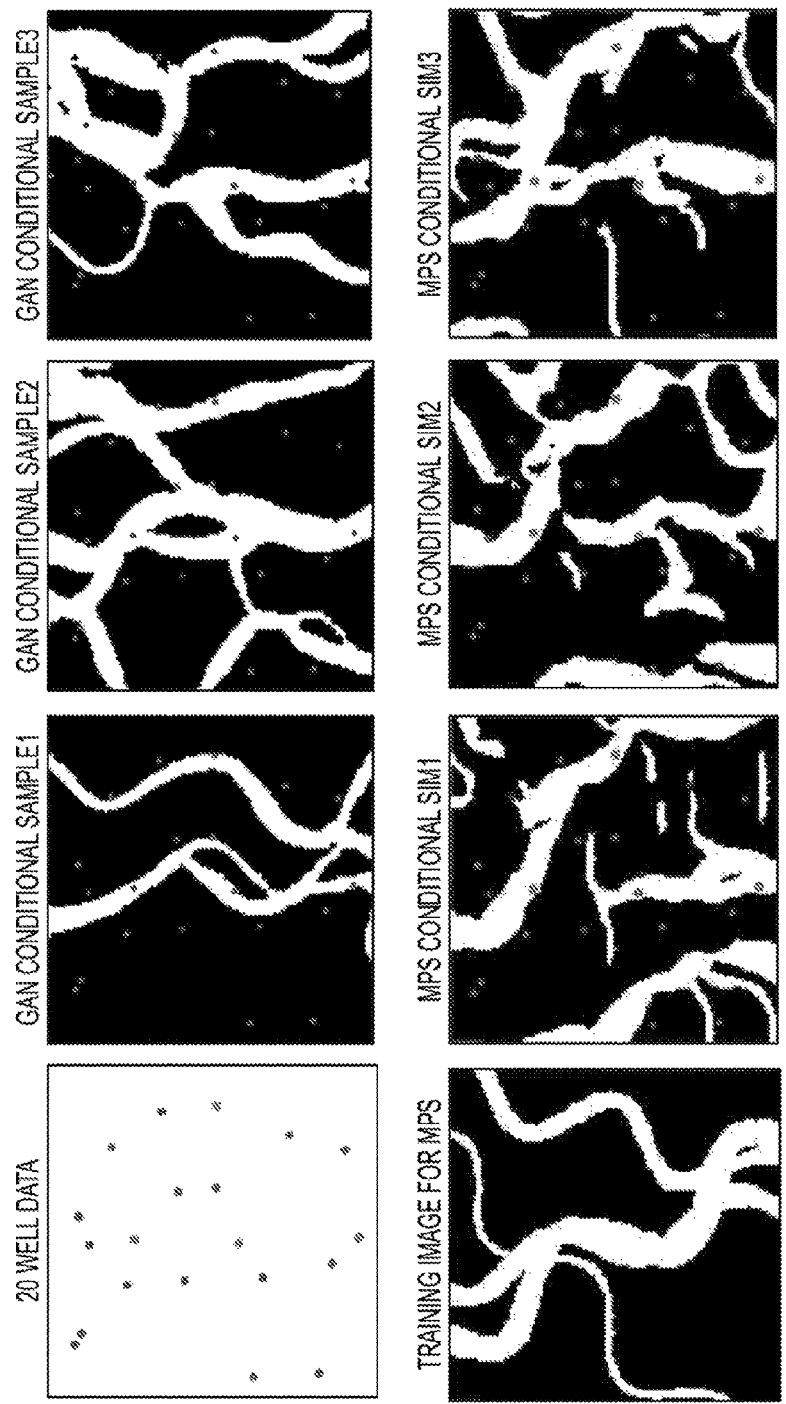
FIG. 27 depicts three conditional fluvial GAN examples honoring 20 well data (top) and three conditional MPS simulations constrained by the same 20 well data and using a single training image (bottom)

In some implementations, neural network driven reservoir modeling process 10 may generate one or more reservoir models (e.g., 2D conditional facies models) using conditional GANs described above. For example, and as shown in FIG. 25, neural network driven reservoir modeling process 10 may receive a plurality of training images. Referring also to FIG. 27, FIG. 27 shows e.g., 20 known well data locations (one shade of dots for sand and another shade of dots for shale background). In some implementations, e.g., three fluvial models honoring all the 20 well data using GANs may be generated by neural network driven reservoir modeling process 10. It may be observed that the channel geometry and connectivity are very similar to the training images used in FIG. 25. For comparison, multipoint statistics (MPS) may be used to generate facies models constrained by the same well data. The training image used for MPS is shown at the left corner of the figure that contains nonstationary channel patterns in terms of varying channel width and orientation. This is challenging for MPS modeling because MPS infers high-order statistics from a single training image that requires repetitive patterns for reliable statistical inference. The failure examples are shown at the bottom of the figure with apparent loss of the channel geometry and connectivity seen in the training image. Broken channels and poor reproduction of various channel widths are visible in the three conditional MPS simulations even though all of them are honoring the 20 well data.

The conditional deltaic facies modeling results by GANs and comparison with MPS simulation are shown in FIG. 28. In this example, 35 well data are used and the heterogeneity and nonstationarity of the facies deposits become more pronounced due to the large variation of the channel widths and orientations. This causes poor reproduction of the distributary channels in three conditional MPS simulations due to the difficulty for MPS to find enough repetitive patterns from the nonstationary deltaic training image, which is shown at the left corner of the figure. Consequently, the resulting MPS facies models do not ensemble channel distribution seen in the deltaic training image.

In contrast, conditional models by GANs give more realistic reproductions of the deltaic system in terms of the source point location, various channel widths and their orientation. All of them honor the 35 well data. This is a demonstration of a clear advantage of modeling facies using GANs over MPS for nonstationary geological depositional environments, which is ubiquitous in subsurface reservoirs.

In some implementations, neural network driven reservoir modeling process 10 may modeling facies in 3D. For example, the conditional GANs discussed above may be used to build geologically realistic facies architecture in 3D and the models are conditioned to well data. Unconditional simulations of a depositional fluvial system may be tested with three facies: channel sand, levee and shale background. In this example, e.g., 15,000 fluvial models may be generated in 3D using OBM with variation of channel width, thickness, amplitude, sinuosity, and orientation. The proportions of three facies in this example may be around 0.85 (shale), 0.10 (channel) and 0.05 (levee) respectively. The size of each training model may be 32×64×64 in z-, y-, and x-direction respectively.

Referring also to FIG. 29, FIG. 29 shows eight of e.g., 15,000 models used as training dataset to train GANs. FIG. 29 may depict e.g., three facies (e.g., channel, levee, and shale background). However, it will be appreciated that any number of facies may be defined in the training images. It may be observed that these training images exhibit complexity of the depositional facies architecture and their spatial associations. 3D GANs are trained using the 15,000 fluvial training images first and then unconditional facies models are generated using the pre-trained GANs. Eight unconditional models (realizations) are displayed at the bottom of FIG. 29. The results suggest that GANs can learn the facies architectures and patterns very well to perform prediction through mapping the 1D latent space to 3D facies models. The channel geometry (width, amplitude and sinuosity) and the spatial association among the three facies are correctly captured and reasonably reproduced in these examples.

Figure 30:
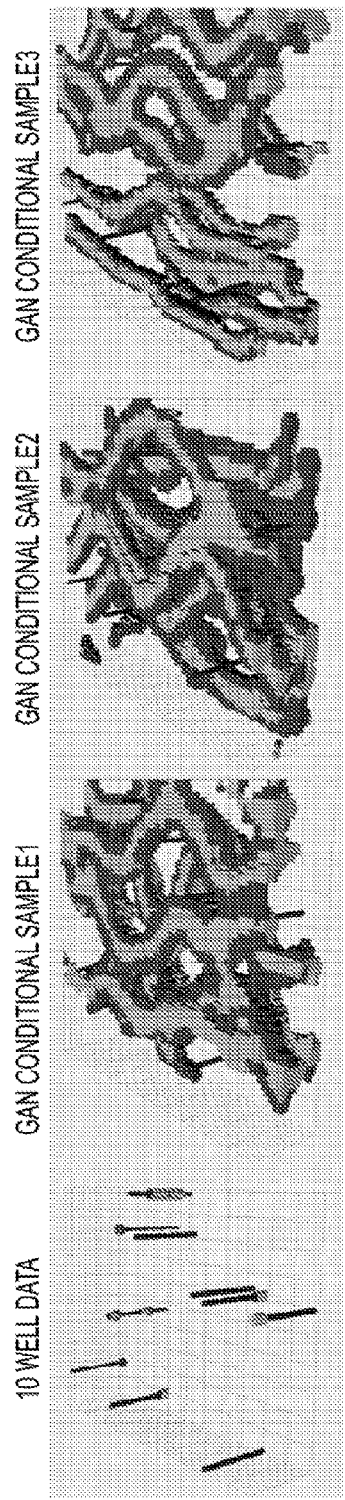
FIG. 30 illustrates conditional fluvial samples generated by GANs in 3D. Also shown is ten well data with the interpreted facies in the left-most display (shale; channel sand; and levee)

Continuing with this example, the pre-trained GANs may be used further to generate 3D fluvial facies models constrained by facies interpretations in well locations. For example, FIG. 30 shows e.g., 10 well locations with e.g., 3 interpreted facies (left-most) and three conditional facies models by GANs. It may be observed that the channel architectures, geometries, and facies associations are reasonably reproduced and all the samples (realizations) honor the well data.

A more complex carbonate example is tested to demonstrate the modeling capability of 3D GANs. In this example, 5,000 carbonate ramp training models may be generated in 3D with e.g., five transitional facies: tidal flats, lagoon, shoal, shallow marine and deep marine. FIG. 31 shows five of 5,000 training examples that exhibit clear lateral progradational and vertical aggredational facies associations. Note that the facies deposition progresses into deep marine with increasing aggradation angles in the training dataset. The size of each training model is 32×64×64 in z-, y-, and x-direction respectively.

At the bottom of FIG. 31, there are three unconditional models (realizations) generated by GANs. The clear transitional facies trend exhibited in the training examples from tidal flats to deep marine is well captured and reproduced in the models predicted by GANs. This type of strong nonstationary 3D facies patterns is proved to be challenging for geostatistical simulation approaches, yet it is critical to be reflected in geological reservoir models for optimal field development and decision-making.

The structure of 3D GANs is shown in the below table, which is similar to the deep convolutional GANs adapted and extended to 3D for conditional facies modeling. Each of the generator and the discriminator is a deep convolutional network. The nonlinearities in the discriminator may be LeakyReLU(0.2) except for the output layer which is a sigmoid. The nonlinearities in the generator are ReLU except for the output layer which is a hyperbolic tangent (e.g., tanh). In this example, the GANs were trained for 500 epochs with Adam with a learning rate of 1e-4, $\beta1=0.5$ and $\beta2=0.5$.

TABLE 1

| Discriminator | Generator |
| --- | --- |
| 16 Conv3D 2 × 4 × 4 filters, with stride 1 | Linear 200 × 32768 |
| LeakyReLU | Reshape 32768 vectors to 4 × 8 × 8 × 128 features |
| 32 Conv3D 2 × 4 × 4 filters, with stride 2 | BatchNormalization + ReLU |
| BatchNormalization + ReLU | 64 Conv3D Transpose 2 × 4 × 4 filters, with stride 2 |
| 64 Conv3D 2 × 4 × 4 filters, with stride 2 | BatchNormalization + ReLU |
| BatchNormalization + ReLU | 32 Conv3D Transpose 2 × 4 × 4 filters, with stride 2 |
| 128 Conv3D 2 × 4 × 4 filters, with stride 2 | BatchNormalization + ReLU |

TABLE 1-continued

| Discriminator | Generator |
| --- | --- |
| Reshape 4 × 8 × 8 × 128 features to 32768 vectors Linear 32768 × 1 | 16 Conv3D Transpose 2 × 4 × 4 filters, with stride 2 BatchNormalization + ReLU 1 Conv3D Transpose 2 × 4 × 4 filter, with stride 1 |

Figure 32:
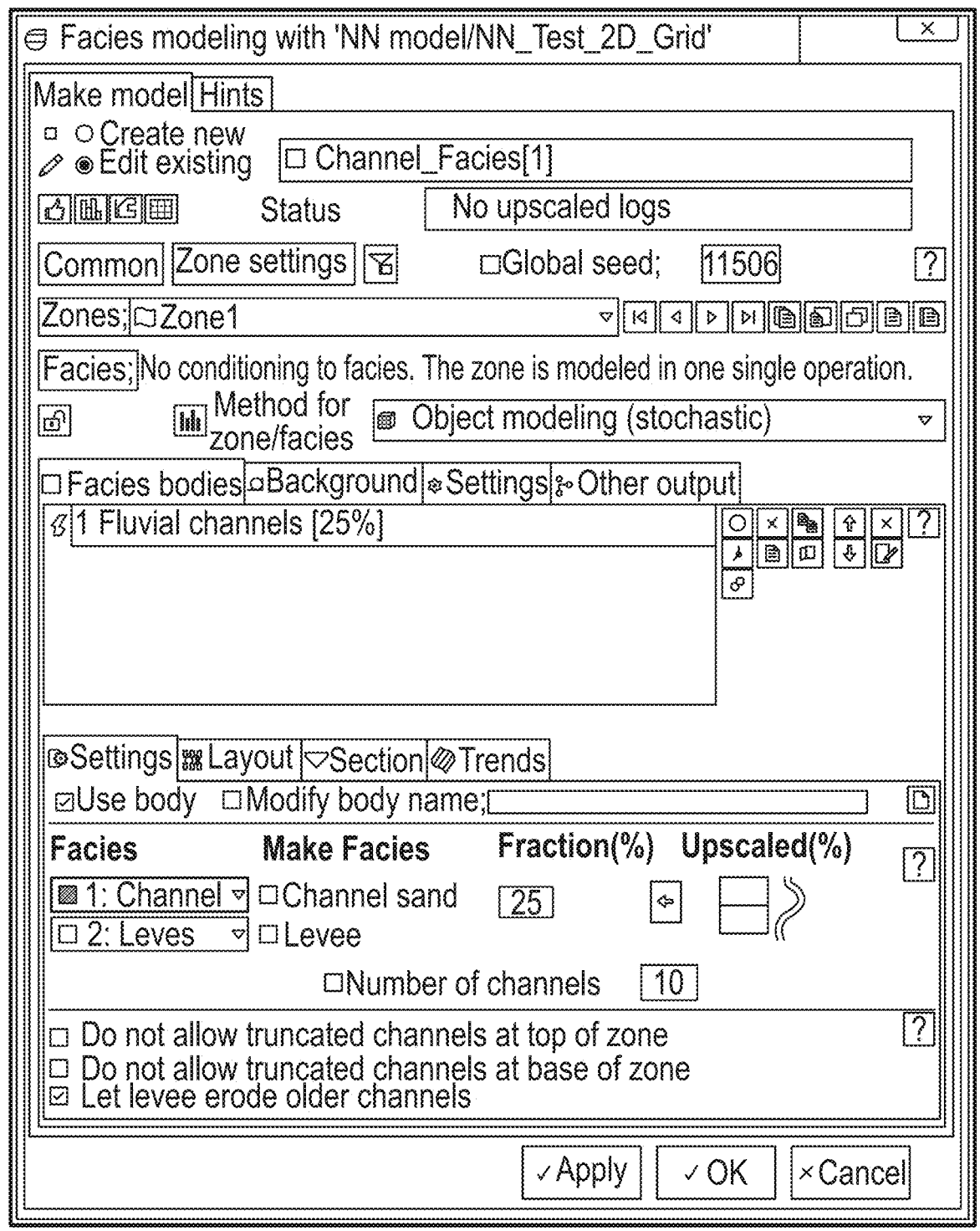
FIG. 32 illustrates an example OBM tool in accordance with embodiments of various techniques described herein.

In some implementations and when optimizing z vector in the latent space to honor the conditional data, neural network driven reservoir modeling process 10 may use the Adam stochastic optimization method with a learning rate of 1 e-2 and default $\beta$ parameters, $\lambda=1000$, and train for 1500 iterations. Referring also to FIG. 32, a user interface of an OBM is shown with one or more parameters used to generate training images.

In some implementations, neural network driven reservoir modeling process 10 may simulate 202 the one or more reservoir models. For example and in some implementations, neural network driven reservoir modeling process 10 may simulate 202 both a static geological model domain and a dynamic fluid production domain. For example, in the dynamic fluid production domain, one or more generated realizations (e.g., reservoir models) may be immediately (e.g., almost instantaneously) simulated 202 using either existing reservoir simulator tools or a rapid proxy. In some implementations, neural network driven reservoir modeling process 10 may fix the observation at a single point in time (e.g., cumulative oil production (known as FOPT—Field Oil Production Total)) and may rapidly simulate a conditional sample against a known outcome (this proxy then can replace the optimal grid) for purposes of forecast optimization. Thus neural network driven reservoir modeling process 10 may extend the utility of the GAN realization ensemble to "flow" the model and determine a forecast for production, saturation, and/or pressure.

In some implementations, the one or more reservoir models may be simulated 202 by a reservoir simulator. A reservoir simulator may model the dynamic properties to bridge the gap between generating a reservoir model (as discussed above) and conditioning the model to observed production data for monitoring and control. Examples of reservoir simulators may generally include reservoir simulators based on finite difference such as ECLIPSE and INTERSECT (IX). As will be discussed in greater detail below, a Segmented Reservoir Model Simulator (SRMS) may be configured to simulate 202 the one or more reservoir models. SRMS is a new approach to reservoir simulation based on a graphical model. In some implementations, SRMS may simulate the one or more reservoir models more quickly than other conventional reservoir simulators.

An overview of simulating 202 the one or more reservoir models via neural network driven reservoir modeling process 10 via SRMS is provided below:
1 SRMS Summary Referring also to FIG. 42, a Segmented Reservoir Model Simulator (SRMS) may be configured to simulate 202 the one or more reservoir models. SRMS may be an analytical oilfield simulator for water flooding projects with a set of injectors and producers. SRMS supports multiple reservoirs with potentially co-mingled injection and production.

Referring also to FIG. 48 and in some implementations and as will be discussed in greater detail below, neural network driven reservoir modeling process 10 may define 4802, at a computing device, one or more injector completions and one or more producer completions in one or more reservoir models. One or more edges between the one or more injector completions and the one or more producer completions in the one or more reservoir models may be defined 4804. The one or more edges between the one or more injector completions and the one or more producer completions may define a graph network representative of the one or more reservoir models. The one or more reservoir models may be simulated 4806 along the one or more edges between the one or more injector completions and the one or more producer completions. In some implementations, an injector may generally include a "source" of fluid and a producer may generally include a "sink" of fluid in a reservoir. The completions in each reservoir may generally include an assembly of downhole tubulars and equipment required to enable safe and efficient production from an oil or gas well and are modelled as vertices in a graphical network, and the communication pathway between each injector and producer is modelled as an edge of the graphical network. Each edge may be a model of part of the reservoir and represents the average reservoir properties affecting the hydraulic relationship between the associated injector-producer pair. The local portion of the reservoir represented by an edge may be termed the "segment".

Representing the oilfield as a graphical network of wells allows three-dimensional (3D) dynamic properties affecting production forecasting and history matching to be modelled. However, because the fluid dynamics of each segment are represented by graphical edges, the behavior along each edge can be modelled with a one-dimensional (1D) simulator. The effective 3D behavior emerges from the aggregation of the 1D behaviors into the 3D graph.

As an illustration of applying 1D simulation on each edge, and aggregating to the entire 3D graphical network of wells, the Buckley-Leverett solution may extended and applied to 1D fluid displacement. In some implementations, simulating 4806 the behavior of the one or more reservoir models along the one or more edges between the one or more injector completions and the one or more producer completions may include receiving 4808 one or more injector rates associated with the one or more injector completions and determining 4810 one or more of oil production rates and water production rates for the one or more producer completions based upon, at least in part, simulating the one or more injector rates associated with the one or more injector completions. For example and as will be discussed in greater detail below, this graphical network representation simultaneously solves the Buckley-Leverett solutions for every edge in the network and, therefore, provides a forecast of oil and water production for all producers given injection rates and basic reservoir properties.

In some implementations, simulating 4806 the one or more reservoir models along the one or more edges between the one or more injector completions and the one or more producer completions may include receiving 4812 one or more of oil production rates and water production rates associated with the one or more producer completions and determining 4814 one or more water injection rates for the one or more injector completions based upon, at least in part, simulating one or more of the oil production rates and the water production rates associated with the one or more producer completions. For example, if oil and water production rates are known, then the water injection rates can be solved accordingly. Furthermore, if injection and production rates are known, then some basic reservoir properties can also be inferred, i.e., history matching.

2 Network of Wells

In some implementations, an oilfield may be represented as a network of wells with injectors being in communication with producers. Each reservoir unit (in any particular field) is treated as hydraulically isolated, but with potentially communication through real or virtual wells. The completions in each reservoir unit are modelled as vertices in a graphical network, and the communication pathway between them is modelled as an edge of a graphical network. Any segment between two completions in a well is also modelled as an edge.

In some implementations, neural network driven reservoir modeling process 10 may aggregate 4816 a plurality of edges between a plurality of injector completions and a plurality of producer completions to define a three-dimensional graph network representative of the reservoir model. For example, representing the oilfield as a graphical network of wells may allow three-dimensional (3D) dynamic properties affecting production forecasting and history matching to be modelled. However, because the fluid dynamics of each segment are represented by graphical edges, the behavior along such edges can, therefore, be modelled with a one-dimensional (1D) simulator. The effective 3D behavior emerges from the aggregation of 1D behaviors of each edge in the 3D graph.

In some implementations, wells are modelled as a communicating network. In some implementations, neural network driven reservoir modeling process 10 may define 4818 one or more injector-producer pairs based upon, at least in part, spatial proximity between the one or more injector completions and the one or more producer completions. Injectors and producers communicate with each other via their completions in common reservoirs. Thus, for each injector completion in a reservoir, all "neighboring" producer completions in the same reservoir are identified. The hydraulic communication between each of these injector-producer completion pairs is then modelled with a 1D simulator such as Buckley-Leverett.

There may be several ways to define and identify injector-producer neighbors. The simplest approach in the absence of historical production data or geological modelling (e.g., fault barriers, high permeability fracture networks) is to identify the nearest neighbors in a spatial sense using an approach such as Voronoi tessellation. Another approach is to examine the historical production to discover which wells are communicating. A hybrid approach is also possible which utilizes Bayesian likelihoods favoring spatial association in the absence of historical data, but augments these association likelihoods with historical data.

Figure 33A:
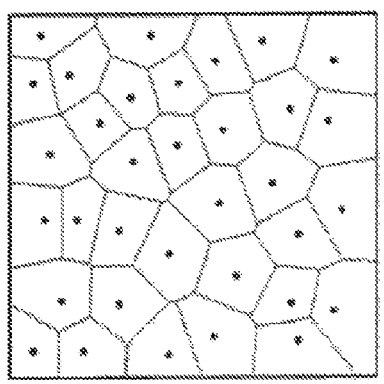
FIGS. 33A-D illustrates a map view of single reservoir illustrating process of Voronoi tessellation into well regions, followed by identification of neighboring injector producer pairs and creation of graphical network with directed edges from injectors to producers in accordance with embodiments of various techniques described herein.
Figure 33B:
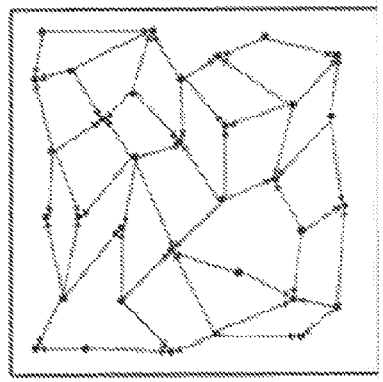

As a simple illustration of the concept, a Voronoi tessellation may be used by neural network driven reservoir modeling process 10 to partition the reservoir. For example, FIGS. 33A-D schematically illustrates a single reservoir in map view. FIG. 33A shows the basic injector and producer completions in the reservoir. FIG. 33B illustrates the results of a Voronoi tessellation in which each cell represents the domain of the contained completion.

Figure 33C:
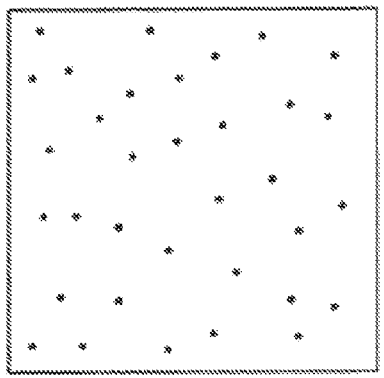
Figure 33D:
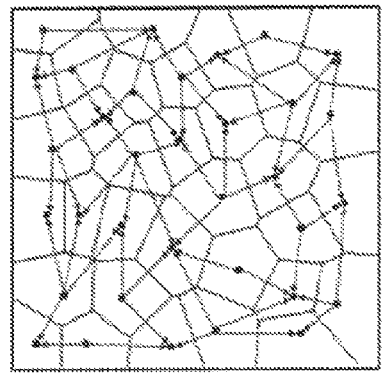

In this approach, adjacent cells that contain different well types (an injector or producer) are considered to be in "hydraulic communication". FIG. 33C illustrates directed "edges" between specified injector-producer pairs (those in "hydraulic communication" overlain on the Voronoi cells. Finally, FIG. 33D shows the same map but with the Voronoi cells removed and now shows the network of wells as a graph, with completions as vertices and injector-producer connections as 'directed edges' (indicated by arrows).

Figure 34A:
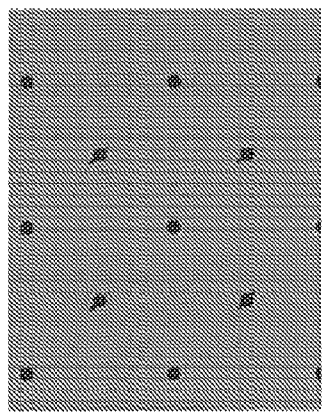
FIGS. 34A-D illustrates a map view illustrating segmentation of reservoir into simulation cells for standard five-spot pattern in accordance with embodiments of various techniques described herein.
Figure 34B:
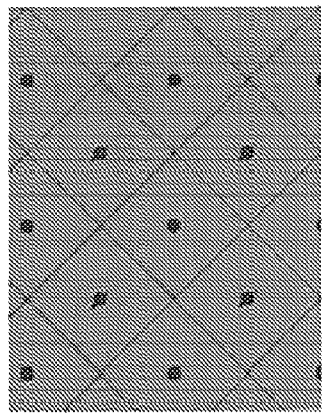
Figure 34C:
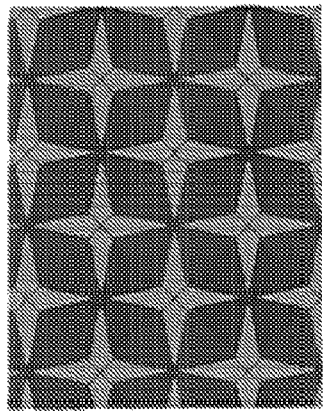
Figure 34D:
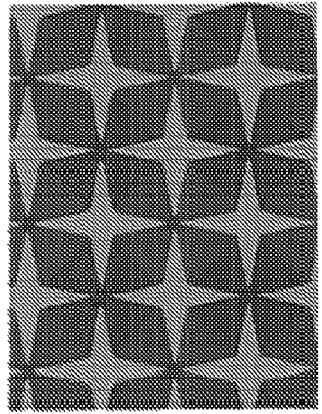

FIGS. 34A-D develops the idea further with an example from a standard five-spot pattern. This example also illustrates the application of a 1D Buckley-Leverett model to the problem. In FIG. 34A the wells are uniformly distributed. In FIG. 34B Voronoi tessellation identifies the spatial domain of each well. In FIG. 34C the connections between the neighboring injector producer pairs is illustrated, with the Voronoi cells removed in FIG. 34D. FIG. 34C and FIG. 34D also illustrate schematically the individual Buckley-Leverett models between each injector-producer pair. A few items worth noting is the modelled "diamond" (rather than box) shape of the Buckley-Leverett volume. Another item to note is that the Buckley Leverett volume does not take up the entire cell as "sweep efficiency" is not 100%. Finally, the advancing water shock front is schematically illustrated for each pair.

Figure 35B:
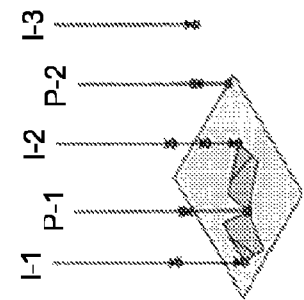
FIGS. 35A-D illustrates three injectors and two producers drilled into three stacked reservoirs in accordance with embodiments of various techniques described herein. The three reservoirs and the five wells exhibit three distinct, but hydraulically connected, graph networks.
Figure 35A:
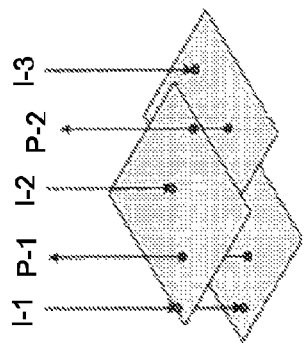
Figure 35D:
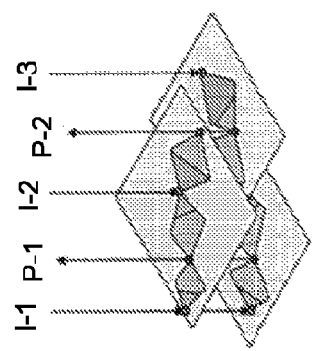
Figure 35C:
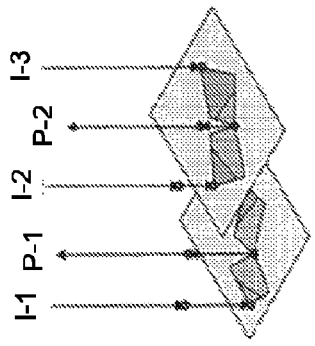

In some implementations, each reservoir may be modelled or simulated as an hydraulically isolated volume. However, wells may penetrate multiple reservoirs and have co-mingled production. This can be modelled by treating each reservoir as a sub-network, which is then aggregated together to comprise the entire graphical network and is illustrated, conceptually, in FIGS. 35A-D. FIG. 35A illustrates three injectors and two producers drilled into three stacked reservoirs, shown in a 3D perspective. FIG. 35B "strips away" the top two reservoirs showing that two injectors (I-1 and I-2), and one producer (P-1) are completed in the deepest reservoir and are communicating. FIG. 35C shows the second shallowest reservoir completed by two injectors (I-2 and I-3) and one producer (P-2) and in communication in this reservoir. Finally, FIG. 35D shows the shallowest reservoir with two injectors (I-2 and I-2) and two producers (P-1 and P-2). Thus, with the three reservoirs and five wells, three distinct but hydraulically connected graph networks are created. To solve the 3D fluid dynamics, the 1D simulation equations (e.g., Buckley-Leverett) involves knowing the injected water volume for a given injector-producer completion pair. However, in this network approach each well may be communicating with many other wells across multiple reservoirs. Thus, for given well injection and production rates, it must be discovered how the production is allocated to each injector-producer completion pair.

3 The Reservoir as a Graph

In conventional numerical reservoir simulation, the reservoir is modelled as a 3D grid of finite difference cells. Generally, the size of each cell is made small enough to capture the heterogeneity of the static and dynamic properties of the reservoir. However, the smaller the cell, the greater the number of required cells to represent the oilfield, and this is constrained by the available computational resources. Modem simulators allow local grid refinement where a finer cell size is possible in areas of high gradients in pressure such as near a well.

Rather than a finite difference grid cell being considered the atomic unit of simulation, one approach taken with neural network driven reservoir modeling process 10 (e.g., via SRMS) is to treat the connection (relationship) between an injector and a producer as the atomic unit. In this manner, the edges defined between the injectors and producers may define a graph network representative of the reservoir model. In a reservoir with one injector and one producer there is a single relationship, while in a single five-spot pattern with one injector and four producers there are four relationships. However, as the number of injectors ($N_i$) and producers ($N_p$) grows the number of possible relationships ($N_r$) grows, as shown below in Equation (10).

$$N_r = N_i N_p \quad (10)$$

In a large mature field $N_i$ and $N_p$ could each be 100. This results in $N_r$ potentially being of the order 10,000 or greater. However, in reality an injector will only be communicating with a small number of producers. Thus, if each injector communicates with five producers, then $N_r$ will be of order 500. If the problem is represented as an adjacency matrix, the result is a very sparse matrix with 95% of the elements being 0, or undefined. However, if the problem is treated as a graphical network with the wells represented as vertices, then each connection is represented as a directed edge in the graph. Further, a graph representation presents the wide array of graph theoretical tools available to model this "social network of wells".

Edges as Volumes

As noted previously, using formal terminology from graph theory, the connection between an injector and a producer is termed an "edge". In some implementations, neural network driven reservoir modeling process 10 may define 4820 one or more directed edges between the one or more injector completions and the one or more producer completions in the one or more reservoir models based upon, at least in part, the one or more injector-producer pairs. For example, because fluid is flowing from an injector to a producer, each of these edges is termed a "directed edge". In this section, it will be described how the local static and dynamic reservoir properties are represented on such edges. Consider a volume of interest (between an injector and a producer), this may be defined as follows:

$$V_\phi = A \times L \times \phi \times E_v \quad (11)$$

where the units of "A×L" are $[L]^3$, $\phi$ is porosity, A is area, L is length and $E_v$ is vertical sweep efficiency (essentially a tuning parameter to match data). It may be assumed that any edge of length L may represent a volume, thus:

$$\tilde{V}_\phi|_{E(v)} \leftarrow V_\phi \quad (12)$$

where $E_v$ represents a specific graphical edge. The nature of $E_v$ is discussed in Section 4 (and defined in later in Table 2).

Equation 12 demonstrates an important, and potentially useful property of graph theory; namely that a volume (with dimensions of $[L]^3$) may be represented as an edge (with units). Taking this concept further, edges may take on any property of any dimensionality as may be needed.

4 Utilizing the Graph to Allocate Rates

Figure 36:
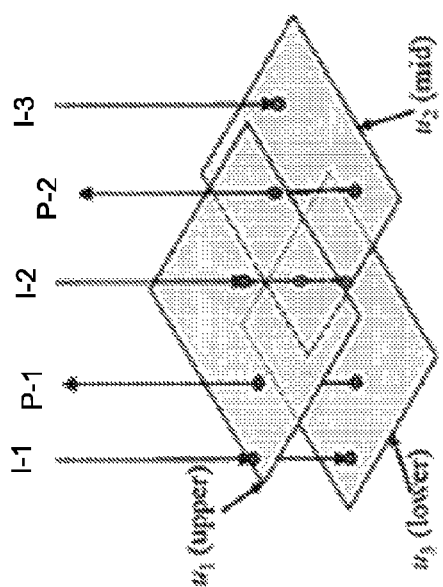
FIG. 36 illustrates producer-injector completion connections in accordance with embodiments of various techniques described herein. The check mark denotes such pairing, which can only exist in the same reservoir unit u. Note that the image is almost identical to FIG. 36(a). The figure has two production wells, P-1 and P-2 such that $P \in \{p_1, p_2\}$ and three injectors, I-1, I-2, I-3, such that I∈{$i_1, i_2, i_3$}. Colored dots denote completions (blue for injector and green for producer). The staggered-stacked "units" are also shown and denoted as U∈{$u_1, u_2, u_3$}.
Figure 37:
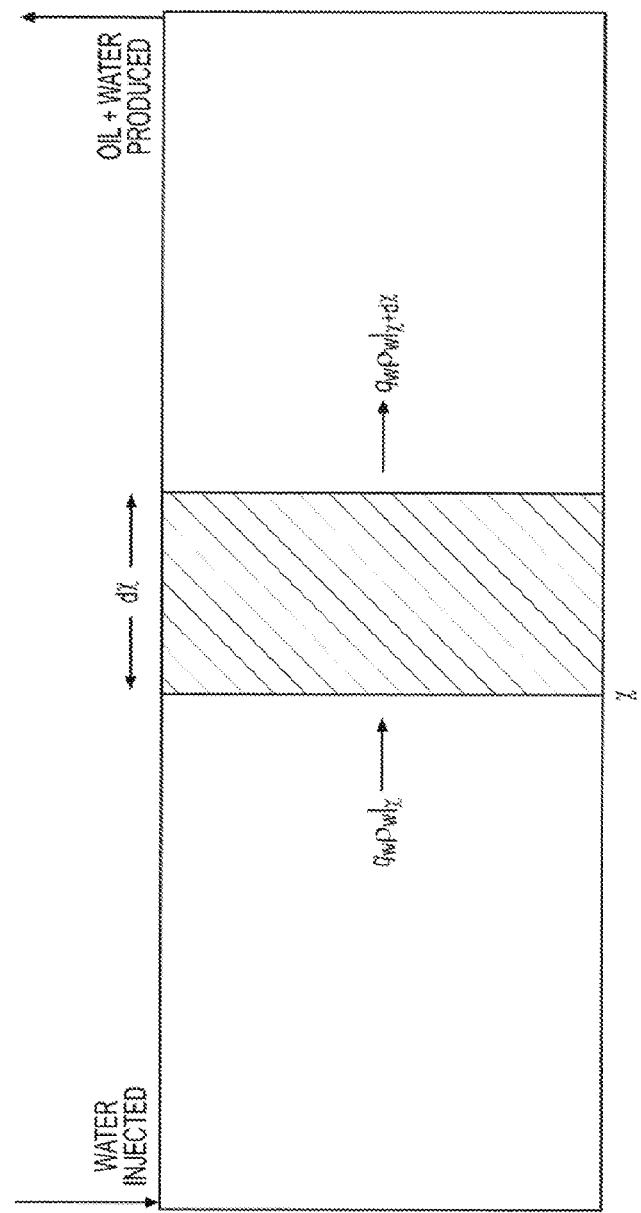
FIG. 37 illustrates the mass flow of water (in a linear element) from a water injector to a producer in accordance with embodiments of various techniques described herein. The linear element itself has a cross-sectional area, denoted by A, a thickness dx with a porosity of ϕ. The volume of the advancing element must be Aϕdx.

Consider the sketch on the left-hand side of FIG. 36. This shows two production wells: P-1, P-2 and three injector wells: I-1, I-2, I-3. All wells are completed in any reservoir units that they may encounter. Injector I-2 is completed in all three reservoir units (the two hidden completions are also shown). If each reservoir unit is denoted as $u_1$ (upper), $u_2$ (mid) and $u_3$ (lower), table of producer-injector connected completions may be constructed as shown on the right-hand side of FIG. 36. Each check mark may denote such pairing, which can only exist in the same reservoir unit u. The figure has two production wells, P-1 and P-2 such that $P \in \{p_1, p_2\}$ and three injectors, I-1, 1-2, 1-3, such that $I \in \{i_1, i_2, i_3\}$. Colored dots denote completions (blue for injector and green for producer). The staggered-stacked "units" are also shown and denoted as $U \in \{u_1, u_2, u_3\}$.

4.1 Tabulating All Members

Inspection of FIG. 36, and the corresponding producer injector connections reveals the degree of interaction between producer, injector and its reservoir unit (the completion). To define allocation a comprehensive table of all possible relationships associated with the asset needs to be constructed. Using FIG. 36 as an exemplar, the following general actions may be used to construct this relationship "map":

1. Determine all 'elements' that will eventually be represented by graphical edges, for this example these are:
   Injectors, $I=\{1, \ldots N_i\}$ where the total number of injectors $N_i=3$,
   Producers, $P=\{1, \ldots, N_p\}$ where the total number of producers is $N_p=3$, and
   Reservoir units, $U=\{1, \ldots, N_u\}$ where the number of units, $N_u=3$.
2. Tabulate every possible permutation of wells and units, as shown in Table 2.
3. Index each table entry, m, be they valid or not valid.
4. Define whether each entry may form a valid edge, $\varepsilon \neq 0$, or not, using Eq. (13):

$$\varepsilon = \begin{cases} 1 : \text{valid} \\ 0 : \text{invalid} \end{cases}$$

5. List all valid edges: $E(\forall_i, \forall_p, \forall_u) \equiv E(V)$, see Table 2 below.

4.2 Final Edge & Validation Table

The completed form of Table 2 with columns for fluxes along each graphical edge is then:

4.3 Edge Indexing Summary

In this example, Table 2 is used as the principal reference for all rate allocation analysis. The key column to note is the valid edge index where valid edges are denoted by E(i,p,u). Any specific individual injector is denoted as i=i. Similarly, any single producer is p=p and a single reservoir unit is u=u. Table 3 (as shown below) summarizes a few indexing permutations (is incomplete).

4.4 Example Rate Calculations

In some implementations, wo important notations may be utilized:

- $(q_{oil})_T$ or $(q_{inj})_T$ represents the sum of production (or injection) for two or more edges denoted by $E(\forall_i, p, \forall_u)$ or $E(i, \forall_p, \forall_u)$ or $E(\forall_i, \forall_p, u)$. Note that whenever these are presented on the left-hand-side of an expression there is a summation involved.

- $(q_{oil})$ or $(q_{inj})$ represents a single production rate or injection rate, respectively for an edge denoted by E(i, p, u). Note that whenever these are presented on the left-hand-side of an expression there is no summation involved. These are, however, used within a summation.

TABLE 2

All possible combinations of $N_i$ = 3 injectors (set I), $N_p$ = 2 producers (set P) and $N_u$ = reservoir some of units (set U). M comprises Nm = ($N_i \times N_p \times N_u$) = 18 members, only some of which are valid, i.e., when $\varepsilon$ = 1 thus $N_\varepsilon$ = 8. Eq. (11) defines $\varepsilon$ which, in turn, described edge metric E (i, p, u).

| Set All Edges m | Set Injectors $N_i$ = 3 i | Set P Producers $N_p$ = 2 p | Set U Units $N_u$ = 3 u | Set Is Edge Valid? $\varepsilon$ = 1 or 0 | Valid Edge Index E (i, p, u) | Set V of Valid Edges v |
|---|---|---|---|---|---|---|
| 1 | 1 | 1 | 1 | 1 | [1,1,1] | 1 |
| 2 | 1 | 1 | 2 | 0 | N/A | |
| 3 | 1 | 1 | 3 | 1 | [1,1,3] | 3 |
| 4 | 1 | 2 | 1 | 1 | [1,2,1] | 4 |
| 5 | 1 | 2 | 2 | 0 | N/A | |
| 6 | 1 | 2 | 3 | 0 | N/A | |
| 7 | 2 | 1 | 1 | 1 | [2,1,1] | 7 |
| 8 | 2 | 1 | 2 | 0 | N/A | |
| 9 | 2 | 1 | 3 | 1 | [2,1,3] | 9 |
| 10 | 2 | 2 | 1 | 1 | [2,2,1] | 10 |
| 11 | 2 | 2 | 2 | 1 | [2,2,2] | 11 |
| 12 | 2 | 2 | 3 | 0 | N/A | |
| 13 | 3 | 1 | 1 | 0 | N/A | |
| 14 | 3 | 1 | 2 | 0 | N/A | |
| 15 | 3 | 1 | 3 | 0 | N/A | |
| 16 | 3 | 2 | 1 | 0 | N/A | |
| 17 | 3 | 2 | 2 | 1 | [3,2,2] | 17 |
| 18 | 3 | 2 | 3 | 0 | N/A | |

Note:
that bold font symbols generally indicates a summation over two, or more, edges and that normal font symbols generally denote an edge-specific parameter.

TABLE 3

Summary of valid edge indexing nomenclature.

| Example Well-Unit Combination | | | Edge Index |
|---|---|---|---|
| Injector, i | Producer, p | Unit, u | E(i, p, u) |
| i = {i} | p = {p} | u = {u} | E(i, p, u) |
| i = {1, 3} | p = {p} | u = {u} | E({1, 3}, p, u) |
| i = {i} | p = {p} | u = {3} | E(i, $\forall_p$, u) |
| i = {i} | p = {p} | u = {1, 2, 3} | E(i, p, $\forall_u$) |
| i = {1, 2, 3} | p = {p} | u = {1, 2, 3} | E($\forall_i$, p, $\forall_u$) |
| i = {1, 3} | p = {1, 2} | u = {u} | E({1, 3}, $\forall_p$, u) | i: Any single injection well (i.e., i = {2} ≡ i).
$\forall_i$: All injection wells.
p: Any single production well (i.e., p = {1} ≡ p).
$\forall_p$: All producers.
u: Any single reservoir unit (i.e., u = {3} ≡ u).
$\forall_u$: All reservoir units.

Example: Total Production

In some implementations, neural network driven reservoir modeling process 10 may determine 4822 total oil production for the one or more reservoir models based upon, at least in part, determining oil production for each directed edge that terminates at the one or more producer completions in the one or more reservoir models. For example, the total oil produced, $(q_{oil})_T$, is the sum of all valid edges (i.e., $\varepsilon \neq 0$) that terminate at each producer over all reservoir units, $\forall_u$, thus $E(\forall_i, \forall_p, \forall_u)$ hence, $$[(q_{oil})_T]_{E(\forall_i,\forall_p,\forall_u)} = \Sigma_{\forall_i} \Sigma_{\forall_p} \Sigma_{\forall_u} (q_{oil})_{E(i,p,u)}|_{[\varepsilon(i,p,u) \neq 0]} \quad (14)$$

The RHS of Eq. (14) simply sums over all entries in Table 2 (i.e., m∈M) but with only valid edges being used, i.e., conditional on $\varepsilon \neq 0$. A more condensed form of Eq. (14) is to express indexes in terms of v∈V, thus:

$$[(q_{oil})_T]_{E(\forall_i,\forall_p,\forall_u)} = \Sigma_{\forall_v} (q_{oil})_v \quad (15)$$

However, for purposes of clarity this condensed form is not used here, rather explicit edge-specific notation, per column 6 of Table 2 is used.

Example: Total Injection

The total volume of water injected $((q_{inj})_T)$ is the sum of all valid edges (i.e., $\varepsilon \neq 0$) that originate at every injector over all reservoir units, $\forall_u$, thus $E(\forall_i, \forall_p, \forall_u)$ hence, $$[(q_{inj})_T]_{E(\forall_i,\forall_p,\forall_u)} = \Sigma_{\forall_i} \Sigma_{\forall_p} \Sigma_{\forall_u} (q_{inj})_{E(i,p,u)}|_{[\varepsilon(i,p,u) \neq 0]} \quad (16)$$

Once again the summation covers all valid instances of injectors, producers and units, as shown in Table 2.

Example: Total Oil Produced from Units 1 and 2

Using Table 2 all producers $\forall_p$ connected to units, u={1, 2}, becomes:

$$[(q_{oil})_T]_{E(\forall_i,\forall_p,\{1,2\})} = \Sigma_{\forall_i} \Sigma_{\forall_p} \Sigma_{\forall_u=\{1,2\}} (q_{oil})_{E(i,p,u)}|_{[\varepsilon(i,p,u) \neq 0]} \quad (17)$$

Example: Total Injection into I-1 and I-3

Using Table 2, injectors i={1, 3}, over all units $\forall_u$ thus:

$$[(q_{inj})_T]_{E(\{1,3\},\forall_p,\forall_u)} = \Sigma_{i=3} \Sigma_{\forall_p} \Sigma_{\forall_u} (q_{inj})_{E(i,p,u)}|_{[\varepsilon(i,p,u) \neq 0]} \quad (18)$$

Example: Total Injection into I-1 and Unit #1

Using Table 2:

$$[(q_{inj})_T]_{E(\{1\},\forall_p,\{1\})} = \Sigma_{\forall_p} (q_{inj})_{E(1,p,1)}|_{[\varepsilon(1,p,1) \neq 0]} \quad (19)$$

Example: Injection Along a Specific Edge: E(i=1, p=2, u=3)

Let E(i={1}), p={2}), u={3}) and using Table 2:

$$[(q_{inj})_T]_{E(\{1\},\{2\},\{3\})} = \Sigma_{\forall_p} (q_{inj})_{E(1,2,3)}|_{[\varepsilon(1,2,3) \neq 0]} \quad (20)$$

In this case $(q_{inj})_T = 0$ because from Table 2 it is observed that $\varepsilon(1,2, 3)=0$ thus the condition of validity is false.

Example: Injection Along a Specific Edge: E(i=3, p=2, u=2)

Let E(i={3}), p={2}), u={2}) and using Table 2 yields:

$$[(q_{inj})_T]_{E(\{3\},\{2\},\{2\})} = \Sigma_{\forall_p} (q_{inj})_{E(3,2,2)}|_{[\varepsilon(3,2,2) \neq 0]} \quad (21)$$

In this case E(3, 2, 2)≠0 because, from Table 2, it may be observed that E(3, 2, 2)=1, the condition of validity is true.

4.5 Generalized Production

Let p=p (i.e., and single producer) then the set of possible edges will be: E(i,p,u). Based on Table 2 the general expression for a single producer is:

$$[(q_{oil})_T]_{E(\forall_i,p,\forall_u)} = \begin{cases} \Sigma_{\forall_i} \Sigma_{\forall_u} (q_{liq})_{E(i,p,u)}|_{[\varepsilon(i,p,u) \neq 0]} & \text{if } t < t_{bt} \\ \Sigma_{\forall_i} \Sigma_{\forall_u} [(1-f_w) q_{liq}]_{E(i,p,u)}|_{[\varepsilon(i,p,u) \neq 0]} & \text{if } t \geq t_{bt} \end{cases} \quad (22)$$

In this instance, total production may be denoted as $(q_{oil})_T$ because it may be desirable to sum over all associated reservoir units and injectors.

For a specific edge i=i, p=p, u=u, the edge index becomes E(i, p, u). As this represents the finest granularity of analysis, neural network driven reservoir modeling process 10 may not be summing any quantities, hence oil rate is presented by $q_{oil}$:

$$[(q_{oil})_T]_{E(i,p,u)} = \begin{cases} (q_{liq})_{E(i,p,u)}|_{[\varepsilon(i,p,u) \neq 0]} & \text{if } t < t_{bt} \\ [(1-f_w) q_{liq}]_{E(i,p,u)}|_{[\varepsilon(i,p,u) \neq 0]} & \text{if } t \geq t_{bt} \end{cases} \quad (23)$$

4.6 Generalized Injection

Let i=i then a set of possible edges will be: E(i, p, u). As injection rate is not subject to breakthrough at the well (a calculation necessary for producers), using Table 2 the general expression is simply:

$$[(q_{inj})_T]_{E(i,\forall_p,\forall_u)} = \Sigma_{\forall_p} \Sigma_{\forall_u} (q_{inj})_{E(i,p,u)}|_{[\varepsilon(i,p,u) \neq 0]} \quad (24)$$

In this instance, total injection may be denoted as $(q_{inj})_T$ because it may desirable to sum over all associated reservoir units and producers.

4.7 Considering Pressure with Darcy's Law

In some implementations, simulating 4806 the one or more reservoir models along the one or more edges between the one or more injector completions and the one or more producer completions may include receiving 4812 one or more of oil production rates and water production rates associated with the one or more producer completions and determining 4814 one or more water injection rates for the one or more injector completions based upon, at least in part, simulating one or more of the oil production rates and the water production rates associated with the one or more producer completions. For example, the total injection rate into injection well i is the sum of the total flow rate along each edge originating from it, thus:

$$[(q_{inj})_T]_{E(i,\forall_p,\forall_u)} = \Sigma_{\forall_p} \Sigma_{\forall_u} (q_{inj})_{E(i,p,u)}|_{[\varepsilon(i,p,u) \neq 0]} \quad (25)$$

Symmetrically, and prior to water breakthrough, total production rate for a specific producer is given by the sum of the flowrates along each edge terminating at that producer, viz:

$$[(q_{oil})_T]_{E(i,\forall_i,\forall_u)} = \Sigma_{\forall_i} \Sigma_{\forall_u} (q_{oil})_{E(i,p,u)}|_{[\varepsilon(i,p,u)\neq 0]} \quad (26)$$

The injection rate along any single valid edge can be modelled as single phase with Darcy's law (Hubbert[6], 1957), thus:

$$(q_{inj})_{E(i,p,u)} = \qquad (27)$$
$$\left.\frac{k|_{E(i,p,u)} \; A|_{E(i,p,u)} \; \phi|_{E(i,p,u)} \left[(P_{\forall_i})_u - (P_{\forall_p})_u\right]}{\mu_0 L|_{E(i,p,u)}}\right|_{\varepsilon(i,p,u)\neq 0}$$

where E(i, p, u) represents a unique edge. Assuming constant bottom hole pressure (BHP) control then, $$(P_{\forall_i})_u (P_{\forall_p})_u = P_u \quad (28)$$

In other words, the difference in BHP across all edges in the graph in a given reservoir is constant at P. This assumption may be independent of the specific edge denoted by E(i, p, u). Substituting Eq. (26) into Eq. (25), and assuming that $\varepsilon(i, p, u) \neq 0$, then:

$$(q_{inj})_{E(i,p,u)} = \frac{P_u}{\mu_0}\left[\frac{A\phi k}{L}\bigg|_{E(i,p,u)}\right] \quad (29)$$

Modifying Eq. (29) to incorporate sweep efficiency denoted by $(E_V)$, the effective volume of the modelled displacement volume is fractionally reduced by the macroscopic sweep efficiency, while the microscopic sweep efficiency $(E_D)$ is already accounted for by the residual oil saturation, $S_{or}$, thus:

$$(q_{inj})_{E(i,p,u)} = \frac{P_u}{\mu_0}\left[\frac{A\;\phi\;k\;E_V}{L}\bigg|_{E(i,p,u)}\right] \quad (30)$$

Using Eq. (12), but including sweep efficiency, and still considering E(i, p, u), then:

$$(q_{inj})_{E(i,p,u)} = [A\phi E_V|_{E(i,p,u)}] \quad (38)$$

then Eq. (30) becomes:

$$(q_{inj})_{E(i,p,u)} = \frac{P_u}{\mu_0}\left[\frac{k\tilde{V}_\phi}{L^2}\bigg|_{E(i,p,u)}\right] \quad (32)$$

5 Buckley-Leverett Fundamentals

The Segmented Reservoir Model Simulator (SRMS) solves a network of 1D Buckley-Leverett equations simultaneously and analytically. As such, it may be beneficial to review the underlying Buckley-Leverett approach and the underlying assumptions.

5.1 Buckley-Leverett: Dake's Interpretation

Buckley-Leverett is recognized as the basic equation for describing immiscible displacement in one dimension and was formulated by Buckley & Leverett. Assuming diffusive flow, the fundamental model is expressed in Eq. (33) below and shown in FIG. 37.

$$\underbrace{q_w \rho_w|_x \; q_w \rho_w|_{x+dx}}_{\text{Mass Flow Rate In-Out}} = \underbrace{A\;\phi\;dx\frac{\partial}{\partial t}(\rho_w S_w)}_{\substack{\text{Rate of increase of} \\ \text{mass of water in} \\ \text{the volume element}}} \quad (33)$$

Equation (33) states that the mass flow rate is equal to the mass of water flowing into the volume element, minus mass of water flowing out of the volume element. Note that a change in mass of water on the left-hand side (LHS) of Eq. (33) is accounted for by a change in water saturation on the RHS.

With the assumption that incompressible displacement is constant, in the limit Eq. (33) can be expressed as a differential equation, as shown in Eq. (34):

$$\frac{\partial q_w}{\partial x}\bigg|_t = A\;\phi\;\frac{\partial S_w}{\partial t}\bigg|_x \quad (34)$$

The full differential for the incremental change in water saturation $(\partial S_w)$ may be expressed as:

$$dS_w = \frac{\partial S_w}{\partial x}\bigg|_t dx + \frac{\partial S_w}{\partial t}\bigg|_x dt \quad (35)$$

In this analysis, the movement of a plane of constant water saturation may be investigated. Therefore, as $\partial S_w = 0$ allowing Eq. (31) to be reformulated as Eq. (32), below:

$$\frac{\partial S_w}{\partial t}\bigg|_x = \frac{\partial S_w}{\partial x}\bigg|_t \frac{dx}{dt}\bigg|_{S_w} \quad (36)$$

Eq. (34) can be reformulated by using Eq. (36), giving $$\frac{\partial q_w}{\partial x}\bigg|_t = A\;\phi\;\frac{\partial S_w}{\partial x}\bigg|_t \frac{dx}{dt}\bigg|_{S_w} \quad (37)$$

Expressing the LHS of Eq. (37) using the chain rule yields:

$$\frac{\partial q_w}{\partial x}\bigg|_t = \left[\frac{\partial q_w}{\partial S_w}\frac{\partial S_w}{\partial x}\right]_t \quad (38)$$

and combining Eq. (37) and Eq. (38) yields:

$$\frac{\partial q_w}{\partial S_w}\bigg|_t = A\;\phi\;\frac{dx}{dt}\bigg|_{S_w} \quad (39)$$

or, alternatively, in terms of the velocity of saturation as $$\frac{dx}{dt}\bigg|_{S_w} = \frac{1}{A\;\phi}\frac{\partial q_w}{\partial S_w}\bigg|_t \quad (40)$$

For incompressible displacement, $q_T$ must, therefore, be constant. If the definition of fractional flow of water ($f_w$) is stated as being:

$$q_w = q_T f_w \quad (41)$$

Because the model may be defined for a plane of constant $S_w$, and as it may be assumes that fractional flow ($f_w$) is strictly a function of water saturation, then the following may be obtained from Eq. (41):

$$\frac{\partial q_w}{\partial S_w}\bigg|_{S_w} = q_T \frac{\partial f_w}{\partial S_w}\bigg|_{S_w} \quad q_T \frac{\partial f_w}{\partial S_w}\bigg|_{S_w} \quad (42)$$

Thus, Eq. (33) becomes Eq. (43), below:

$$v|_{S_w} = \frac{dx}{dt}\bigg|_{S_w} = \frac{q_t}{A\phi}\frac{\partial f_w}{\partial S_w}\bigg|_{S_w} \quad (43)$$

Equation (43) is the famous Buckley-Leverett expression. This generally states that for a constant rate of water injection ($q_T = q_w$) the velocity of a plane of constant water saturation is proportional to the derivative of the fractional flow for that particular saturation. Again, as fractional flow is assumed to be a function of water saturation, then integrating Eq. (43) over time establishes the position of the plane of constant water saturation at a given point in time, yielding Eq. (44):

$$v|_{S_w} = \int_0^t v|_{S_w} dt = \left(\frac{1}{A\phi}\frac{df_w}{dS_w}\bigg|_{S_w}\right)\int_0^t q_T dt = \frac{W_{inj}}{A\phi}\frac{df_w}{dS_w}\bigg|_{S_w} \quad (44)$$

where $W_{inj}$ is the total (cumulative) amount of water injected since initial conditions.

5.2 Water Saturation Behind the Shock Front

A technique for understanding the water saturation profile behind the shock front of Welge, and is stated as:

$$W_{inj} = x A \phi (S_w S_{wc}) \quad (45)$$

or $$S_w S_{wc} = \frac{W_{inj}}{x A \phi} = \overline{W_{inj}} \quad (46)$$

Note that from Eq. (37), Eq. (46) may be written as:

$$\frac{1}{\frac{df_w}{dS_w}\big|_{S_w}} = \frac{W_{inj}}{x|_{S_w} A \phi} = \overline{W_{inj}} \quad (47)$$

Let $x_2$ be the position of the shock front with saturation $S_w$, then combining Eq. (46) and Eq. (47) yields:

$$S_w S_{wc} = \frac{W_{inj}}{x_2 A \phi} = \frac{1}{\frac{df_w}{dS_w}\big|_{S_w}} \quad (48)$$

Figure 38:
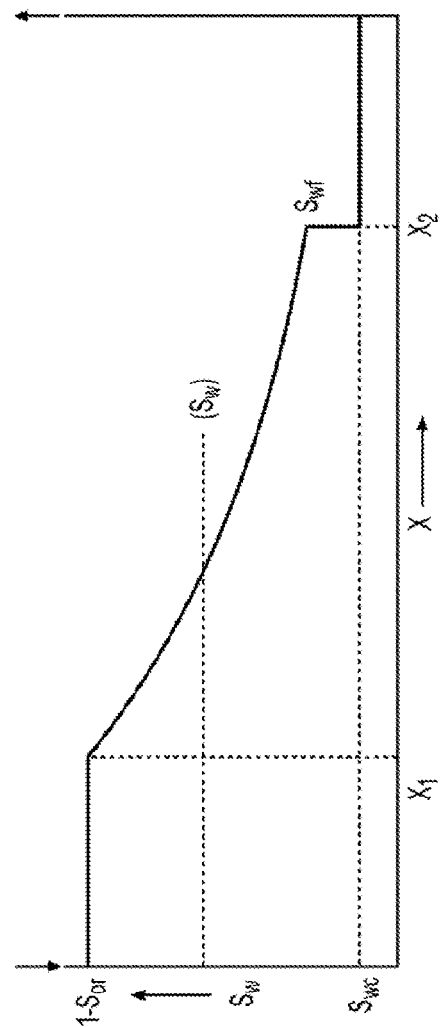
FIG. 38 illustrates water saturation distribution injector-producer pair prior to water breakthrough in accordance with embodiments of various techniques described herein.

As illustrated in FIG. 38, the average water saturation behind the shock front ($S_{wf}$) at $x_2$ can also be obtained by direct integration of the saturation profile, viz:

$$\overline{S_w} = \frac{(1 - S_{or})x_1 + \int_{x_1}^{x_2} S_w \, dx}{x_2} \quad (49)$$

As shown in Eq. (37), for a given amount of injected water, $W_{inj}$, the position of a plane of constant water saturation ($x|_{S_w}$) is directly proportional to the fractional flow gradient for that particular saturation, namely:

$$x|_{S_w} \propto \frac{df_w}{dS_w}\bigg|_{S_w} \quad (50)$$

Thereby, for a given volume of injected water, and $S_w \geq S_{wf}$, Eq. (49) may be reformulated as:

$$\overline{S_w} = \frac{(1 - S_{or})\frac{df_w}{dS_w}\big|_{(1-S_{or})} + \int_{(1-S_{or})}^{S_{wf}} S_w \, d\left(\frac{df_w}{dS_w}\right)}{\frac{df_w}{dS_w}\big|_{S_w}} \quad (51)$$

The integral in the numerator of Eq. (51) is solved using with integration by parts to yield:

$$\int_{(1-S_{or})}^{S_{wf}} S_w \, d\left(\frac{df_w}{dS_w}\right) = \left[S_w\left(\frac{df_w}{dS_w}\right)\right]_{(1-S_{or})}^{S_{wf}} \int_{(1-S_{or})}^{S_{wf}} \left(\frac{df_w}{dS_w}\right) dS_w \quad (52)$$

$$\int_{(1-S_{or})}^{S_{wf}} S_w \, d\left(\frac{df_w}{dS_w}\right) = \left[S_w\left(\frac{df_w}{dS_w}\right)\right]_{(1-S_{or})}^{S_{wf}} \int_{(1-S_{or})}^{S_{wf}} df_w$$

$$\int_{(1-S_{or})}^{S_{wf}} S_w \, d\left(\frac{df_w}{dS_w}\right) = \left[S_w\left(\frac{df_w}{dS_w}\right)\right]_{(1-S_{or})}^{S_{wf}} [f_w]_{S_{wf}}^{(1-S_{or})}$$

Substituting Eq. (52) back into Eq. (51) yields:

$$\overline{S_w} = \frac{(1 - S_{or})\frac{df_w}{dS_w}\big|_{(1-S_{or})} + \left[S_w\left(\frac{df_w}{dS_w}\right)\right]_{(1-S_{or})}^{S_{wf}} - [f_w]_{(1-S_{or})}^{S_{wf}}}{\frac{df_w}{dS_w}\big|_{S_{wf}}} \quad (53)$$

Simplifying Eq. (53) will yield Eq. (54)—which is the well-known Welge equation. This expression equates the average water saturation behind the shock front, $\overline{S_w}$, to the water saturation of the shock front itself, $S_{wf}$ (subscript 'f' denotes 'shock front'), and the fractional flow $f_w|_{S_{wf}}$) is given as:

$$\overline{S_w} = S_{wf} + \frac{\left(1 - f_w|_{S_{wf}}\right)}{\frac{df_w}{dS_w}\big|_{S_{wf}}} \quad (54)$$

Prior to water breakthrough when the shock front reaches the producer, Eq. (48) and Eq. (54) are independent expressions of the fractional flow at the shock front and can be equated yielding the following:

$$\frac{df_w}{dS_w}\bigg|_{S_{wf}} = \frac{(1-f_w|_{S_{wf}})}{S_w - S_{wf}} = \frac{1}{S_w - S_{wc}} \quad (55)$$

The significance of this result is illustrated in FIGS. 38-41. To satisfy Eq. (55), the tangent to the fractional flow curve at coordinate $S_{wf}$, $f_w$ is equal to the slope of the line connecting points $\{S_w = S_{wc}, f_w = 0\}$ and $\{S_w = S_w, f_w = 1\}$. As will be shown later, Eq. (55) is critical in determining shock front position in relation to injected water.

5.3 Computing Recovery

At breakthrough time (e.g., subscript "bt") let x=L in Eq. (46), hence dimensionless cumulative water injected is:

$$\widetilde{W}_{INJ}\big|_{bt} = \frac{W_{inj}|_{bt}}{L \times A \times \phi} \quad (56)$$

where $\widetilde{W}_{inj}$ denotes the dimensionless form of $W_{inj}$ stated in terms of porosity. From mass balance constraints at time of breakthrough:

$$\widetilde{N}_p\big|_{bt} = \widetilde{W}_{inj}\big|_{bt} = \widetilde{q}_{inj} t\big|_{bt} = S_w\big|_{bt} - S_{wc} \quad (57)$$

or $$\frac{\widetilde{W}_{inj}}{\widetilde{q}_{inj}}\bigg|_{bt} = t\big|_{bt} \quad (58)$$

where $\tilde{N}_p$ is the dimensionless form of $N_p$ (the total volume of oil produced) and $\widetilde{q}_{inj}$ is dimensionless injection rate. From Eqs. (48 & 50) the pore volume of oil produced at breakthrough time may be obtained, thus:

$$\widetilde{N}_p\big|_{bt} = \frac{df_w}{dS_w}\bigg|_{S_{wf}|_{bt}}^{-1} \quad (59)$$

After water breakthrough, the Welge expression, Eq. (54), applies for the rise in saturation at the producing well, $S_w$:

$$S_w = S_w + \frac{(1-f_w)}{\frac{df_w}{dS_w}\big|_{S_w}} \quad (60)$$

From a mass balance, after breakthrough:

$$\widetilde{N}_p = S_w S_{wc} = (S_w S_{wc}) + (S_w S_w) \quad (61)$$

and substituting Eq. (60) into Eq. (61) yields $$\widetilde{N}_p = (S_w S_{wc}) + \frac{(1+f_w)}{\frac{df_w}{dS_w}\big|_{S_w}} \quad (62)$$

and substituting Eq. (47) into Eq. (62) yields the following:

$$\widetilde{N}_p = (S_w S_{wc}) + (1 f_w) \widetilde{W}_{inj} \quad (63)$$

6.1D Buckley-Leverett: Analytical Expressions

In some implementations, neural network driven reservoir modeling process 10 may establish the 1D implementation of the model, suitable for implementation along a single graphical edge.

6.1 Brooks-Corey Approximation

Modelling of water saturation with Buckley-Leverett may include modelling of fractional flow, $f_w$. If capillary pressure gradients and gravity effects are ignored, then the fractional flow can be expressed in terms of the oil and water viscosities and relative permeabilities, viz:

$$f_w \frac{1}{1 + \frac{\mu_w k_{or}}{k_{wr} \mu_o}} = \frac{k_{wr} \mu_o}{k_{wr} \mu_o + k_{or} \mu_w} \quad (64)$$

Note that the relative permeabilities, $k_{wr}$ and $k_{or}$, may be dependent only on water saturation, $S_w$. To simplify the mathematics and also to obtain analytical expressions for the Buckley-Leverett equations, it may be desirable to model the relative permeabilities. In this example, neural network driven reservoir modeling process 10 may use the Corey and Brooks-Corey approximations for the task. In order to apply these approximations, it may be useful to first normalize water saturation, thus:

$$\|S_W\| = \frac{S_w - S_{wc}}{1 - S_{wc} - S_{or}} \quad (65)$$

where $\|S_W\|$ represents the 'normalized' water saturation. The Brooks-Corey approximations then allow the relative permeabilities to be expressed as follows:

$$k_{wr} = k_{wr,max} (\|S_w\|)^{\mathcal{N}_w} \quad (66)$$

and $$k_{or} = k_{or,max} (1 - \|S_w\|)^{\mathcal{N}_o} \quad (67)$$

Applying the Corey simplification, namely $\mathcal{N}_w = \mathcal{N}_w = 2$ and that $k_{wr,max} = k_{or,max} = 1$, then:

$$k_{wr} = (\|S_w\|)^2 \quad (68)$$

and $$k_{or} = (1 - \|S_w\|)^2 \quad (69)$$

6.2 Fractional Flow Relationships

Taking advantage of the Brooks-Corey approximations provided earlier in Eqs. (61 & 62), the relative permeabilities in Eq. (64), yields:

$$f_w = \frac{\mu_o (\|S_w\|)^2}{\mu_w (1 - \|S_w\|)^2 + \mu_o (\|S_w\|)^2} \quad (70)$$

Further, the gradient of the fractional flow may also be expressed in terms of $\|S_w\|$ by differentiating Eq. (70), with respect to $\|S_w\|$, viz:

$$\frac{df_w}{d\|S_w\|}\bigg|_{S_w} = \frac{d}{d\|S_w\|} \frac{\mu_o (\|S_w\|)^2}{\mu_w (1 - \|S_w\|)^2 + \mu_o (\|S_w\|)^2} \quad (71)$$

$$\frac{df_w}{d\|S_w\|}\bigg|_{S_w} = \frac{2\mu_o \mu_w (1 - \|S_w\|) \|S_w\|}{[\mu_w (1 - \|S_w\|)^2 + \mu_o (\|S_w\|)^2]^2}$$

Differentiating the normalized saturation Eq. (65):

$$\frac{d\|S_w\|}{dS_w} = \frac{1}{1 - S_{wc} - S_{or}} \quad (72)$$

allows neural network driven reservoir modeling process 10 to apply the product rule to obtain the gradient of $f$ with respect to $S_w$, namely:

$$\frac{df_w}{d\|S_w\|}\bigg|_{S_w} = \frac{d\|S_w\|}{dS_w} \frac{df_w}{d\|S_w\|}\bigg|_{S_w} \quad (73)$$

$$\frac{df_w}{d\|S_w\|}\bigg|_{S_w} = \frac{2\mu_o\mu_w(1\|S_w\|)\|S_w\|}{(1 S_{wc} S_{or})[\mu_w(1\|S_w\|)^2 + \mu_o(\|S_w\|)^2]^2}\bigg|_{S_w}$$

6.3 Computing Position of the Shock Front

The mean water saturation (denoted by $S_w$) and also the mean-normalized water saturation (denoted by $\|S_w\|$) may be expressed in a similar form to Eq. (65), namely:

$$\|S_w\| = \frac{S_w - S_{wc}}{1 - S_{wc} - S_{or}} \quad (74)$$

and rearranging Eq. (53) and normalizing the saturation according to Eq. (74) yields:

$$\frac{df_w}{d\|S_w\|}\bigg|_{s_{wf}} = \frac{1 - f_w|_{s_{wf}}}{\|S_w\|} \quad (75)$$

In some implementations, there may be two independent equations relating $S_w$ to $f_w$ described by Eq. (70) and Eq. (75). Welge used this relationship to derive the water saturation of the shock front $(S_{wf})$ by graphically determining the point where the line, described by Eq. (75), is tangent to the fractional flow, per Eq. (70), as illustrated in FIG. 7.

In this section, an analytical derivation for the simultaneous solution of Eq. (70) and Eq. (75) may be presented.

Figure 39:
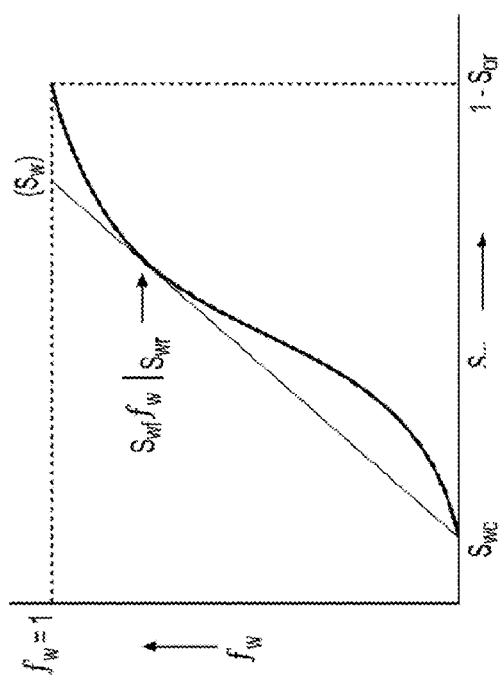
FIG. 39 illustrates the tangent to fractional flow curve prior to breakthrough and relationship to average water saturation behind shock front in accordance with embodiments of various techniques described herein.

The tangent line described by Eq. (75) and shown in FIG. 39 is also the line from $\|S_w\|=0$, $f_w=0$ to $\|S_w\|=\|S_w\|_{s_{wf}}$, $f_w=f_w|_{s_{wf}}$, and can be expressed as:

$$f_w|_{s_{wf}} = \frac{df_w}{d\|S_w\|}\bigg|_{S_w} \|S_w\|_{s_{wf}} \quad (76)$$

and substituting Eq. (71) into Eq. (76):

$$f_w|_{s_{wf}} = \frac{2\mu_o\mu_w(1 - \|S_w\|)(\|S_w\|)^2}{[\mu_w(1 - \|S_w\|)^2 + \mu_o(\|S_w\|)^2]^2}\bigg|_{s_{wf}} \quad (77)$$

and from Eq. (70) the fractional flow at the shock front is described solely by the fractional flow equation:

$$f_w|_{s_{wf}} = \frac{\mu_o(\|S_w\|)^2}{\mu_w(1 - \|S_w\|)^2 + \mu_o(\|S_w\|)^2}\bigg|_{s_{wf}} \quad (78)$$

The tangent point occurs when $f_w$ obtained from Eq. (77) and Eq. (78) are equal, viz:

$$\frac{\mu_o(\|S_w\|)^2}{\mu_w(1 - \|S_w\|)^2 + \mu_o(\|S_w\|)^2}\bigg|_{s_{wf}} = \frac{2\mu_o\mu_w(1 - \|S_w\|)(\|S_w\|)^2}{[\mu_w(1 - \|S_w\|)^2 + \mu_o(\|S_w\|)^2]^2}\bigg|_{s_{wf}} \quad (79)$$

which can be simplified as:

$$\frac{\mu_o(\|S_w\|)^2[\mu_o(\|S_w\|)^2 - \mu_w(1 - \|S_w\|)^2]}{[\mu_w(1 - \|S_w\|)^2 + \mu_o(\|S_w\|)^2]^2}\bigg|_{s_{wf}} = 0 \quad (80)$$

and because the denominator of Eq. (80) is always >0 then:

$$\mu_o(\|S_w\|)^2[\mu_o(\|S_w\|)^2\mu_w(1\|S_w\|)^2]|_{s_{wf}}=0 \quad (81)$$

Neural network driven reservoir modeling process 10 may be interested in solutions for which $\|S_w\|>0$, therefore:

$$\mu_o(\|S_w\|)^2|_{s_{wf}}\mu_w(1\|S_w\|)^2]|_{s_{wf}}=0 \quad (82)$$

This quadratic has one physical solution, namely:

$$\|S_w\|\big|_{s_{wf}} = \sqrt{\frac{\mu_w}{\mu_w + \mu_o}} \quad (83)$$

Eq. (83) may represent a significant result in that it allows us to directly estimate the water saturation of the shock front $\|S_w\|$ prior to breakthrough.

Eq. (83) can be combined with Eq. (73) to yield a variety of solutions based on the fractional flow gradient prior to breakthrough, namely $$\frac{df_w}{d\|S_w\|}\bigg|_{S_w}.$$

For example, substituting Eq. (46) and Eq. (73) into Eq. (37), yields an expression for the position of the shock front prior to water breakthrough, viz:

$$x|_{S_w} = \widetilde{W_{inj}} L \frac{2\mu_o\mu_w(1 - \|S_w\|)\|S_w\|}{(1 - S_{wc} - S_{or})[\mu_w(1 - \|S_w\|)^2 + \mu_o(\|S_w\|)^2]^2}\bigg|_{s_{wf}} \quad (84)$$

6.4 Computing Water Injected at Breakthrough Time

From Eq. (57), the amount of injected water at breakthrough time, but stated in terms of porosity units (hence dimensionless), is given by:

$$\widetilde{W_{inj}}\big|_{bt} = \frac{W_{inj}|_{bt}}{LA\phi} = S_w|_{bt} S_{wc} \quad (85)$$

combining Eq. (48) and Eq. (73) yields the average water saturation behind the shock front up to water breakthrough:

$$\|S_w\|\big|_{S_w} = \frac{[\mu_w(1 - \|S_w\|)^2 + \mu_o(\|S_w\|)^2]^2}{2\mu_o\mu_w(1 - \|S_w\|)\|S_w\|}\bigg|_{s_{wf}} \quad (86)$$

Substituting Eq. (74) and Eq. (86) into Eq. (85) gives the injected water at breakthrough in terms of water saturation at the front:

$$\widetilde{W_{inj}}\big|_{bt} = \frac{(1-S_{wc}-S_{or})\left[\mu_w(1-\|S_w\|)^2 + \mu_o(\|Sw\|)^2\right]^2}{2\mu_o\mu_w(1-\|S_w\|)\|S_w\|}\bigg|_{S_{wf}} \quad (87)$$

where $\|S_w\|$ is known from the relative viscosities Eq. (83).

6.5 Oil Production at Breakthrough

In some implementations, simulating 4806 the one or more reservoir models along the one or more edges between the one or more injector completions and the one or more producer completions may include receiving 4808 one or more injector rates associated with the one or more injector completions and determining 4810 one or more of oil production rates and water production rates for the one or more producer completions based upon, at least in part, simulating the one or more injector rates associated with the one or more injector completions. For example and before water breakthrough, the dimensionless volume of oil produced, $\tilde{N}_p$, is the same as the dimensionless volume of water injected, $\widetilde{W_{inj}}$. However, after water breakthrough, calculation of $\tilde{N}_p$ may involve first determining the average water saturation, $S_w$, viz:

$$\widetilde{N_p} = S_w S_{wc} \quad (88)$$

or by substituting Eq. (74)

$$\widetilde{N_p} = (1 S_{wc} S_{or})\|S_w\| \quad (89)$$

Figure 40:
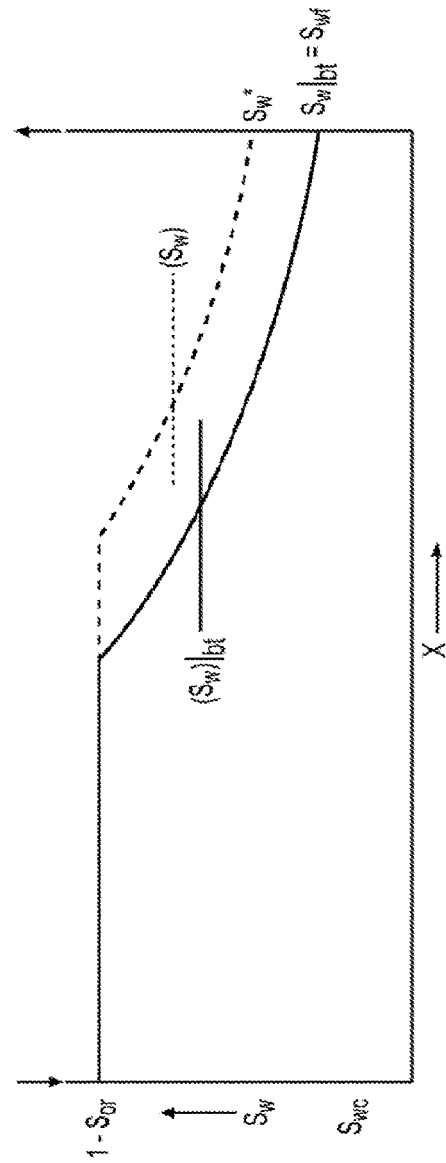
FIG. 40 illustrates water saturation profile between an injector-producer pair at time of water breakthrough and afterwards, utilizing current notation in accordance with embodiments of various techniques described herein.

To obtain $\|S_w\|$ (the average of normalized water saturation), it is important to note that after water breakthrough, the water saturation at the producer $(S_w)$ rises as water is injected, as illustrated in FIG. 40.

Equation (48) is no longer valid after water breakthrough, but the Welge equation, Eq. (54), does remain valid and can be reformulated in terms of normalized saturations, per Eq. (65), as:

$$\|S_w\| = \|S_w\| + \frac{1}{1 - S_{wc} - S_{or}} \frac{1 - f_w|_{S_w}}{\frac{df_w}{dS_w}\big|_{S_w}} \quad (89)$$

With the Brooks-Corey approximations, Eq. (90) can be expressed in terms of the normalized Welge saturation at the producer ($\|S_w\|$) (a 'Welge' parameter is denoted by the ' ' superscript). Substituting Eq. (70) and Eq. (71) into Eq. (90):

$$\|S_w\| = \|S_w\| + \frac{1}{1 - S_{wc} - S_{or}} \times \mathcal{A} \quad (91)$$

where $$\mathcal{A} = \frac{\mu_w(1-\|S_w\|)^2}{\left[\mu_w(1-\|S_w\|)^2 + \mu_o(\|S_w\|)^2\right]} \frac{\left[\mu_w(1-\|S_w\|)^2 + \mu_o(\|S_w\|)^2\right]^2}{2\mu_o\mu_w(1-\|S_w\|)\|S_w\|} \quad (92)$$

and simplifying yields $$\|S_w\| = \|S_w\| + \frac{(1-\|S_w\|)\left[\mu_w(1-\|S_w\|)^2 + \mu_o(\|S_w\|)^2\right]}{2\mu_o(1-S_{wc}-S_{or})\|S_w\|}\bigg|_{S_w} \quad (93)$$

The average of the normalized saturations $\|S_w\|$, can now be expressed in terms of $\|S_w\|$, which needs to be computed.

If $\|S_w\|$ is known, then the inverse of Eq. (93) solves for $\|S_w\|$, which is stated as a function of: $\|S_w\|$, $\mu_w$, $\mu_o$, $S_{wc}$, $S_{or}$, viz:

$$\|S_w\| = (\|S_w\|, \mu_w, \mu_o, S_{wc}, S_{or}) \quad (94)$$

Note that prior to water breakthrough the normalized water saturation at the producer is $\|S_w\|=0$. However, after breakthrough, F(·) (in Eq. 87) is a 3rd-order cubic polynomial with three roots, of which only one is physical (e.g., one root will yield $S_{wf}<0$ while the other will furnish $S_{wf}>1$). Equation (94) is used to obtain $\|S_w\|$ when the average water saturation between an injector and producer is known.

If, instead of $\|S_w\|$ being known, the dimensionless quantity of injected water is known ($\widetilde{W_{inj}}$), Eq. (71) may be substituted into Eq. (38) to obtain:

$$\widetilde{W_{inj}} = \frac{(1-S_{wc}-S_{or})\left[\mu_w(1-\|S_w\|)^2 + \mu_o(\|Sw\|)^2\right]}{2\mu_o\mu_w(1-\|S_w\|)\|S_w\|}\bigg|_{S_{wc}} \quad (95)$$

Equation 88 may express $\widetilde{W_{inj}}$ in terms of the (normalized) Welge water saturation, $\|S_w\|$. However, when solving the forward model for fluid production, $\|S_w\|$ may be expressed in terms of $\widetilde{W_{inj}}$. Thus, the inverse of Eq. (93) solves $\|S_w\|$ as a function of $\widetilde{W_{inj}}$, $\mu_w$, $\mu_o$, $S_{wc}$, $S_{or}$, viz:

$$\|S_w\| = \mathcal{G}(\widetilde{W_{inj}}, \mu_w, \mu_o, S_{wc}, S_{or}) \quad (96)$$

Note that prior to water breakthrough, $\|S_w\|=0$, but after breakthrough $\mathcal{G}(\widetilde{W_{inj}}, \mu_w, \mu_o, S_{wc}, S_{or})$ is a quartic (4th-order) polynomial with four roots, of which only one is physical.

For purposes of production forecasting, the following steps allows neural network driven reservoir modeling process 10 to analytically compute $\tilde{N}_p$ as a function of $\widetilde{W_{inj}}$, $\mu_w$, $\mu_o$, $S_{wc}$, $S_{or}$, viz:

1. Compute the normalized water saturation at the producer, $\|S_w\|$ using Eq. (96);
2. Compute the average normalized water saturation, $\|S_w\|$ using Eq. (93); and
3. Compute dimensionless production, $\tilde{N}_p$ using Eq. (89).

This sequence of steps can be summarized by the following equation:

$$\widetilde{N_p} = (\widetilde{W_{inj}}, \mu_w, \mu_o, S_{wc}, S_{or}) \quad (97)$$

7 3D Buckley-Leverett: Analytical Expressions

The previous descriptions may be consolidated into a full 3D implementation for computing fractional flow and utilizing the edge-indexing terminology described previously in sub-section 4.3.

Combining Eq. (36) and Eq. (32), an expression for the fraction of water flowing along a particular edge may be obtained, thus:

$$\frac{(q_{inj})_{E(i,p,u)}}{[(q_{inj})_T]_{E(i,\forall p,\forall u)}} = \frac{\frac{k\overrightarrow{V_\phi}}{L^2}\big|_{E(i,p,u)}}{\sum_{\forall p}\sum_{\forall u}\frac{k\overrightarrow{V_\phi}}{L^2}\big|_{E(i,p,u)}} \quad (98)$$

and rearranging $$(q_{inj})_{E(i,p,u)} = [(q_{inj})_T]_{E(i,\forall p,\forall u)}\frac{\frac{k\overrightarrow{V_\phi}}{L^2}\big|_{E(i,p,u)}}{\sum_{\forall p}\sum_{\forall u}\frac{k\overrightarrow{V_\phi}}{L^2}\big|_{E(i,p,u)}} \quad (99)$$

or stated in terms of dimensionless pore volumes:

$$(\widetilde{q_{inj}})_{bt}|_{E(i,\forall_p,\forall_u)} =$$

$$\frac{(q_{inj})_{E(i,p,u)}}{\widetilde{V_\phi}_{E(i,p,u)}} = [(q_{inj})_T]^{E(i,\forall_p,\forall_u)} \frac{\frac{k\widetilde{V_\phi}}{L^2}|_{E(i,p,u)}}{\sum_{\forall_p}\sum_{\forall_u}\frac{k\widetilde{V_\phi}}{L^2}|_{E(i,p,u)}} \quad (100)$$

A key assumption in the derivations from Eq. (30) to Eq. (99) is that fluid mobility along each edge is affected by the absolute permeability along the edge and that the effective relative mobility along each edge, $k_r/\mu_r$, is similar. This allows the saturation dependency of the fluid mobility to be eliminated from Eq. (98) to Eq. (99).

The total flow rates at each producer well, $[(q_{inj})_T]_{E(i,\forall_p,\forall_u)}$ (i.e., all corresponding edges associated with producer p) can then be derived from the flow rates on each edge terminating at that producer, namely:

$$[(q_{liq})_T]_{E(\forall_i,p,\forall_u)} = \Sigma_{\forall i}\Sigma_{\forall u}(q_{liq})_{E(i,p,u)} \quad (101)$$

Since the rate on a given edge is now known from Eq. (99), the time of water breakthrough for each edge may be obtained from Eq. (58), but applicable to a specific production well, p:

$$t_{bt}|_{E(\forall_i,p,\forall_u)} = \frac{\widetilde{W_{inj}}}{(\widetilde{q_{inj}})_{bt}}|_{E(i,p,u)} \quad (102)$$

where $\widetilde{W_{inj}}|_{bt}$ is obtained from Eq. (81) and Eq. (85), and $\widetilde{q_{inj}}|_{bt}$ is obtained from Eq. (100). The aggregate fractional flow at any producer, p, can then be obtained from Eq. (31), viz:

$$f_w|_{E(\forall_i,p,\forall_u)} = \Sigma_{\forall_i}\Sigma_{\forall_u}(q_{liq}f_w)_{E(i,p,u)}|_{\in \neq 0} \quad (103)$$

In some implementations, a rendered CGAN realization of a subsurface geological unit, layer or reservoir may be rapidly represented by a rapid but robust proxy or simulation for purposes of forecasting and screening. For example, neural network driven reservoir modeling process 10 may superimpose a Segmented Reservoir Model Simulator (SRMS) simulator or any other reservoir simulator, fixed on existing wells, onto a CGAN-rendered reservoir proxy. The degree of resolution of the proxy may be user-defined. One superimposed on the CGAN geological model, the edges of the SRMS model may then be given average values of the static properties needed to construct a simple dynamic forecast model (porosity, permeability, saturation, net-to-gross (NTG) and so on). The proxy may be constrained on known data (as is the CGAN rendered geological model) and the degree of tessellation can be manually defined of defaulted to some pre-defined value of property variation.

Referring also to FIGS. 41(a) and 41(b), note that each edge of the tessellation in FIG. 41(b) are entities which can be populated by values adjacent to it.

$$\widetilde{V_\phi}|_{E(v)} \leftarrow V_\phi \quad (97)$$

Equation 97 summarizes the concept of populating an edge with a volume or property. In other words, neural network driven reservoir modeling process 10 can scan the immediate neighborhood of the SRMS edge, populate it accordingly with whatever property of interest, and then run the SRMS simulator to derive some forecast from it. This may be a Buckley-Leverett simulation or more generic material balance (MBAL) calculation.

Referring also to FIG. 41(a), a map represents a subsurface reservoir unit approximation rendered by CGAN analysis. The model can incorporate faults (in grey) and the contours represents any static reservoir property required by the user. The three black dots represent existing wells (firm information) which are honored by the CGAN representation. Referring also to FIG. 41(b), SRMS may now be invoked and rendered over the area/volume of interest. The degree of tessellation is user-defined but can be defaulted. Each tessellation may represent a volume or a property or anything else that may be of interest. This ultra-fast proxy (which is robust) then provides a means to rapidly forecast production from a CGAN-generated geological model and/or horizon.

In some implementations, neural network driven reservoir modeling process 10 may control 204 one or more monitored inflow control devices based upon, at least in part, simulating the one or more reservoir models. For example, neural network driven reservoir modeling process 10 may utilize multipoint GAN for operational control of oilfield flow devices. In some implementations, neural network driven reservoir modeling process 10 may have a direct bearing on the operational efficiency of oilfield ow control devices, both monitored and stand-alone.

Figure 42:
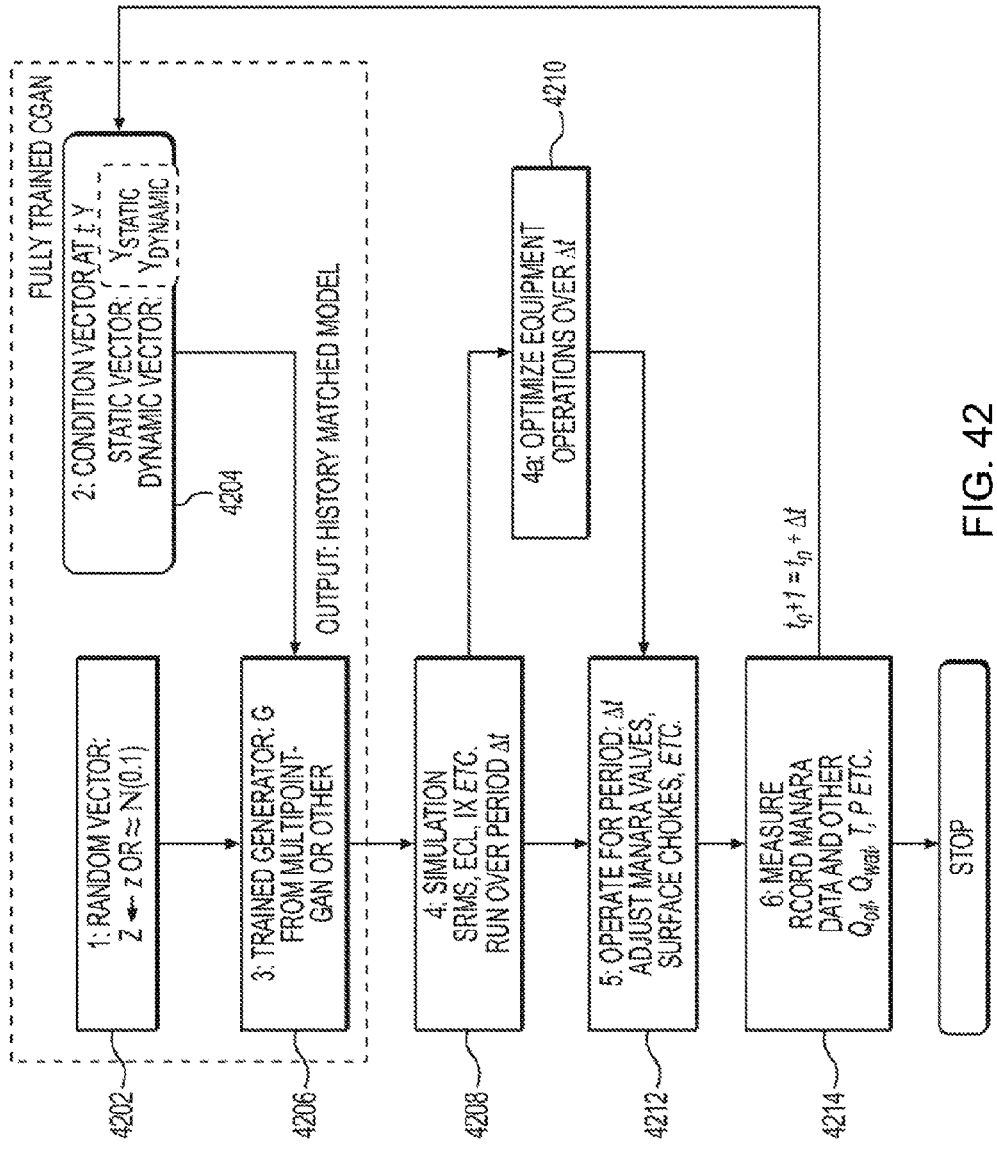
FIG. 42 illustrate a general workflow showing relationship between CGAN models (i.e., dynamic simulation models) and operations of downhole valves, chokes and other equipment in accordance with embodiments of various techniques described herein. The red arrow indicates a continuous monitoring and updating process whereby the conditional vector Y is updated based on the measurements taken over the period of operations (t). The large red-dashed box represents a fully "learned" CGAN as shown in FIG. 6. The updated conditional vector is used to re-launch and re-train the CGAN such that G becomes fully trained.

Referring also to FIG. 42, a practical application of neural network driven reservoir modeling process 10 may be tracked. As shown in FIG. 42, a Random Vector "Z" (e.g., action 4202) may draw upon a single seed z or from a distribution if multiple realizations are required (e.g., such as when it may be of interest to capture uncertainty in underlying geology, i.e., faults, high-permeability layers etc.). For example in FIG. 41, this may be represented by a normal distribution with μ=0 and σ=1. However, it will be appreciated that any random draw is possible.

As discussed above neural network driven reservoir modeling process 10 may generate the one or more reservoir models based upon, at least in part, one or more physical conditions, denoted in FIG. 42 as "2. Condition Vector at t: Y" (e.g., action 4204) where "Y" may represent the condition vector. In some implementations, two specific types of conditional vectors may be specified: Static Conditional Vector(s), "$Y_{Static}$" which may represents all static reservoir conditions (i.e., measurements), such as bedding planes, height of pay-zones, NTG, porosity (ϕ), permeability (k), clay content, vug fraction etc. and Dynamic Conditional Vector(s), "$Y_{Dynamic}$" which may represents all dynamic properties, i.e., measurements that vary in time. For example: flow rates (of water and oil or gas), near wellbore damage changes, temperature (T), pressure (p) associated with sand-face, inflow and reservoir. Note that the loop shown by the arrow in FIG. 42 typically updated "$Y_{Dynamic}$", but there may be instances when static properties for conditional training ($Y_{Static}$) may also be updated. As discussed above and in some implementations, neural network driven reservoir modeling process 10 may generate 200 the one or more reservoir models as shown in FIG. 42 under "3. Trained Generator" (e.g., action 4206). In some implementations, the GAN (or other type of neural network) may be trained with all conditional vectors honored. The activity of generating a trained and consistent model is captured in the large dashed box (encompassing actions 4202, 4204, 4206). An example method that may be used for this training and learning is also shown in FIG. 6. The period for forecasting is denoted as t and may be a small or long time step (as required).

In some implementations and as discussed above, neural network driven reservoir modeling process 10 may simulate 202 the one or more reservoir models as shown in FIG. 42 under "4. Simulation" (e.g., action 4208). The model generated from "3. Trained Generator" (e.g., action 4206) may be utilized for practical asset management and operation of downhole and surface equipment. By definition, G may be fully history matched (HM) because it honors condition vector "$Y_{Dynamic}$". Thus G may be transformed, as discussed above, into a dynamic forecast simulator for asset management purposes. In some implementations, this transformation may be exceedingly rapid and may be suited for real-time application in optimal reactive management applications.

In some implementations and as shown in FIG. 42, neural network driven reservoir modeling process 10 may include an optional step (e.g., shown as action 4210, labelled "Optimize equipment operations over t") depending upon circumstances. However, a user, via neural network driven reservoir modeling process 10, may choose to consider optimization (of the reservoir model G) against some stated objective. This activity may prove an operational "recipe" for optimal operations given a stated objective function (e.g., maximizing NPV, recovery, or some other metric). For example, this may suggest optimal sizing of the inflow control valve (Manara or some other inflow control valve).

Figure 43:
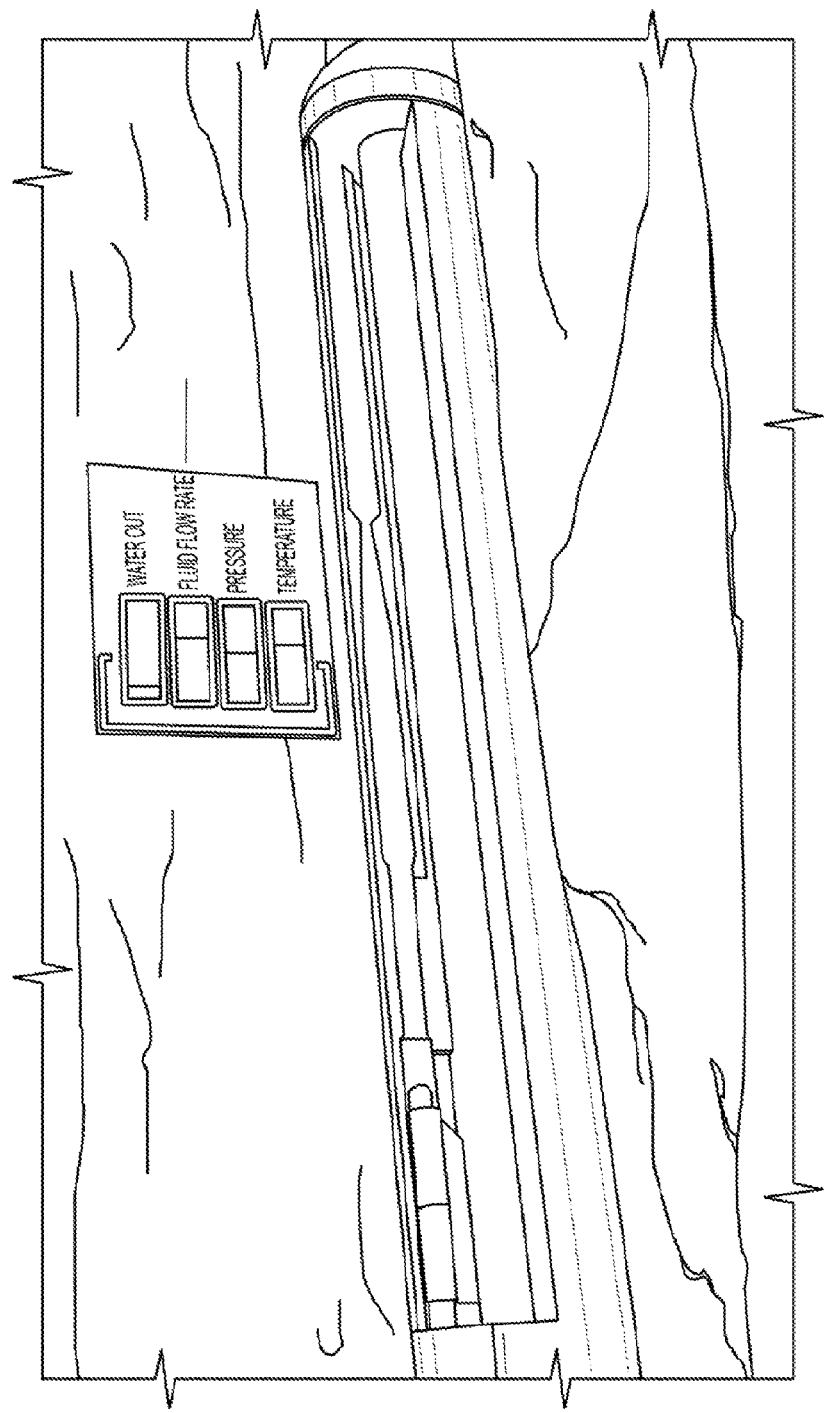
FIG. 43 illustrates an exemplary monitored flow control device showing water cut, pressure, temperature and volumetric rate in-line with the flow control element of the device in accordance with embodiments of various techniques described herein.

In some implementations, neural network driven reservoir modeling process 10 may control 204 or operate one or more components in a flowing system as shown in FIG. 42 under "5. Operate" (e.g., action 4212). In some implementations, neural network driven reservoir modeling process 10 may control or direct the actual active operation of components in the flowing system, be they downhole (e.g., Manara production and reservoir management system ("Manara")), surface chokes, etc. Referring also to FIG. 43 and in some implementations, Manara is the name given to Schlumberger's production and reservoir management system including monitored inflow control devices, which comprise a flow control device (which may be adjusted freely between minimum and maximum values of flow area, $A_c$) and also a flow meter that can measure flowrate of liquid entering the device and the associated water cut. The period of operation may be t as discussed above. This action of FIG. 42 (e.g., action 4212) may indicate where neural network driven reservoir modeling process 10 couples the outcomes of the CGAN (G) (e.g., action 4206) to operations.

Figure 44:
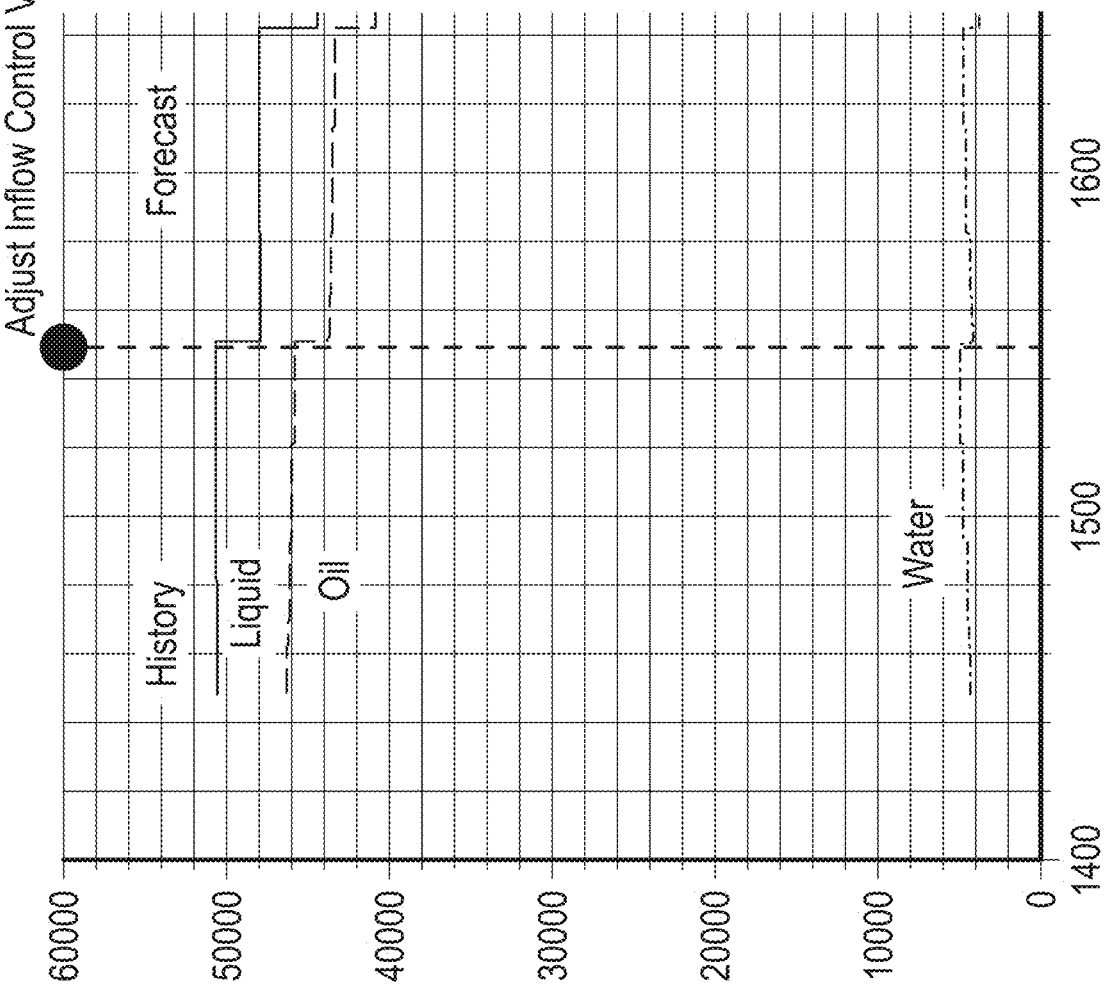
FIG. 44 illustrates an example historical flow data and how it changes for a forecast period that is controlled by inflow control valves in accordance with embodiments of various techniques described herein.

For example and as shown in the example historical flow data of FIG. 44, the flow data may change for a forecast period that is controlled by inflow control valves (i.e., Manara). Note that while oil is reduced somewhat, water (which is a pure cost) barely changes. In this example, if historical matching (HM) simulator had not been run to analyze the data, there would have been an increase in water production while experiencing reduced oil. Thus this example shows how optimal controls can be defined for the forecast period using simulation that is based on a HM CGAN model. For example, a forecast period (e.g., one year) may be furnished by the generator G which includes and agrees with physical conditions associated with the reservoir. In this example of FIG. 44, this period may be simulated and operations of the inflow control valves made such that water inflow is minimized (as water is a major cost of production). In this example forecast period, it was found that the inflow valves needed to be closed by 32% to minimize water ingress while maintaining oil production at a satisfactory level. In some implementations, this information may be incorporated into the one or more reservoir models by adding to an existing conditional vector Y to generate a new realization.

Figure 45:
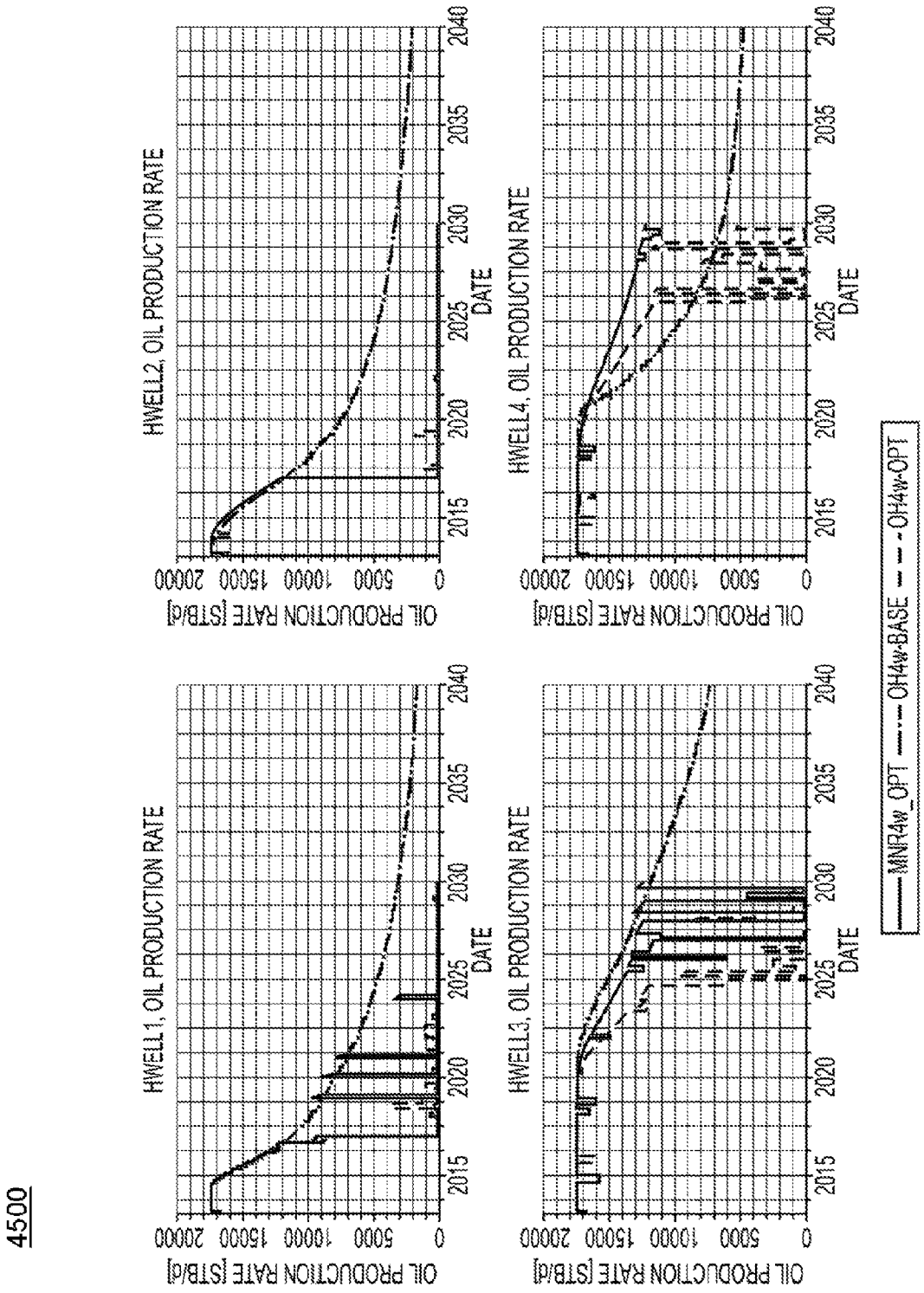
FIG. 45 illustrates the actual rates for each of these 4 wells along with the non-optimized red production curve in accordance with embodiments of various techniques described herein.

Referring also to FIG. 45, the actual rates for each of four wells, along with the non-optimized red production curve, are shown. The red curve is not optimized and the resultant economics is poor as water production is very high. For example, FIG. 45 shows oil productions through 2030. While these rates lie above the actual oil rates, the amount of water produced to get these far exceeded operational costs. As such, the oil production in this example is suboptimal. The optimized curves (green and blue) vary from the base but all have much less water, hence much more economic.

Figure 47:
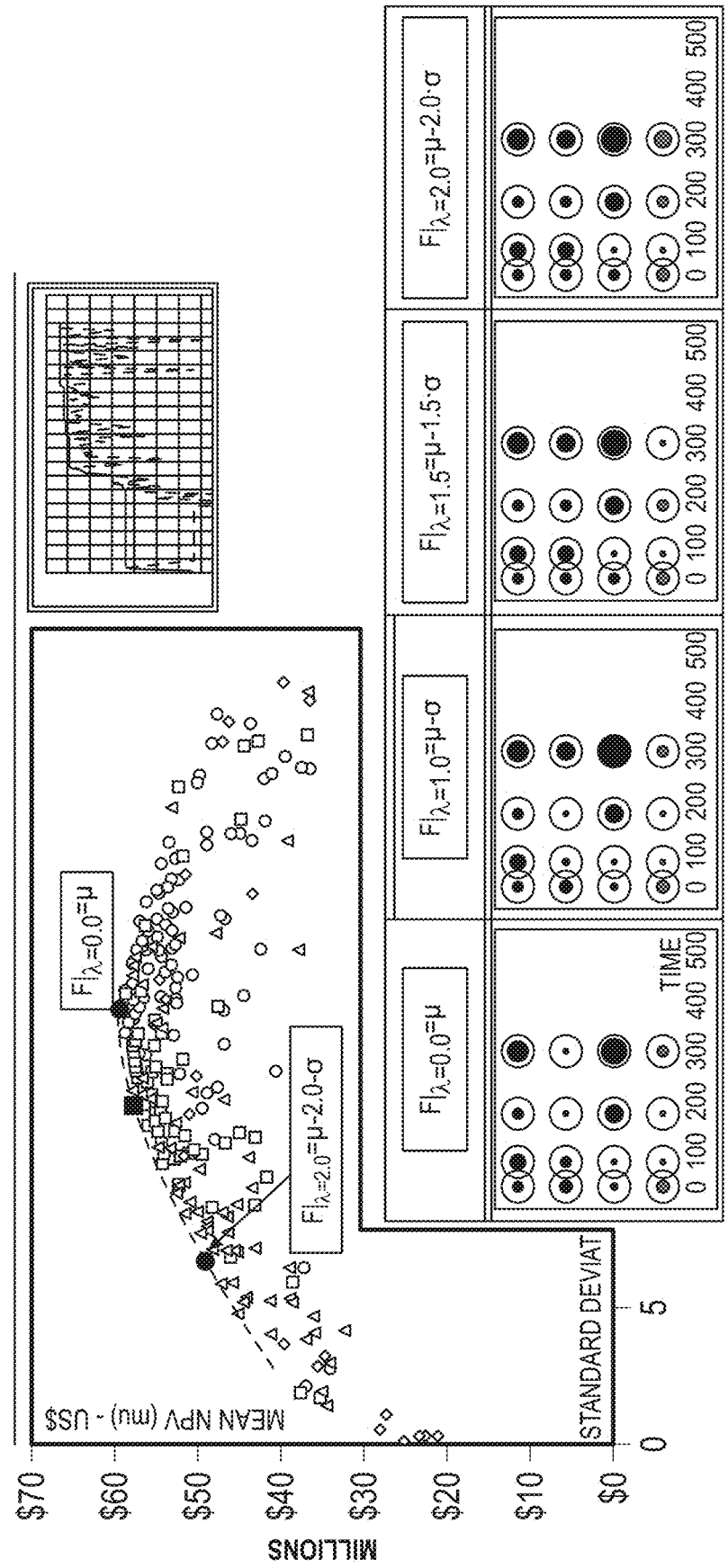
FIG. 47 illustrates the results of the optimization of the valve settings from the realizations of FIG. 46 in accordance with embodiments of various techniques described herein.

Referring also to FIG. 46, if faced with an ensemble of equi-probable HM realizations (in this example there are five such reservoir models), neural network driven reservoir modeling process 10 may optimize valve settings. As shown in FIG. 46, the size of the area of the circle may represents the valve orifice opening. A small circle means an almost closed valve while a larger circle indicates a more open valve. In this example, there are four valves (see insert bottom right) and these are operated (adjusted) at five points in time (sequentially) based upon, at least in part, simulating 202 the one or more reservoir models. While five reservoir models and four valves of a flowing system have been discussed, it will be appreciated that any number of reservoir models may be generated that any number of valves in a flowing system may be controlled by neural network driven reservoir modeling process 10 within the scope of the present disclosure. Referring also to FIG. 47, the results of such optimization (e.g., from the optimizations from the realizations of FIG. 46) may be presented as an efficient frontier.

In some implementations, neural network driven reservoir modeling process 10 may measure 216 reservoir data from the flowing system as shown in FIG. 42 under "6. Measure" (e.g., action 4214). Most wells and manifolds have some form of surface-mounted monitoring, however downhole monitoring is less common due to the complexities involved and hard operating environment. Manara, as shown in FIG. 42, may provide a means to extract extremely useful downhole data which may be utilized in many ways. One such way is to furnish values to update 218 the conditional dynamic vector $Y_{Dynamic}$. This then enables the training CGAN to update G to include the information obtained over t. Not only is the model updated and consistent with the data (i.e., history matched), but the near-instantaneous transformation of this newly history matched model into a dynamic forecast engine (e.g., as shown in in FIG. 42) means neural network driven reservoir modeling process 10 can implement real-time monitoring and control to downhole operations. This is represented by an arrow feeding back into FIG. 42 to update conditional vectors. Note also that time may be updated also.

Figure 49C:
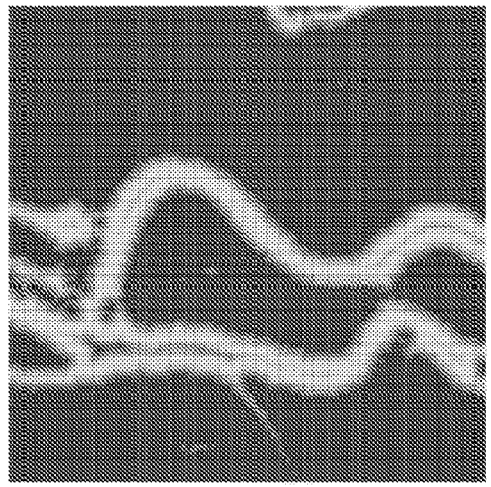
FIGS. 49A-C illustrate images of geology generated by trained GAN generator in accordance with embodiments of various techniques described herein.
Figure 49B:
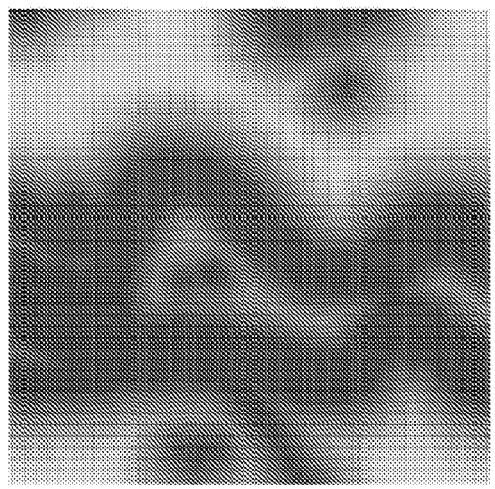
Figure 49A:
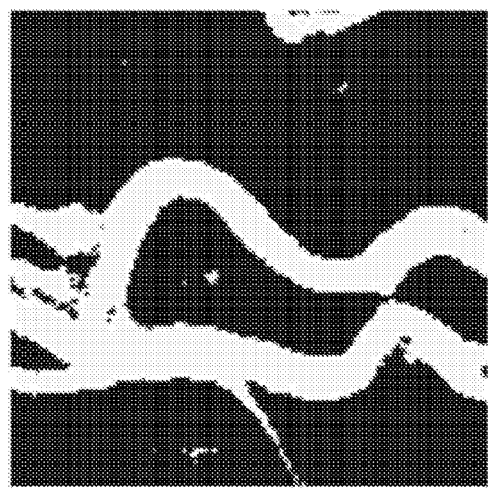

In some implementations, neural network driven reservoir modeling process 10 may generate 200 the one or more reservoir models to include or support multiple categorical facies (e.g., point bar, overbank, etc.) and/or continuous attributes (e.g., porosity, sand fraction, etc.). For example, and referring also to FIGS. 49A-C, neural network driven reservoir modeling process 10 may represent each categorical and continuous attribute of a reservoir as a separate channel. In the example of FIG. 49A, a binary image of facies may be shown where the color white may represent a river channel and where the shaded color (e.g., black) is not a river channel. This is akin to an image being represented by multiple color and transparency channels. In some implementations, the trained GAN (as discussed above) may generate geology represented as 2D (pixel) and/or 3D (voxel) images. In some implementations and as noted above, each pixel/voxel may have multiple categorical and/or continuous attributes akin to the e.g., red, green, or blue channels in a color image. While a color image with red, green, and blue channels has been discussed, it will be appreciated that various symbols, shades, etc. may be used to categorize attributes of a reservoir model.

For each of the aforementioned attributes (e.g., categorical and facies), an additional infeasibility attribute may be generated which may represent the spatial distance from the attribute. For example, if a pixel location on a generated map is inside the attribute (e.g., facies) then the pixel location is considered feasible, i.e. the distance to that facies is 0. If the pixel location is outside the relevant facies, then the degree of infeasibility may be the distance to the nearest feasible pixel. In some implementations, this distance may be efficiently calculated for each attribute using the Euclidean Distance Transform. Referring also to FIG. 49B and in some implementations, neural network driven reservoir modeling process 10 may generate a Euclidean Distance Transform (EDT) image of distance from e.g., a river channel. In this example, a darker color may represent distance of zero (inside channel). Red may represent a maximum distance from river channel. Referring also to FIG. 49C and in some implementations, neural network driven reservoir modeling process 10 may generate an EDT image of distance from another facies (overbank). In this example, a dark color may represent a distance of zero (inside overbank), while red may represent the maximum distance from the overbank (in the center of the river channel). It will be appreciated that these particular colors and shades are for example purposes only.

Figure 50:
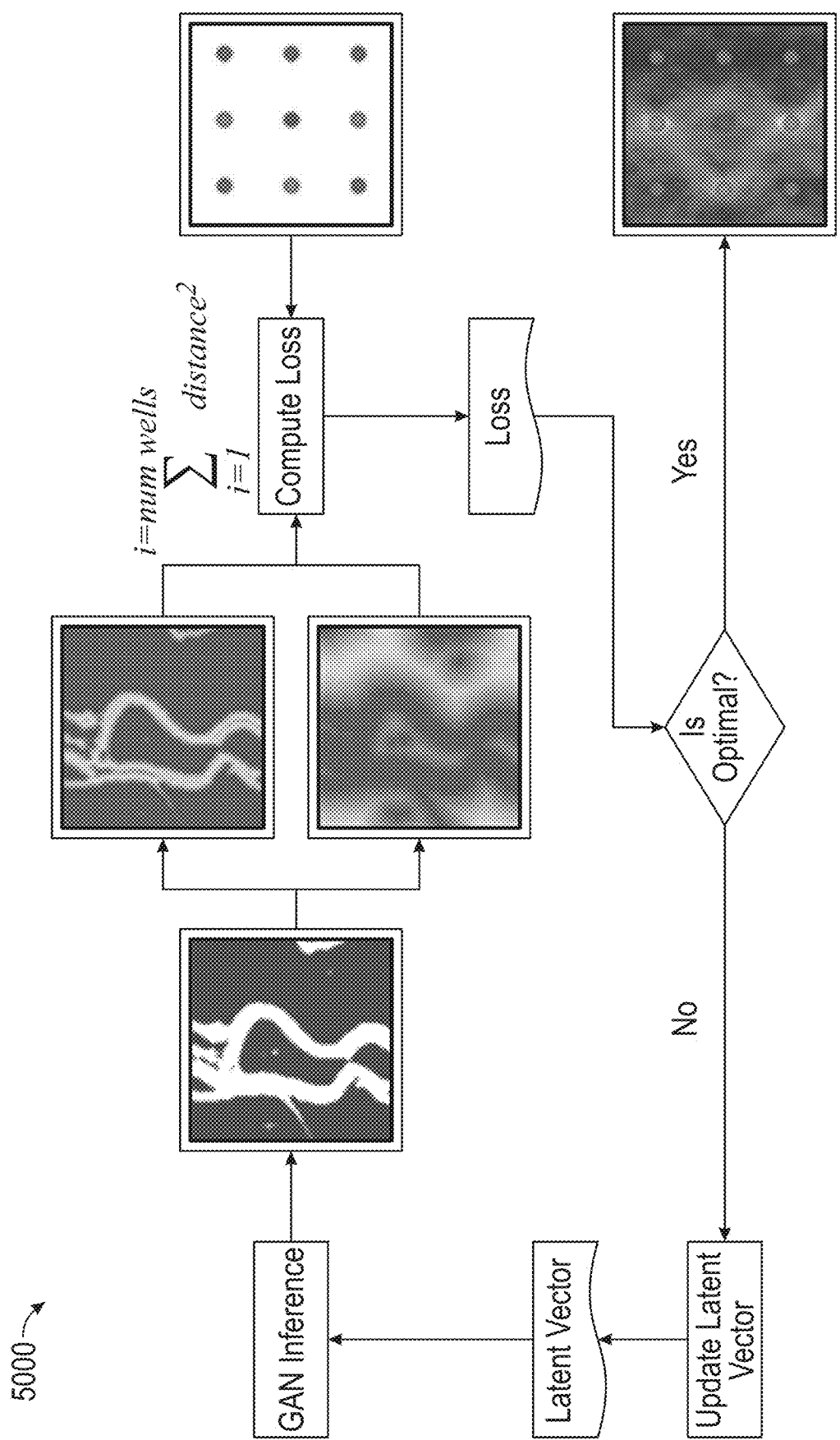
FIG. 50 illustrates an optimization loop for conditioning a latent vector (noise vector) to observations in accordance with embodiments of various techniques described herein.

Referring also to FIG. 50 and in some implementations, neural network driven reservoir modeling process 10 may utilize an optimization loop for conditioning latent vectors (noise vector) to observations (in this example facies at well locations). In some implementations, the latent/noise vector (Z) may be the input to the trained generator. Different values for Z may yield different realizations of the geology. To efficiently optimize the elements of Z, neural network driven reservoir modeling process 10 may use the additional feasibility attributes described for the mode. In this manner, the values of Z are then optimized using a technique such as gradient descent to minimize the infeasibility penalty. In some implementations, the values of Z may become the sum of the distance norms. In some implementations, the optimization illustrated in FIG. 50 may be evaluated independently for each initial guess of Z.

Figure 51C:
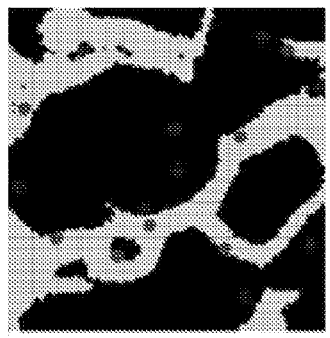
FIGS. 51A-J illustrate examples of latent (noise) vector optimization to condition geology to well observations in accordance with embodiments of various techniques described herein.
Figure 51F:
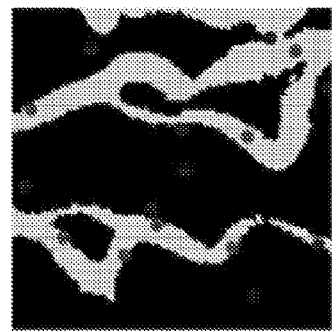
Figure 51B:
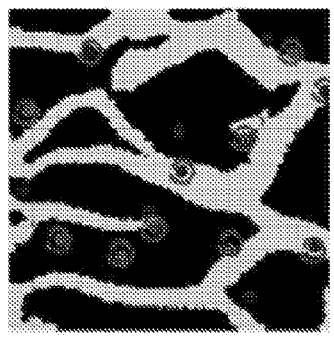
Figure 51E:
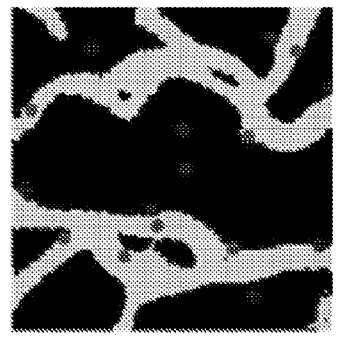
Figure 51A:
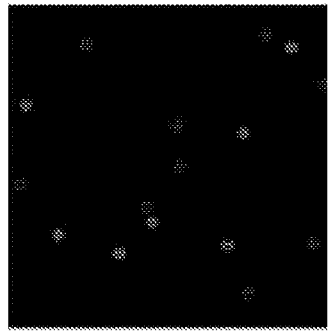
Figure 51D:
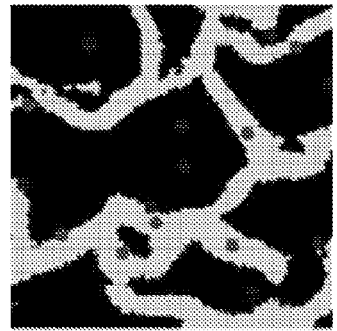
Figure 51I:
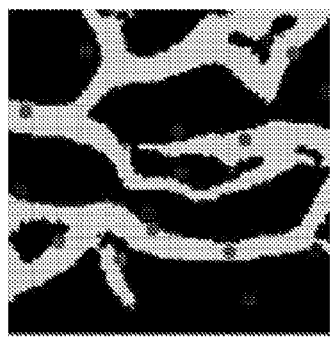
Figure 51H:
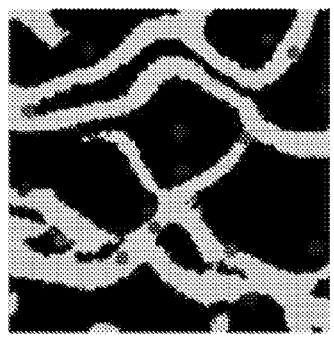
Figure 51G:
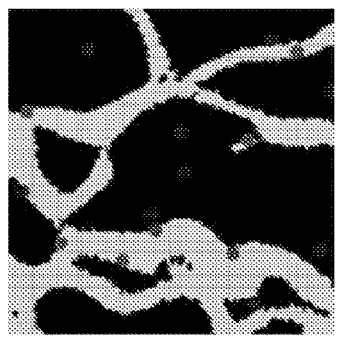
Figure 51J:
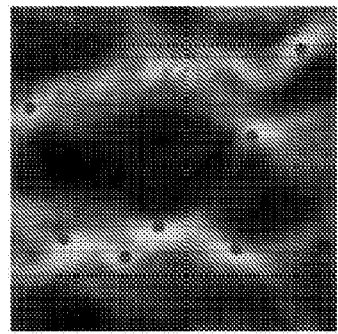

Referring also to FIGS. 51A-J and in some implementations, when the process of FIG. 50 is performed in an environment such as the cloud, each optimization may be done in parallel allowing multiple realizations of the geology to be discovered that are conditioned to the data. For example, FIG. 51A may show well constraints with a first color dot representing e.g., a channel with a second color dot representing e.g., an overbank. FIG. 51B may represent a random latent (noise) vector that is sampled and the corresponding geology is created with the trained generator. In FIG. 51B, the circled wells may be those that mismatch the geology. In this example, there is no reason to expect a better match on the initial guess. Referring to FIG. 51C, after optimization of the latent vector values, the geology in FIG. 51B may be transformed into the geology illustrated in FIG. 51C where there is a good match between the well observations and the geology. Referring also to FIG. 51D and in some implementations, a new random sample of Z may be independently optimized to yield another geological realization conditioned to the well observations which will be different from the optimized realization of FIG. 51C. FIGS. 51E-I may represent additional realizations generated by neural network driven reservoir modeling process 10. For example, FIGS. 51D-F may include new realizations of the latent vector that are randomly sampled and each independently optimized to yield geological realizations that are conditioned to the well observations. Referring also to FIG. 51J and in some implementations, multiple independent realizations of the conditioned geology may be aggregated to yield a probabilistic model that is consistent with the observations and also geologically feasible.

Neural network driven reservoir modeling process 10 may provide some important advantages in the deep learning-driven modeling approach over existing geostatistics methods including, but not limited to: (1) a wider range of facies patterns are produced in the resulting models and, therefore, a more realistic uncertainty space, because the GAN method uses a training library with varied examples, as opposed to a single training image used in Multi-point Statistics (MPS) modeling; (2) better facies geometry reproduction in 3D than MPS due to the learned representation of facies architecture in GAN; (3) flexibility to honor denser well data compared with Object-Based Modeling (OBM), given the fact that OBM performs data conditioning by Markov Chain Monte Carlo (MCMC) sampling that is slow or may fail to converge in case of dense conditioning data; (4) ability to train with non-stationary geological conceptual models (training images), and generate non-stationary realizations. As discussed above, the GAN can learn nonstationary multi-scale facies depositional trends from the training images, while MPS simulation requires stationary training image patterns for reliable statistical inference.

Figure 52:
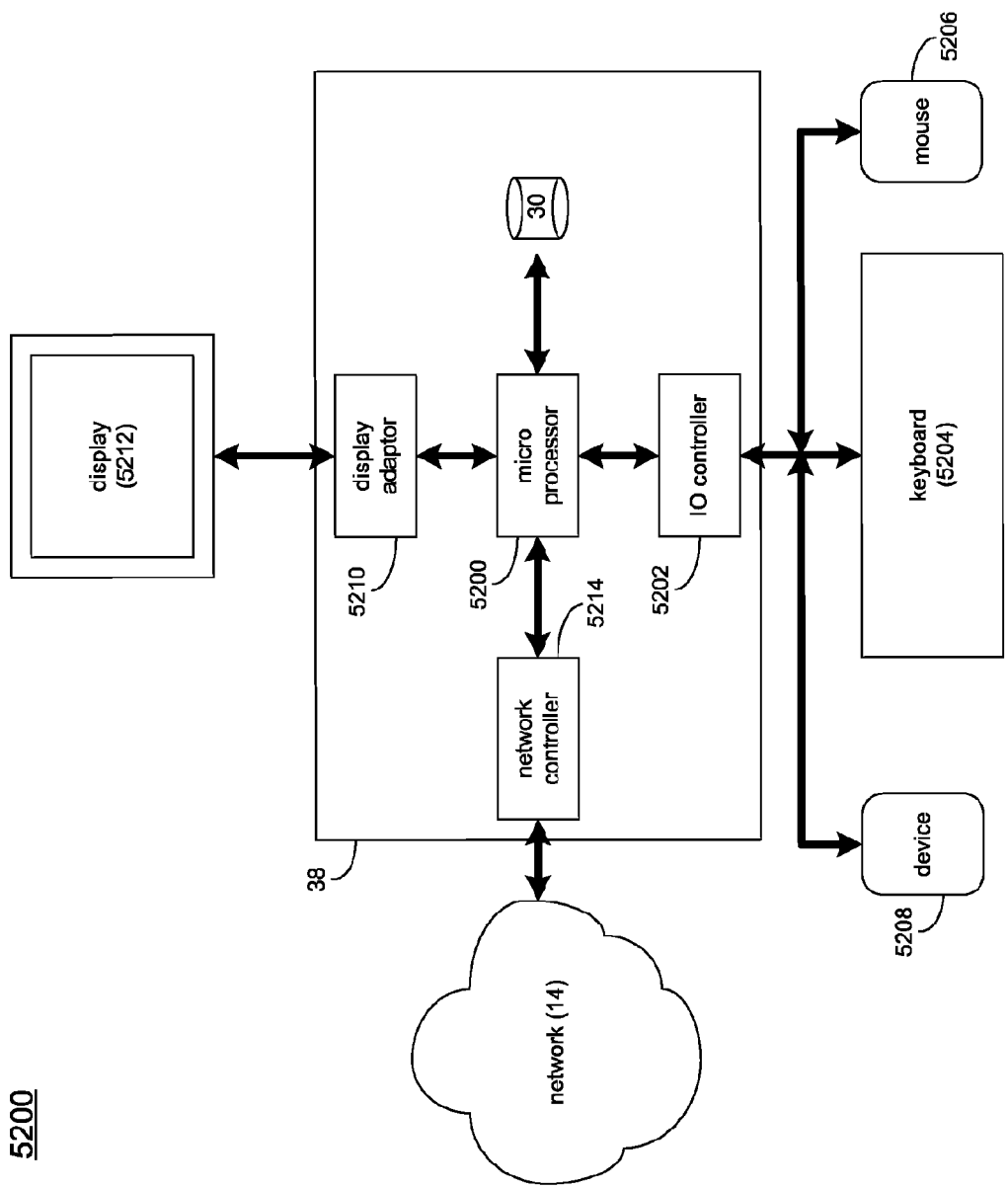
FIG. 52 is an example diagrammatic view of a client electronic device of FIG. 1 according to one or more example implementations of the disclosure.

Referring also to FIG. 52, there is shown a diagrammatic view of client electronic device 38. While client electronic device 38 is shown in this figure, this is for illustrative purposes only and is not intended to be a limitation of this disclosure, as other configurations are possible. For example, any computing device capable of executing, in whole or in part, neural network driven reservoir modeling process 10 may be substituted for client electronic device 38 within FIG. 52, examples of which may include but are not limited to computing device 12 and/or client electronic devices 40, 42, 44.

Client electronic device 38 may include a processor and/or microprocessor (e.g., microprocessor 5200) configured to, e.g., process data and execute the above-noted code/instruction sets and subroutines. Microprocessor 5200 may be coupled via a storage adaptor (not shown) to the above-noted storage device(s) (e.g., storage device 30). An I/O controller (e.g., I/O controller 5202) may be configured to couple microprocessor 5200 with various devices, such as keyboard 5204, pointing/selecting device (e.g., mouse 5206), custom device, such a microphone (e.g., device 5208), USB ports (not shown), and printer ports (not shown). A display adaptor (e.g., display adaptor 5210) may be configured to couple display 5212 (e.g., CRT or LCD monitor(s)) with microprocessor 5200, while network controller/adaptor 5214 (e.g., an Ethernet adaptor) may be configured to couple microprocessor 5200 to the above-noted network 14 (e.g., the Internet or a local area network).

The flowchart and block diagrams in the figures illustrate the architecture, functionality, and operation of possible implementations of systems and methods and according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or embodiment herein may be implemented in software, firmware, hardwired circuitry and/or any combination thereof.

The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Although a few example embodiments have been described in detail above, those skilled in the art will readily appreciate that many modifications are possible in the example embodiments without materially departing from the scope of the present disclosure, described herein. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

Having thus described the disclosure of the present application in detail and by reference to embodiments thereof, it will be apparent that modifications and variations are possible without departing from the scope of the disclosure defined in the appended claims.

NOMENCLATURE

A Cross-sectional area of the displacement volume, [m$^2$]
E(i, p, u) A unique and specific graphical edge comprising i, p, u
E(v) Any unique graphical edge denoted by index v, per Table 2
$E_V$ Vertical (macroscopic) sweep efficiency, [–]
$f_w$ Fractional flow of water
$f_w|s_{wf}$ Fractional flow of water at the shock front
$f_w$ Fractional flow at the producer
I Complete set of all possible injection wells in area of study, per Table 2
i Index: injection well, see FIG. 4
$\forall_i$ For all possible injectors with index i
i This denotes a single (and unique) injection well index, specified in Section 4
Relative permeability of water at a given water saturation used in the Brooks Corey approximations, [m$^2$]
$k_{or}$ Relative permeability of oil at a given water saturation used in the Brooks-Corey approximations, [m$^2$]
L Length of the displaced volume between injector and producer, [m]
M Complete set of all possible permutations of injector-producer unit, per Table 2
$N_i$ Number of injection wells in area of study
$N_p$ Number of production wells in area of study
$N_r$ Number of possible relationships between $N_p$ and $N_i$
$N_u$ Number of reservoir units in area of study
$\tilde{N}_p$ Dimensionless volume of oil produced
$\tilde{N}_p|_{bt}$ Dimensionless volume of oil produced at time of breakthrough (tbt)
$(P_{\forall_i})_u$ The (constant) bottom hole pressure of all injectors defined by $\forall_i$ [Pa]
$(P_{\forall_p})_u$ The (constant) bottom hole pressure of all producers defined by $\forall_p$ [Pa]
$P_u$ The difference between $(P_{\forall_i})_u$ and $(P_{\forall_p})_u$ [Pa]
P Complete set of all possible production wells in area of study, per Table 2
p Index: production well
$\forall_p$ For all possible producers with index p
p This denotes a single (and unique) production well index, specified in section 4
$\widetilde{q}_{inj}$ Dimensionless injection flow rate
$q_{inj}$ The water injection rate for a single edge (given by E), as defined in sub-section 4.4
$(q_{inj})_T$ The total injection rate for two, or more, edges (given by E(i, p, u)), as defined in sub-section 4.4
$q_{liq}$ The liquid production for a single edge (given by E)
$(q_{liq})_T$ The total liquid produced for two, or more, edges indexed by E(i, p, u), as defined in subsection 4.4
$q_{oil}$ The oil production rate for a single edge (given by E), as defined in sub-section 4.4
$(q_{oil})_T$ The total oil production rate for two, or more, edges (given by E(i, p, u)), as defined in sub-section 4.4
$q_w$ Water flow rate, generic usage, [m$^3$/s]
$q_T$ Total volumetric fluid rate, generic usage, [m$^3$/s]
$S_{or}$ Residual oil saturation [–]
$S_w$ Water saturation [–]

$S_{wc}$ Connate water saturation [-]
$S_w$ Water saturation at the producer and applies after water breakthrough. Commonly referred to as the Welge expression
$S_w$ Normalized water saturation at the producer [-]
$S_{wf}$ Water saturation of water at the shock front [-]
$S_w$ Normalized water saturation
$\bar{S}_w$ Average water saturation of displacement volume at a given time) [-]
$\overline{S_w}$ The mean-normalized water saturation
[[$S_{wf}$]] The mean-normalized water saturation at the shock-front
$\bar{S}_w|_{bt}$ Average water saturation of displacement volume at time of breakthrough (tbt)
t Elapsed time [consistent time units]
$t_{bt}$ Elapsed time of water breakthrough consistent time units]
t Period for forecasting
U Complete set of all possible reservoir units in area of study, per Table 2
u Index: reservoir unit
$\forall_u$ For all possible reservoir units with index u
u This denotes a single (and unique) reservoir unit index, specified in Section 4
V Complete set of all valid edges possible in area of study, per Table 2
v Index: valid edges, per Table 2
$V_\phi$ Volume of interest [m$^3$]
$v|_{S_w}$ Velocity of plane of given water saturation [m/s]
$\widetilde{V_\phi}$ Dimensionless volume of interest (Vq,) suitable for topographic representation on a graph (an edge)
$W_{inj}$ Volume of water injected at a given time, [m$^3$]
$\widetilde{W_{inj}}$ Dimensionless volume of water injected at a given time (stated in pore volumes)
$\widetilde{W_{inj}}|_{bt}$ Dimensionless volume of water injected at the time of water breakthrough (tbt)
x Displacement from injector to producer [m]
$x|_{S_w}$ Displacement from injector for a given water saturation, [m]
$x|_{S_{wf}}$ Displacement from injector at the shock-front, [m]
$\rho_w$ Density of the injected water phase [kg/m$^3$]
$\phi$ Porosity of displacement volume [-]
$\mu_w$ Viscosity of the water phase, [Pa·s]
$\mu_o$ Viscosity of the oil phase, [Pa·s]
$\epsilon$ Edge validity tag, per Table 2. If valid $\epsilon=1$. If edge is invalid then $\epsilon=0$

What is claimed is:

1. A method comprising:
defining, via a neural network, a plurality of injector completions and a plurality of producer completions in one or more reservoir models;
defining a plurality of injector-producer pairs based upon, at least in part, spatial proximity between the plurality of injector completions and the plurality of producer completions;
defining, via the neural network, a plurality of directed ed0ges between the plurality of injector completions and the plurality of producer completions in the one or more reservoir models based upon, at least in part, the plurality of injector-producer pairs, wherein the plurality of directed edges comprise local static and dynamic reservoir properties, wherein the plurality of directed edges between the plurality of injector completions and the plurality of producer completions define a graph network representative of the one or more reservoir models, wherein each directed edge represents a volume of interest between an injector completion and a producer completion in an injector-producer pair of the plurality of injector-producer pairs, wherein the volume of interest is determined based upon, at least in part, the local static and dynamic reservoir properties of the directed edges, and wherein each directed edge is associated with;
simulating, via the neural network, a one-dimensional behavior of the one or more reservoir models along each directed edge in the plurality of directed edges between the plurality of injector completions and the plurality of producer completions with a one-dimensional simulator, wherein the one-dimensional behavior of the one or more reservoir models is modeled, via the neural network, by treating each of the plurality of injector-producer pairs as a respective sub-network; and
defining, via the neural network, a three-dimensional graph network representative of the one or more reservoir models by aggregating each of the one-dimensional behaviors of the plurality of directed edges between the plurality of injector completions and the plurality of producer completions to determine an effective three-dimensional behavior of the one or more reservoir models, wherein the effective three-dimensional behavior of the one or more reservoir models is represented by a degree of interaction between each respective sub-network of each injector-producer pair of the plurality of injector-producer pairs.

2. The method of claim 1, further comprising:
determining total oil production for the one or more reservoir models based upon, at least in part, determining oil production for each directed edge that terminates at each of the plurality of producer completions in the one or more reservoir models.

3. The method of claim 1, wherein simulating the one or more reservoir models along each directed edge in the plurality of directed edges between the plurality of injector completions and the plurality of producer completions includes:
receiving a plurality of injector rates associated with the plurality of injector completions; and
determining one or more of oil production rates and water production rates for the plurality of producer completions based upon, at least in part, simulating the plurality of injector rates associated with the plurality of injector completions.

4. The method of claim 1, wherein simulating the one or more reservoir models along each directed edge in the plurality of directed edges between the plurality of injector completions and the plurality of producer completions includes:
receiving one or more of oil production rates and water production rates associated with the plurality of producer completions; and
determining water injection rates for the plurality of injector completions based upon, at least in part, simulating one or more of the oil production rates and the water production rates associated with the plurality of producer completions.

5. The method of claim 1, further comprising:
monitoring an inflow control device; and
controlling the inflow control device by reducing or increasing a flow area through the inflow control device, wherein the control of the inflow control device is based upon, at least in part, the simulation of the one or more reservoir models.

6. The method of claim 1, wherein the one-dimensional simulator is a segmented reservoir model simulator (SRMS).

7. The method of claim 1, further comprising:
receiving one or more training images; and
training the neural network based on the one or more training images to generate a trained neural network, wherein the trained neural network generates fake data indistinguishable from real data.

8. The method of claim 7, wherein the neural network comprises a discriminator and a generator, wherein the generator is configured to generate the fake data, and wherein the discriminator is configured to distinguish the fake data from the real data.

9. The method of claim 1, wherein the effective three-dimensional behavior of the one or more reservoir models is represented by fluid dynamics defined by the one-dimensional behavior of the one or more reservoir models.

10. The method of claim 1, wherein the degree of interaction prior to water breakthrough between each respective sub-network of each injector-producer pair of the plurality of injector-producer pairs is defined by a sum of flowrates along each directed edge that terminates at each of the plurality of producer completions in the one or more reservoir models.

11. The method of claim 1, wherein the degree of interaction at or after water breakthrough between each respective sub-network of each injector-producer pair of the plurality of injector-producer pairs is defined by a sum of flowrates along each directed edge that terminates at each of the plurality of producer completions in the one or more reservoir models corrected for an average saturation between each respective injector-producer pair.

12. The method of claim 1, wherein the neural network is a generative adversarial network (GAN).

13. A computing system including one or more processors and one or more memories configured to perform operations comprising:
defining, via a neural network, a plurality of injector completions and a plurality of producer completions in one or more reservoir models;
defining, via the neural network, a plurality of injector-producer pairs based upon, at least in part, spatial proximity between the plurality of injector completions and the plurality of producer completions;
defining, via the neural network, a plurality of directed edges between the plurality of injector completions and the plurality of producer completions in the one or more reservoir models based upon, at least in part, the plurality of injector-producer pairs, wherein the plurality of directed edges comprise local static and dynamic reservoir properties, wherein the plurality of directed edges between the plurality of injector completions and the plurality of producer completions define a graph network representative of the one or more reservoir models, wherein each directed edge represents a volume of interest between an injector completion and a producer completion in an injector-producer pair of the plurality of injector-producer pairs, wherein the volume of interest is determined based upon, at least in part, the local static and dynamic reservoir properties of the directed edges, and wherein each directed edge is associated with;
determining, via the neural network, total oil production for the one or more reservoir models based upon, at least in part, determining oil production for each directed edge that terminates at the plurality of producer completions in the one or more reservoir models;
simulating, via the neural network, a one-dimensional behavior of the one or more reservoir models along each directed edge in the plurality of directed edges between the plurality of injector completions and the plurality of producer completions with a one-dimensional simulator, wherein the one-dimensional behavior of the one or more reservoir models is modeled, via the neural network, by treating each of the plurality of injector-producer pairs as a respective sub-network; and
defining, via the neural network, a three-dimensional graph network representative of the one or more reservoir models by aggregating each of the one-dimensional behaviors of the plurality of directed edges between the plurality of injector completions and the plurality of producer completions to determine an effective three-dimensional behavior of the one or more reservoir models, wherein the effective three-dimensional behavior of the one or more reservoir models is represented by a degree of interaction between each respective sub-network of each injector-producer pair of the plurality of injector-producer pairs.

14. The computing system of claim 13, wherein simulating the one or more reservoir models along each directed edge in the plurality of directed edges between the plurality of injector completions and the plurality of producer completions includes:
receiving a plurality of injector rates associated with the plurality of injector completions; and
determining one or more of oil production rates and water production rates for the plurality of producer completions based upon, at least in part, simulating the plurality of injector rates associated with the plurality of injector completions.

15. The computing system of claim 13, wherein simulating the one or more reservoir models along the each directed edge in the plurality of directed edges between the plurality of injector completions and the plurality of producer completions includes:
receiving one or more of oil production rates and water production rates associated with the plurality of producer completions; and
determining water injection rates for the plurality of injector completions based upon, at least in part, simulating one or more of the oil production rates and the water production rates associated with the plurality of producer completions.

16. The computer system of claim 13, wherein the degree of interaction prior to water breakthrough between each respective sub-network of each injector-producer pair of the plurality of injector-producer pairs is defined by a sum of flowrates along each directed edge that terminates at each of the plurality of producer completions in the one or more reservoir models.

17. A computer program product comprising a non-transitory computer readable storage medium having a plurality of instructions stored thereon, which, when executed by a processor, cause the processor to perform operations comprising:
defining, via a generative adversarial network (GAN), a plurality of injector completions and a plurality of producer completions in one or more reservoir models;
defining, via the GAN, a plurality of injector-producer pairs based upon, at least in part, spatial proximity between the plurality of injector completions and the plurality of producer completions;

defining, via the GAN, a plurality of directed edges between the plurality of injector completions and the plurality of producer completions in the one or more reservoir models based upon, at least in part, the plurality of injector-producer pairs, wherein the plurality of directed edges comprise local static and dynamic reservoir properties, wherein the plurality of directed edges between the plurality of injector completions and the plurality of producer completions define a graph network representative of the one or more reservoir models, wherein each directed edge represents a volume of interest between an injector completion and a producer completion in an injector-producer pair of the plurality of injector-producer pairs, wherein the volume of interest is determined based upon, at least in part, the local static and dynamic reservoir properties of the directed edges, and wherein each directed edge is associated with;

simulating, via the GAN, a one-dimensional behavior of the one or more reservoir models along each directed edge in the plurality of directed edges between the plurality of injector completions and the plurality of producer completions with a one-dimensional segmented reservoir model simulator, wherein the one-dimensional behavior of the one or more reservoir models is modeled, via the GAN, by treating each of the plurality of injector-producer pairs as a respective sub-network; and defining, via the GAN, a three-dimensional graph network representative of the one or more reservoir models by aggregating each of the one-dimensional behaviors of the plurality of directed edges between the plurality of injector completions and the plurality of producer completions to determine an effective three-dimensional behavior of the one or more reservoir models, wherein the effective three-dimensional behavior of the one or more reservoir models is represented by a degree of interaction between each respective sub-network of each injector-producer pair of the plurality of injector-producer pairs.

18. The computer program product of claim 17, further comprising instructions for:
   determining total oil production for the one or more reservoir models based upon, at least in part, determining oil production for each directed edge that terminates at the plurality of producer completions in the one or more reservoir models.

19. The computer program product of claim 17, wherein simulating the one or more reservoir models along each directed edge in the plurality of directed edges between the plurality of injector completions and the plurality of producer completions includes:
   receiving a plurality of injector rates associated with the plurality of injector completions; and
   determining one or more of oil production rates and water production rates for the plurality of producer completions based upon, at least in part, simulating the plurality of injector rates associated with the plurality of injector completions.

20. The computer program product of claim 17, wherein simulating the one or more reservoir models along each directed edge in the plurality of directed edges between the plurality of injector completions and the plurality of producer completions includes:
   receiving one or more of oil production rates and water production rates associated with the plurality of producer completions; and
   determining water injection rates for the plurality injector completions based upon, at least in part, simulating one or more of the oil production rates and the water production rates associated with the plurality of producer completions.

* * * * *